United States Patent
Colles et al.

(10) Patent No.: US 11,831,127 B2
(45) Date of Patent: *Nov. 28, 2023

(54) CONFIGURABLE PULSED LASER DIODE DRIVER

(71) Applicant: Silanna Asia Pte Ltd, Singapore (SG)

(72) Inventors: Joseph H. Colles, Bonsall, CA (US); Steven E. Rosenbaum, San Diego, CA (US); Stuart B. Molin, Carlsbad, CA (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/817,017

(22) Filed: Aug. 3, 2022

(65) Prior Publication Data
US 2022/0376471 A1    Nov. 24, 2022

Related U.S. Application Data

(63) Continuation of application No. 17/446,606, filed on Aug. 31, 2021, now Pat. No. 11,444,433.
(Continued)

(51) Int. Cl.
*H01S 5/026* (2006.01)
*H01S 5/042* (2006.01)
(Continued)

(52) U.S. Cl.
CPC .......... *H01S 5/0428* (2013.01); *H01S 5/0233* (2021.01); *H01S 5/0261* (2013.01);
(Continued)

(58) Field of Classification Search
CPC .. H01S 5/0261; H01S 5/0428; H01S 5/06808; H01S 5/4025; H01S 5/06216
See application file for complete search history.

(56) References Cited

U.S. PATENT DOCUMENTS

| 3,944,854 A | 3/1976 | Keller |
| 5,287,375 A | 2/1994 | Fujimoto |

(Continued)

FOREIGN PATENT DOCUMENTS

| JP | 2016096221 A | 5/2016 |
| KR | 20150105889 A | 9/2015 |

OTHER PUBLICATIONS

International Search Report and Written Opinion dated Dec. 10, 2021 for PCT Patent Application No. PCT/IB2021/058143.
(Continued)

*Primary Examiner* — Yuanda Zhang
(74) *Attorney, Agent, or Firm* — MLO, a professional corp.

(57) ABSTRACT

A laser diode driver includes a clock terminal to receive a clock signal, configuration terminals to receive configuration data, drive terminals, and charging terminals. A first charging terminal is operable to charge a source capacitor of a resonant circuit that includes the source capacitor, an inductor, and a bypass capacitor. Each drive terminal is operable to be directly electrically connected to an anode or cathode of a laser diode or to ground. A mode, output selection, and grouping of drive signals that are delivered to the laser diodes are configured based on the configuration data. The laser diode driver is operable to control a current flow through the resonant circuit to produce high-current pulses through the laser diodes, the high-current pulses corresponding to a peak current of a resonant waveform developed at respective anodes of the laser diodes, a timing of the high-current pulses being synchronized using the clock signal.

20 Claims, 38 Drawing Sheets

Related U.S. Application Data

(60) Provisional application No. 63/127,794, filed on Dec. 18, 2020, provisional application No. 63/075,527, filed on Sep. 8, 2020.

(51) Int. Cl.
  *H01S 5/0233* (2021.01)
  *H03K 17/687* (2006.01)
  *H01S 5/42* (2006.01)
  *H01S 5/40* (2006.01)

(52) U.S. Cl.
  CPC ........ *H03K 17/6871* (2013.01); *H01S 5/4031* (2013.01); *H01S 5/423* (2013.01)

(56) References Cited

U.S. PATENT DOCUMENTS

| | | |
|---|---|---|
| 5,895,984 A | 4/1999 | Renz |
| 5,978,393 A | 11/1999 | Feldman et al. |
| 9,368,936 B1 | 6/2016 | Lenius et al. |
| 11,245,247 B2 | 2/2022 | Colles et al. |
| 11,444,433 B2 * | 9/2022 | Colles ............... H03K 17/6871 |
| 2003/0016711 A1 | 1/2003 | Crawford |
| 2004/0202216 A1 | 10/2004 | Fairgrieve |
| 2005/0185428 A1 | 8/2005 | Crawford et al. |
| 2005/0243879 A1 | 11/2005 | Horiuchi et al. |
| 2009/0161707 A1 | 6/2009 | Champion et al. |
| 2010/0283322 A1 | 11/2010 | Wibben |
| 2011/0085576 A1 | 4/2011 | Crawford et al. |
| 2011/0291578 A1 | 12/2011 | Philippbar et al. |
| 2014/0009952 A1 | 1/2014 | Nomura et al. |
| 2016/0344156 A1 | 11/2016 | Rothberg et al. |
| 2017/0085057 A1 | 3/2017 | Barnes et al. |
| 2017/0223788 A1 | 8/2017 | Jämsä et al. |
| 2017/0244212 A1 | 8/2017 | Burkholder |
| 2018/0261975 A1 | 9/2018 | Pavlov et al. |
| 2018/0278017 A1 | 9/2018 | Mignoli et al. |
| 2018/0323576 A1 | 11/2018 | Crawford et al. |
| 2019/0386460 A1 | 12/2019 | Barnes et al. |
| 2020/0067269 A1 | 2/2020 | Eggermont |
| 2021/0066885 A1 | 3/2021 | Kuo et al. |

OTHER PUBLICATIONS

International Search Report and Written Opinion dated Jul. 19, 2021 for PCT Patent Application No. PCT/IB2021/052368.

Notice of Allowance and Fees dated Apr. 19, 2022 for U.S. Appl. No. 17/446,606.

Notice of Allowance and Fees dated Sep. 14, 2021 for U.S. Appl. No. 17/301,009.

Notice of Allowance and Fees dated Dec. 8, 2022 for U.S. Appl. No. 17/648,907.

* cited by examiner

FIG. 2A
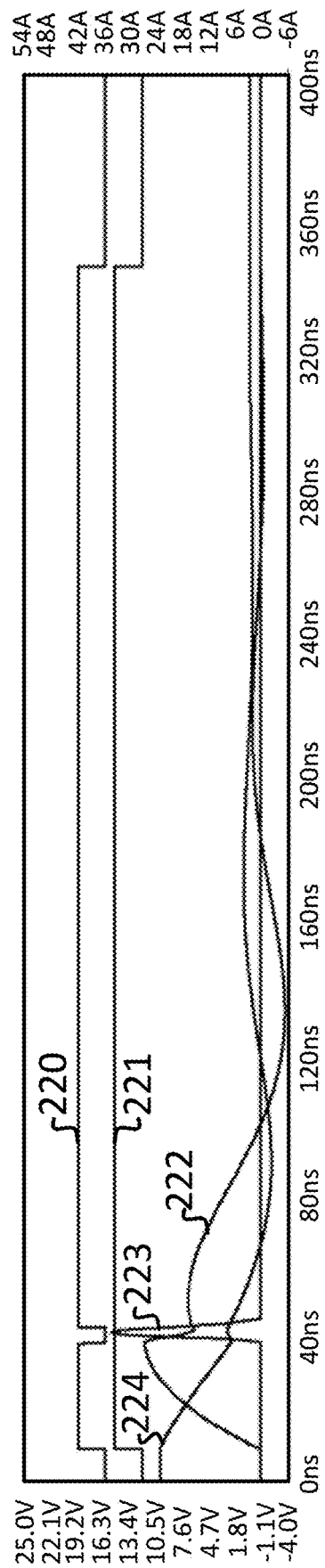
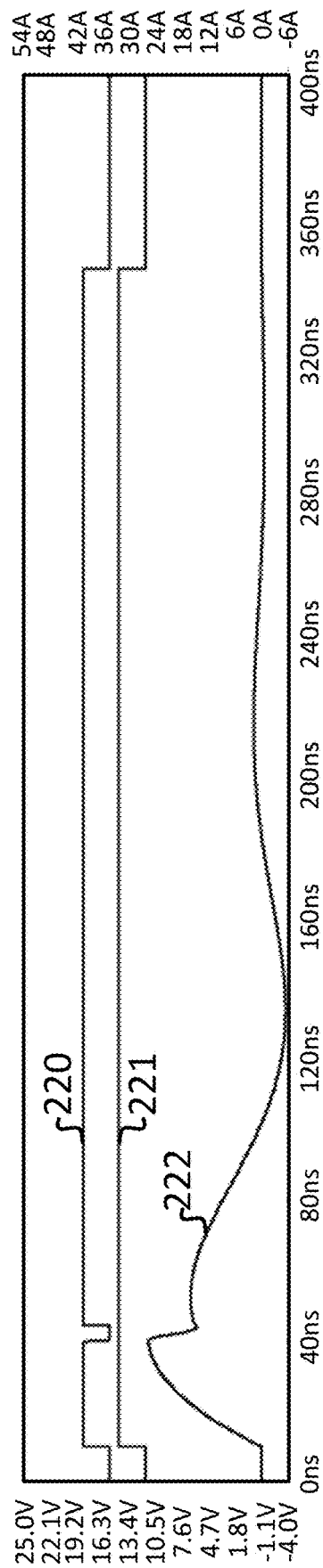

FIG. 2B
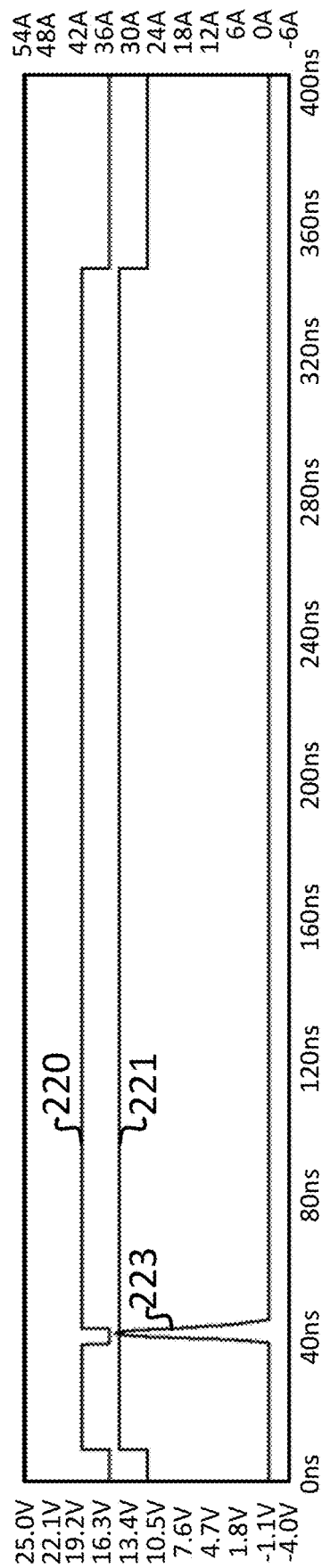
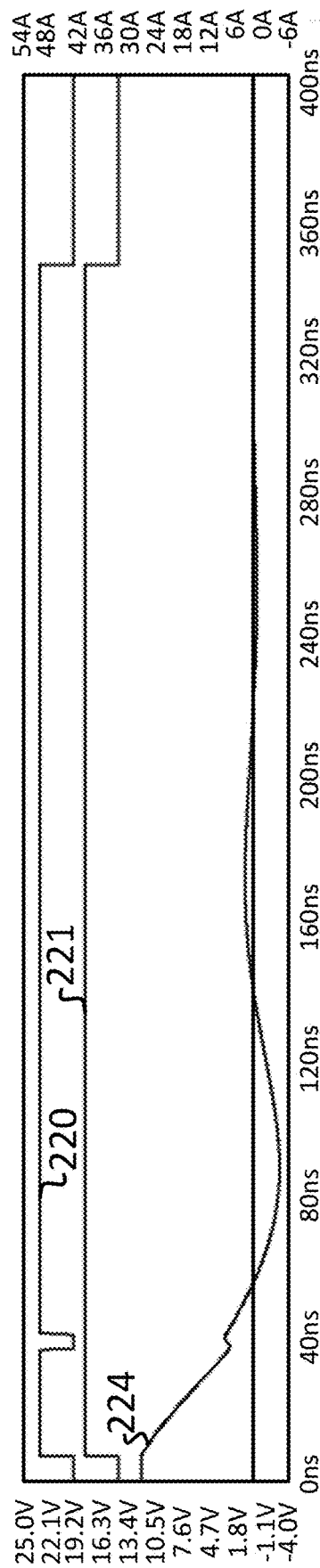

FIG. 2C
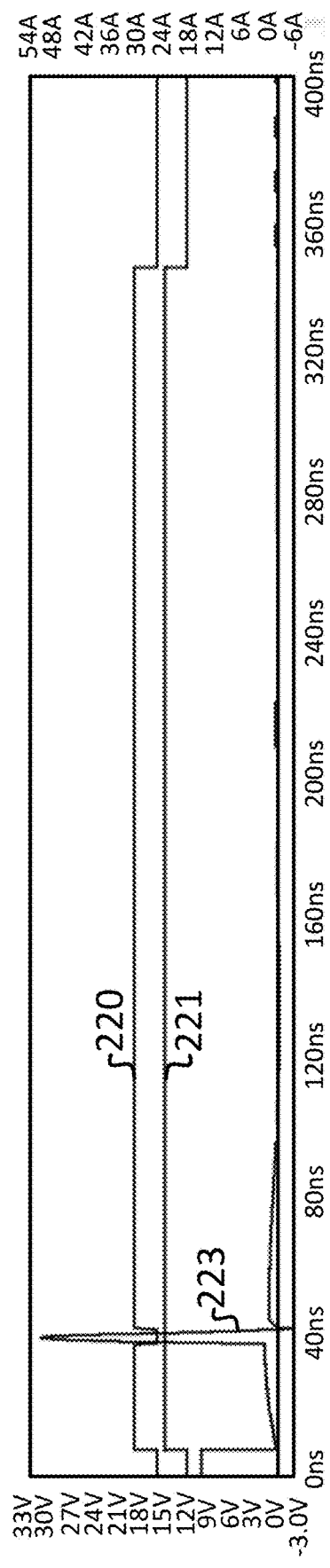
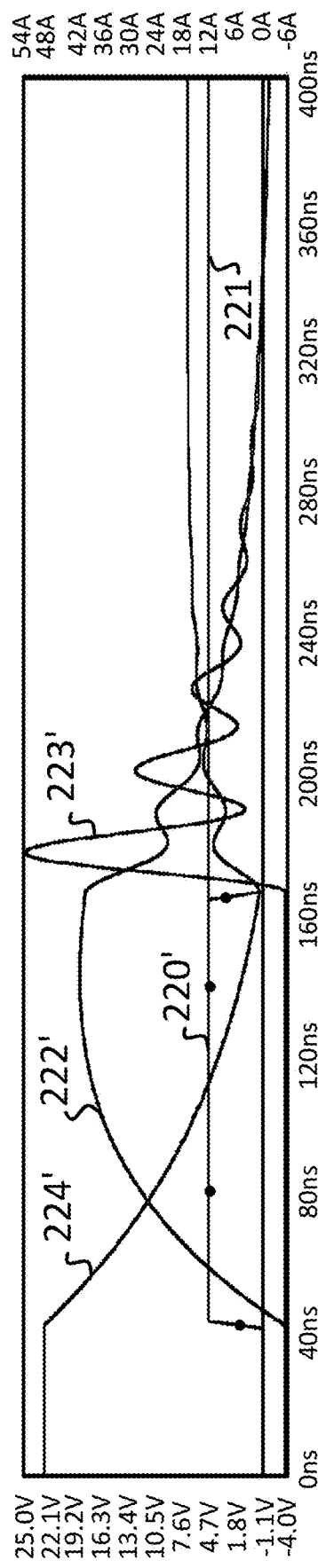

| | $M_{BP}$ | $M_{DL}$ | |
|---|---|---|---|
| Precharge$^n$ | OFF | OFF | ← 301 |
| Preflux$^n$ | ON | ON | ← 302 |
| Pulse Generation$^n$ | OFF | ON | ← 303 |
| Discharge$^n$ | ON | ON | ← 304 |
| Precharge$^{n+1}$ | OFF | OFF | ← 305 |

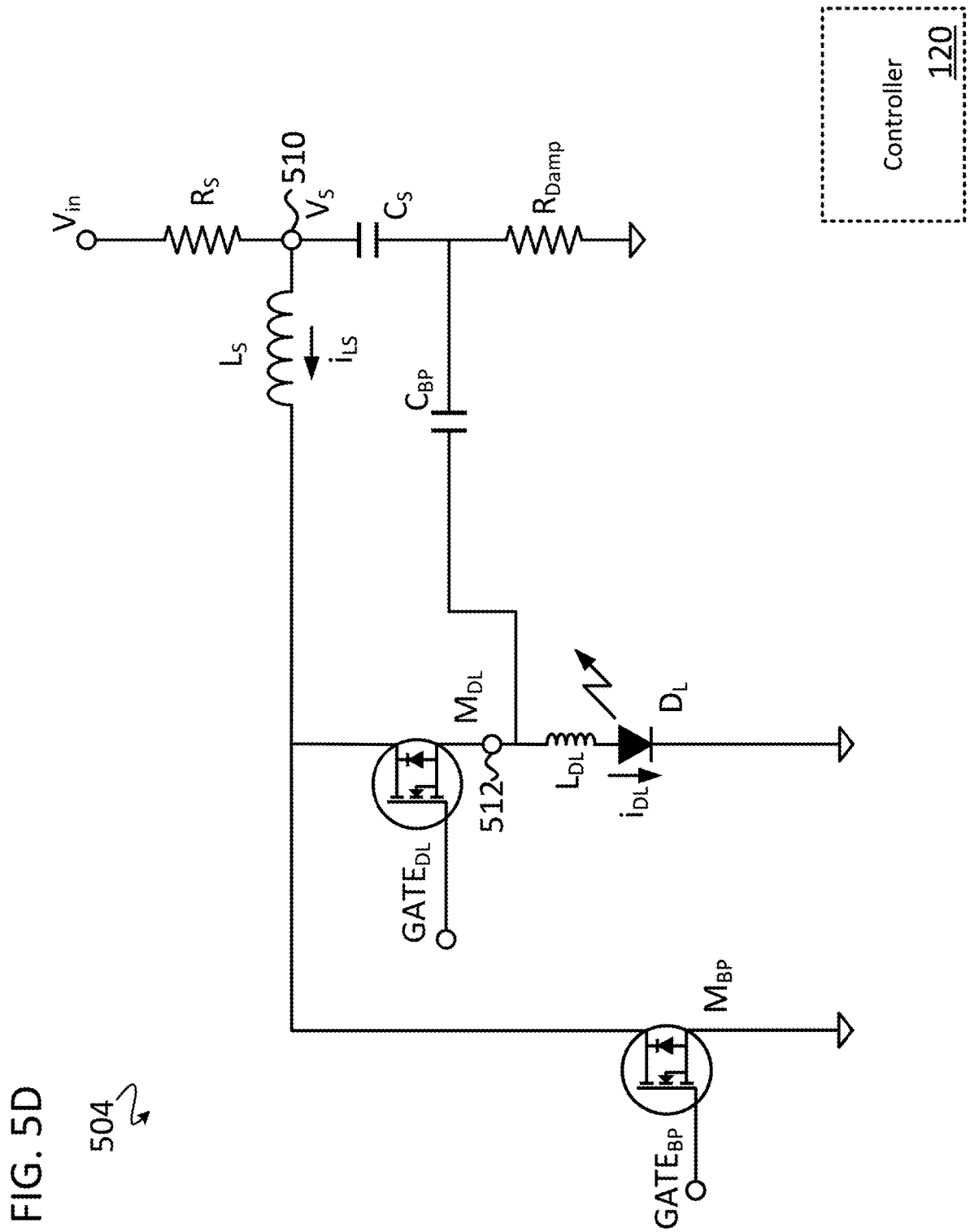

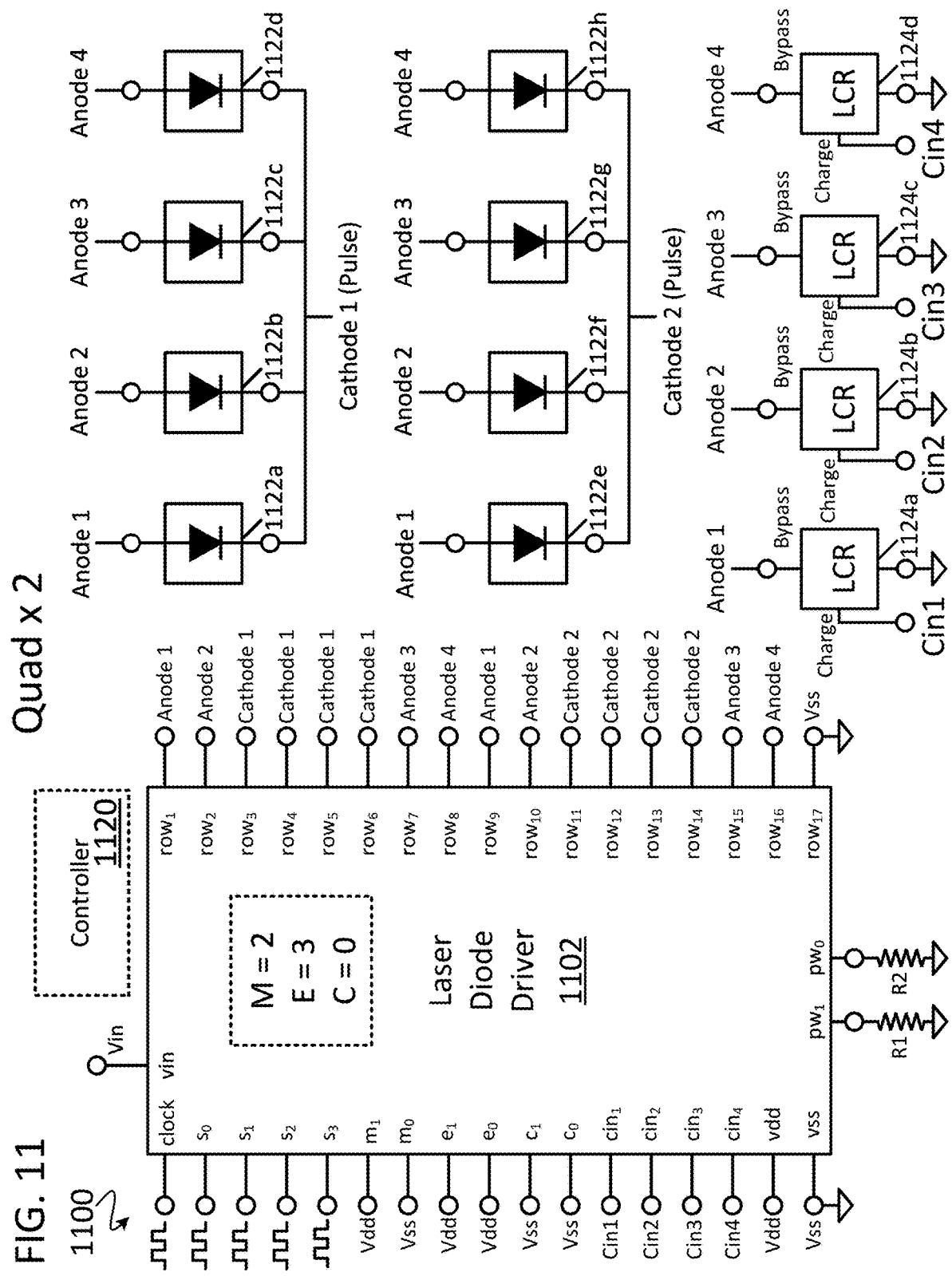

FIG. 15
1500

| M | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|----|----|----|----|----|----|----|----|
| 0 | P | P | P | P | P | P | P | P | P | P  | P  | P  | P  | P  | P  | P  | B  |
| 1 | P | B | P | B | P | B | P | B | P | B  | P  | B  | P  | B  | P  | B  | B  |
| 2 | B | B | P | P | P | B | B | P | B | P  | P  | B  | P  | B  | B  | B  | B  |
| 3 | P | P | P | P | B | B | B | B | P | P  | P  | P  | B  | B  | B  | B  | B  |

16 Channel Outputs selected by S0-3

| E | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|----|----|----|----|----|----|----|----|
| 0 |   |   |   |   |   |   |   |   |   |    |    |    |    |    |    |    |    |
| 1 |   |   |   |   |   |   |   |   |   |    |    |    |    |    |    |    |    |
| 2 |   |   |   |   |   |   |   |   |   |    |    |    |    |    |    |    |    |
| 3 |   |   |   |   |   |   |   |   |   |    |    |    |    |    |    |    |    |

| C | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|----|----|----|----|----|----|----|----|
| 0 | CX | CX | CX | CX | CX | CX | CX | CX | CX | CX | CX | CX | CX | CX | CX | CX | CX |
| 1 | C1 | C2 | C3 | C4 | C1 | C2 | C3 | C4 | C1 | C2 | C3 | C4 | C1 | C2 | C3 | C4 | CX |
| 2 | C1 | C1 | C2 | C2 | C3 | C3 | C4 | C4 | C1 | C1 | C2 | C2 | C3 | C3 | C4 | C4 | CX |
| 3 | C1 | C1 | C1 | C1 | C2 | C2 | C2 | C2 | C3 | C3 | C3 | C3 | C4 | C4 | C4 | C4 | CX |

CONFIGURABLE PULSED LASER DIODE DRIVER

RELATED APPLICATIONS

This application is a continuation of U.S. patent application Ser. No. 17/446,606, filed Aug. 31, 2021, which claims priority to U.S. Provisional Application No. 63/075,527, filed Sep. 8, 2020, and U.S. Provisional Application No. 63/127,794, filed Dec. 18, 2020, all of which are incorporated herein in their entirety by reference for all purposes.

BACKGROUND

Laser-based ranging systems, such as Lidar, often use a pulsed laser diode driver circuit to generate a short, high-current pulse, which is passed through a laser diode to emit a corresponding pulse of laser light. Reflected pulses of laser light are received by the Lidar system and used to determine a distance between the Lidar system and the point of reflection. Spatial resolution of Lidar systems is determined in part by the width of the pulse of laser light, thus it is usually desirable to generate a pulse of light having a width of about 5 ns or less. However, parasitic inductances of the pulsed laser diode driver circuit and the laser diode typically must be overcome to achieve the desired short pulse width. For example, many laser diodes have at least one bond wire which can contribute 1 nH of inductance, thereby limiting a slew rate of the current pulse unless there is very high voltage. Thus, some conventional pulsed laser diode driver circuits use a high source voltage, often greater than 40V to 100V, to achieve the desire pulse width. Switching devices, such as GaN field-effect transistors (FET), are often used in conventional pulsed laser diode driver circuits as they can withstand such high voltages. However, pulsed laser diode driver circuits that use GaN technology may be more expensive and/or may be more difficult to integrate with Silicon-based architectures.

There are many types of laser diode packaging configurations—spanning from packages housing a single laser diode, to packages housing four laser diodes ("quad-packs"), to packages housing arrays of tens-of-thousands of laser diodes. Additionally, packaging pinouts differ between various laser diode configurations (e.g., between that of a single or quad edge-emitting laser diode configuration versus that of a vertical-cavity surface-emitting laser (VCSEL) laser diode configuration).

SUMMARY

In some embodiments, a laser diode driver includes a clock terminal operable to receive a clock signal, configuration terminals operable to receive configuration data, charging terminals, and drive terminals. A first charging terminal of the charging terminals is operable to charge a first source capacitor of a first resonant circuit. The first resonant circuit includes the first source capacitor, a first inductor, and a first bypass capacitor. Each drive terminal is operable to be directly electrically connected to an anode or cathode of a laser diode or to ground. A mode, output selection, and grouping of drive signals that are delivered to the laser diodes are configured based on the configuration data. The laser diode driver is operable to control a current flow through the first resonant circuit to produce high-current pulses through the laser diodes, the high-current pulses corresponding to a peak current of a resonant waveform developed at respective anodes of the laser diodes, a timing of the high-current pulses being synchronized using the clock signal.

In some embodiments, an apparatus includes a clock terminal operable to receive a clock signal, configuration terminals operable to receive configuration data, charging terminals, and drive terminals. A first charging terminal is directly electrically connected to a first source capacitor of a first resonant circuit. The first resonant circuit includes the first source capacitor, a first inductor, and a first bypass capacitor. Each drive terminal is directly electrically connected to an anode or cathode of a laser diode or to ground. The first inductor has a first terminal and a second terminal, the first terminal of the first inductor being operable to receive a charging voltage from the first charging terminal of the plurality of charging terminals. The first source capacitor has a first terminal directly electrically connected to the first terminal of the first inductor and a second terminal electrically coupled to ground. The first bypass capacitor has a first terminal directly electrically connected to the second terminal of the first inductor and a second terminal directly electrically connected to the second terminal of the first source capacitor. The apparatus is operable to control a current flow through the first resonant circuit to produce high-current pulses through the laser diodes, the high-current pulses corresponding to a peak current of a resonant waveform developed at respective anodes of the laser diodes, a timing of the high-current pulses being synchronized using the clock signal.

BRIEF DESCRIPTION OF THE DRAWINGS

FIGS. 2A-D show simplified plots of signals related to operation of the pulsed laser diode driver shown in FIG. 1A, in accordance with some embodiments.

FIG. 3 is a portion of an example switching sequence for operation of the pulsed laser diode drivers shown in FIGS. 1A-C, in accordance with some embodiments.

FIGS. 5A-D are simplified circuit schematics of pulsed laser diode drivers of a third general topology, in accordance with some embodiments.

FIG. 11 shows a simplified circuit schematic of the configurable pulsed laser diode driver of FIG. 10A when it is configured to drive two quad-pack laser diode packages, in accordance with some embodiments.

FIG. 15 is a table of example configurations of the configurable pulsed laser diode driver of FIG. 10A, in accordance with some embodiments.

FIGS. 16A-B are partial views of a table of example configurations of the configurable pulsed laser diode driver of FIG. 10A, in accordance with some embodiments.

DETAILED DESCRIPTION

Figure 1A:
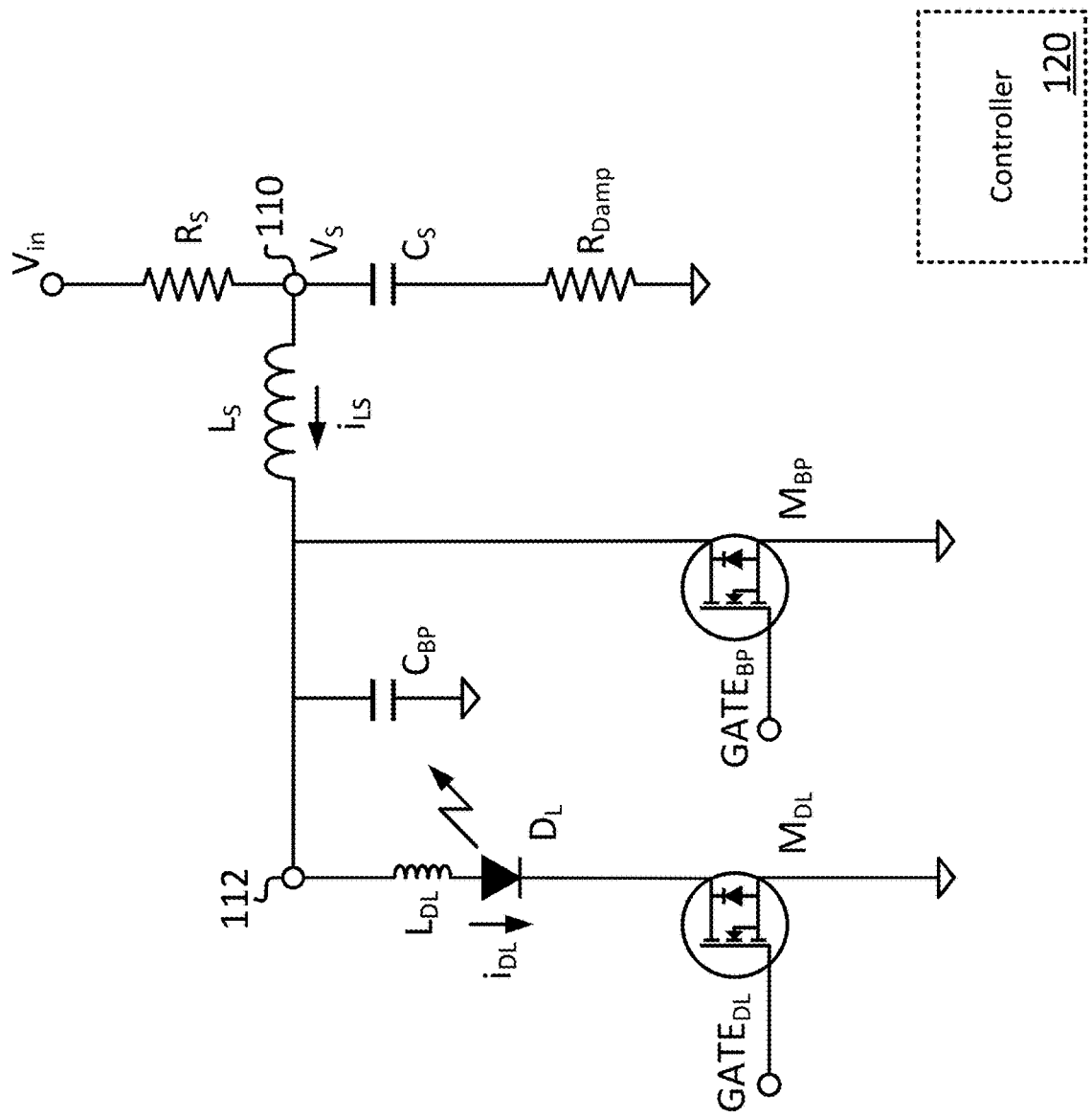
FIGS. 1A-C are simplified circuit schematics of pulsed laser diode drivers of a first general topology, in accordance with some embodiments.

In accordance with some embodiments, pulsed laser diode driver circuits disclosed herein ("pulsed laser diode drivers"), generate high-current (e.g., 40 Amp) ultra-short pulses (e.g., 4 ns) to emit a laser pulse from a laser diode using a tunable resonant circuit, as compared to conventional solutions that rely on fixed, and often unavoidable, parasitic capacitances and inductances of a circuit. The tunable resonant circuit provides easily tunable parameters which control a pulse width, a peak current, a charge time, a recovery time, a decay time, and other tunable parameters of the pulsed laser diode driver. Embodiments of a switching sequence to drive the pulsed laser diode drivers disclosed herein are operable to generate a resonant waveform at an anode of the laser diode to produce the high-current pulse through the laser diode, a voltage level of the resonant waveform being advantageously sufficient to support the high-current pulse and not of a voltage level that exceeds the voltage required to generate the high-current pulse.

Thus, embodiments of such pulsed laser diode drivers can advantageously generate the high-current pulses using a low input voltage (e.g., 6V, 9V, 15V, etc.) and can thereby use Silicon-based switches, rather than GaN-based switches which are used by many conventional solutions. Any of the pulsed laser diode drivers disclosed herein can therefore be integrated into a single semiconductor die. Embodiments of pulsed laser diode drivers disclosed herein advantageously use a discrete inductor (e.g., a through-hole or surface-mounted component) intentionally added to the pulsed laser diode driver to generate a resonant waveform rather than relying on parasitic inductances (e.g., of the laser diode, of bond wires, or inter-circuit connections) of the pulsed laser diode driver. As a result, embodiments of the laser drivers disclosed herein are easily tunable and have a reproducible architecture. By contrast, conventional pulsed laser diode drivers often use a variety of techniques to overcome the effects of parasitic inductances of the pulsed laser diode driver and of the laser diode itself and therefore teach away from intentionally adding yet additional inductance to the pulsed laser diode driver. In addition to such intentionally added inductors, the pulsed laser diode drivers disclosed herein advantageously include a bypass capacitor that may be used by a designer to easily tune a desired pulse width emitted by the laser diode, as compared to conventional solutions which only have a source capacitor, or that only consider non-tunable parasitic capacitances of the pulsed laser diode driver. Once again, such conventional solutions teach away from adding yet additional capacitance to the pulsed laser diode driver. Because conventional solutions rely on parasitic capacitances and inductances of the conventional laser driver, modifying parameters such as a pulse width might require a redesign or re-layout of the conventional solution. By comparison, parameters, such as a pulse width, of the pulsed laser diode drivers disclosed herein can be tuned by simply changing a component value.

There are many types of laser diode packaging configurations—spanning from packages housing a single laser diode, to four laser diodes ("quad-packs"), to arrays of tens-of-thousands of laser diodes in a single package. Additionally, packaging pinouts differ between various laser diode configurations (e.g., between that of a single or quad edge-emitting laser diode configuration versus that of a vertical-cavity surface-emitting laser (VCSEL) laser diode configuration). However, laser diodes of the various configurations have similar characteristics, such as a high threshold turn-on voltage and internal series resistance which determine a transfer function of the laser diode device. As disclosed herein, a configurable pulsed laser diode driver is advantageously operable to control a wide variety of laser diode packaging configurations which may vary in the number, type, and grouping of laser diodes.

Figure 1B:
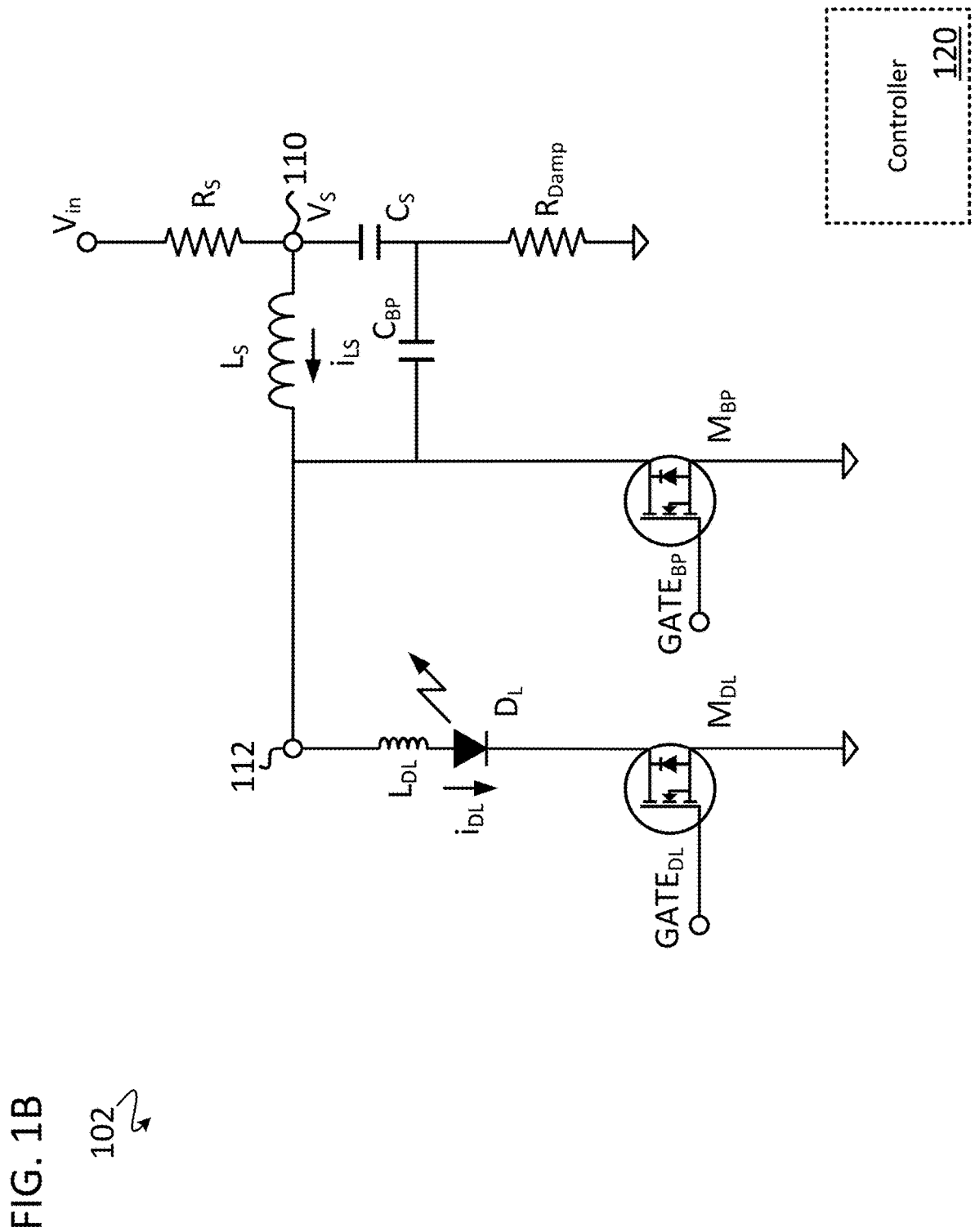
Figure 1C:
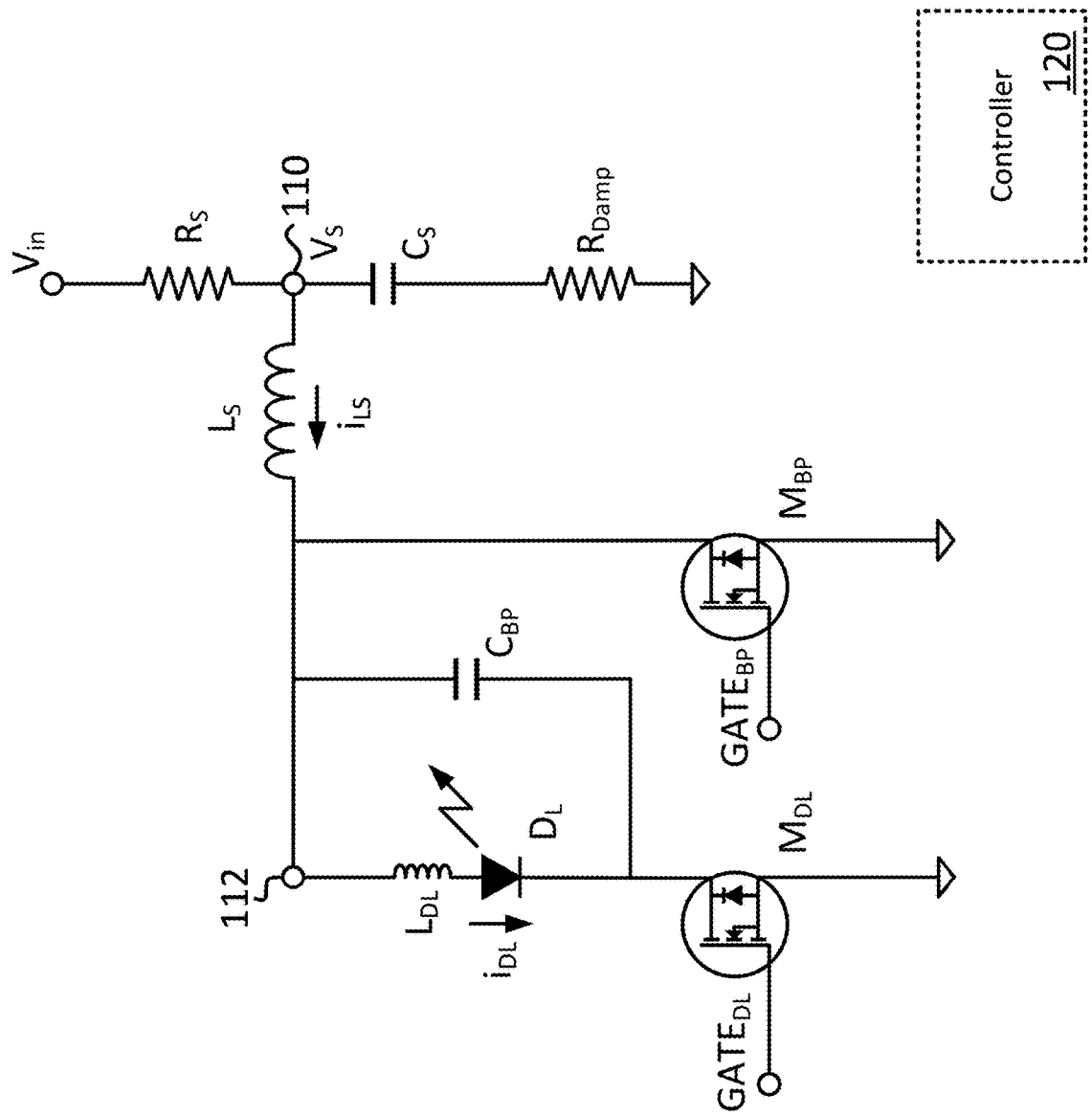

FIGS. 1A-C are simplified circuit schematics of pulsed laser diode drivers 101-103 of a first general topology to drive a laser diode using a low-side switch, in accordance with some embodiments. The pulsed laser diode drivers 101-103 each generally include a source resistor $R_S$, a source capacitor $C_S$, a damping resistor $R_{Damp}$, an inductor $L_S$, a bypass capacitor $C_{BP}$, a laser diode $D_L$, a bypass switch $M_{BP}$, and a laser diode switch MDL. The laser diode switch MDL is configured as a low-side switch. Also shown is a controller 120, nodes 110, 112, a parasitic inductance $L_{DL}$ of the laser diode $D_L$, a DC input voltage $V_{in}$, a source voltage $V_s$ at the source capacitor $C_S$, a current $i_{LS}$ through the inductor $L_S$, a current $i_{DL}$ through the laser diode $D_L$, a bypass switch gate driver signal $GATE_{BP}$, and a laser diode switch gate driver signal $GATE_{DL}$.

Topologies of the pulsed laser diode drivers 101-103 vary with respect to placement of the bypass capacitor $C_{BP}$. In each of the topologies of the pulsed laser diode drivers 101-103, a first terminal of the source resistor $R_S$ is configured to be directly electrically connected to the DC input voltage $V_{in}$. A first terminal of the source capacitor $C_S$ is directly electrically connected to a second terminal of the source resistor $R_S$, and a second terminal of the source capacitor $C_S$ is directly electrically connected to a first terminal of the damping resistor $R_{Damp}$. A second terminal of the damping resistor $R_{Damp}$ is directly electrically connected to a bias voltage node such as ground. A first terminal of the inductor $L_S$ is directly electrically connected to the second terminal of the source resistor $R_S$ and to the first terminal of the source capacitor $C_S$. A drain node of the bypass switch $M_{BP}$ is directly electrically connected to a second terminal of the inductor $L_S$, and a source node of the bypass switch $M_{BP}$ is directly electrically connected to the bias voltage node. An anode of the laser diode $D_L$ is directly electrically connected to the second terminal of the inductor $L_S$, and a cathode of the laser diode $D_L$ is directly electrically connected to a drain node of the laser diode switch MDL. A source node of the laser diode switch MDL is directly electrically connected to the bias voltage node.

The bypass switch $M_{BP}$ is configured to receive the bypass switch gate driver signal $GATE_{BP}$ at a gate node, the bypass switch gate driver signal $GATE_{BP}$ being operable to turn the bypass switch $M_{BP}$ on or off based on a voltage level of the bypass switch gate driver signal $GATE_{BP}$. Similarly, the laser diode switch MDL is configured to receive the laser diode switch gate driver signal $GATE_{DL}$ at a gate node, the laser diode switch gate driver signal $GATE_{DL}$ being operable to turn the laser diode switch MDL on or off based on a voltage level of the laser diode switch gate driver signal $GATE_{DL}$. In some embodiments, the pulsed laser diode driver circuits disclosed herein include one or more bootstrap circuits or other level-shifting circuits to drive one or more high-side switches. Either or both of the bypass switch $M_{BP}$ and the laser diode switch MDL can be implemented as N-type switches or P-type switches. In some embodiments, the bypass switch $M_{BP}$ and the laser diode switch $M_{DL}$ are implemented as Silicon-based or Silicon-Carbide-based field-effect transistors (FETs). Two or more components described herein as having terminals that are directly electrically connected have a DC current path between the respective terminals of the two or more components. For example, a first and second component are not directly electrically connected via a capacitor connected in series between the first component and the second component.

As shown in the simplified circuit schematic of the pulsed laser diode driver 101 of FIG. 1A, in some embodiments a first terminal of the bypass capacitor $C_{BP}$ is directly electrically connected to the second terminal of the inductor $L_S$ and to the anode of the laser diode $D_L$. In such embodiments, a second terminal of the bypass capacitor $C_{BP}$ is directly electrically connected to the bias voltage node. As shown in the simplified circuit schematic of the pulsed laser diode driver 102 of FIG. 1B, in some embodiments, the first terminal of the bypass capacitor $C_{BP}$ is directly electrically connected to the second terminal of the inductor $L_S$ and to the anode of the laser diode $D_L$. The second terminal of the bypass capacitor $C_{BP}$ is directly electrically connected to the second terminal of the source capacitor $C_S$ and to the first terminal of the damping resistor $R_{Damp}$. As shown in the simplified circuit schematic of the pulsed laser diode driver 103 of FIG. 1C, in some embodiments, the first terminal of the bypass capacitor $C_{BP}$ is directly electrically connected to the second terminal of the inductor $L_S$ and to the anode of the laser diode $D_L$. In such embodiments, the second terminal of the bypass capacitor $C_{BP}$ is directly electrically connected to the drain terminal of the laser diode switch $M_{DL}$ and to the cathode of the laser diode $D_L$.

In some embodiments, the pulsed laser diode drivers 101-103 are configured to receive the DC input voltage $V_{in}$ having a voltage range from about 10V to 20V, which is advantageously lower than an input voltage used by many conventional pulsed laser diode drivers. The inductor $L_S$ is a physical component added to the pulsed laser diode drivers 101-103 (i.e., as opposed to a representation of a parasitic inductance caused by components or interconnections such as bond wires). Similarly, the bypass capacitor $C_{BP}$ is a physical component added to the pulsed laser diode drivers 101-103 (i.e., as opposed to a representation of a parasitic capacitance). One advantage of using physical inductor and capacitor components rather than using parasitic inductances is that values of the inductor $L_S$ and the bypass capacitor $C_{BP}$ can be easily modified by a designer or even by an end-user. By comparison, conventional designs that rely on parasitic reactances may require re-design and/or re-layout to change an operating parameter.

As disclosed herein, values of the DC input voltage $V_{in}$, the inductance of the inductor $L_S$, the capacitance of the source capacitor $C_S$, the resistance of the damping resistor $R_{Damp}$, and the capacitance of the bypass capacitor $C_{BP}$ can advantageously be selected ("tuned") to achieve a desired operation of the pulsed laser diode drivers 101-103 (e.g., a charge time, a pulse width, a pulse voltage, a pulse current). For example, a pulse width of the current $i_{DL}$ flowing through the laser diode $D_L$ can be tuned by adjusting the capacitance value of the bypass capacitor $C_{BP}$. A peak current level of the pulse of current $i_{DL}$ flowing through the laser diode $D_L$ can be tuned by adjusting the source voltage $V_s$ on the supply capacitor $C_S$. A capacitance value of the source capacitor $C_S$ can be tuned to adjust a timing delay of the current pulse and an upper range of the current $i_{DL}$ through the laser diode $D_L$. Resistance values of the damping resistor $R_{Damp}$ are dependent on the capacitance value of the supply capacitor $C_S$ and can be tuned within a range of values such that at a lower resistance, a lower frequency resonance of the pulsed laser diode drivers disclosed herein is underdamped (e.g., at about $R_{Damp}$=0.1 Ohm), or is critically damped (e.g., at about $R_{Damp}$=0.4 Ohm). The damping resistor $R_{Damp}$ is operable to prevent current of the generated resonant waveform from becoming negative, which could thereby enable a body diode of the bypass switch $M_{BP}$ or the laser diode switch $M_{DL}$. Although a resulting maximum current level of the current $i_{DL}$ through the laser diode $D_L$ is lower for the critically damped case, the current level can be easily adjusted by raising the voltage level of the DC input voltage $V_{in}$. In other embodiments, the damping resistor $R_{Damp}$ is removed entirely from the design (i.e., the second terminal of the source capacitor $C_S$ is directly electrically connected to the bias voltage node). In yet other embodiments, the resistance value of the damping resistor $R_{Damp}$ is set to zero Ohms.

In some embodiments, the DC input voltage $V_{in}$ is about 15V, the inductance of the inductor $L_S$ is about 6 nH, the capacitance of the source capacitor $C_S$ is about 100 nF, the resistance of the damping resistor $R_{Damp}$ is about 0.1 Ohm, and the capacitance of the bypass capacitor $C_{BP}$ is about 1 nF. In some embodiments, a voltage at the first terminal of the damping resistor $R_{Damp}$ is received by the controller 120 to provide an indication of a current flow through the damping resistor $R_{Damp}$.

The controller 120 may be integrated with any embodiment of the pulsed laser diode drivers disclosed herein, or it may be a circuit or module that is external to any embodiment of the pulsed laser diode drivers disclosed herein. The controller 120 is operable to generate one or more gate drive signals having a voltage level that is sufficient to control one or more laser diode switches MDL and one or more bypass switches $M_{BP}$. Additionally, the controller 120 is operable to sense a voltage and/or current at any of the nodes 110 and 112 and at nodes that are similar to, or the same as, the nodes 110 and 112 as described herein, or at still other nodes of the pulsed laser diode drivers disclosed herein. The controller 120 may include one or more timing circuits, look-up tables, processors, memory, or other modules to control the pulsed laser diode drivers disclosed herein. Operation of the pulsed laser diode drivers 101-103 is explained in detail with respect to simplified plots 201-207 of FIGS. 2A-D and an example switching sequence 300 is shown in FIG. 3.

FIGS. 2A-2D show simplified plots 201-207 of signals related to operation of the pulsed laser diode driver 101 shown in FIG. 1A, in accordance with some embodiments.

However, signals related to the operation of the pulsed laser diode drivers 101-103, 401-404, 501-504, 601-604, 701-705, 801-802, and 901-902 are similar to, or are the same as, those shown in the simplified plots 201-207.

The simplified plot 201 illustrates a voltage plot of the bypass switch gate driver signal $GATE_{BP}$ 220, a voltage plot of the laser diode switch gate driver signal $GATE_{DL}$ 221, a current plot of the current $i_{LS}$ through the inductor $L_S$ 222, a current plot of the current $i_{DL}$ through the laser diode $D_L$ 223, and a voltage plot of the source voltage $V_S$ 224 at the source capacitor $C_S$, all over the same duration of time. Details of these signals are described below. The voltage plots of the bypass switch gate driver signal $GATE_{BP}$ 220 and the laser diode switch gate driver signal $GATE_{DL}$ 221 have been level-shifted for readability, but are, in actuality, low voltage inputs. Additionally, the voltage plots of the bypass switch gate driver signal $GATE_{BP}$ 220 and the laser diode switch gate driver signal $GATE_{DL}$ 221 assume that the laser diode switch $M_{DL}$ and the bypass switch $M_{BP}$ are NFET devices. However, if PFET devices are used instead, the polarity of the bypass switch gate driver signal $GATE_{BP}$ 220 and the laser diode switch gate driver signal $GATE_{DL}$ 221 are inverted.

Upon receiving (e.g., from the controller 120) an asserted level of the bypass switch gate driver signal $GATE_{BP}$ 220 at the gate node of the bypass switch $M_{BP}$, the bypass switch $M_{BP}$ is enabled (i.e., transitioned to an ON-state). Similarly, upon receiving (e.g., from the controller 120) an asserted level of the laser diode switch gate driver signal $GATE_{DL}$ 221 at the gate node of the laser diode switch MDL, the laser diode switch MDL is enabled. As highlighted in the plot 202, when the bypass switch $M_{BP}$ is enabled, the rising current $i_{LS}$ 222 begins to flow through the inductor $L_S$, thereby building magnetic flux at the inductor $L_S$. When the current $i_{LS}$ 222 has reached a desired level (e.g., as determined by the controller 120 using sensed current, voltage, a timer circuit, or as determined by design constraints), a de-asserted level of the bypass switch gate driver signal $GATE_{BP}$ 220 is received (e.g., from the controller 120) at the gate node of the bypass switch $M_{BP}$, thereby disabling the bypass switch $M_{BP}$ (i.e., transitioned to an OFF-state). As highlighted in the plot 203, when the bypass switch $M_{BP}$ is disabled, the current $i_{LS}$ 222 which has built up through the inductor $L_S$, having no other current path, is redirected through the laser diode $D_L$, causing a short (e.g., 2 ns-5 ns), high-current (e.g., >30 A) pulse to flow through the laser diode $D_L$, thereby causing the laser diode $D_L$ to emit a pulse of laser light. Because energy in the form of flux has been stored at the inductor $L_S$, the high-current pulse $i_{DL}$ that flows through the laser diode $D_L$ can be significantly greater than the current $i_{LS}$ that flows through the inductor $L_S$. Values of the reactive components of the laser diode drivers disclosed herein can be advantageously selected to generate a desired current amplitude of the high-current pulse $i_{DL}$.

After emission from the laser diode $D_L$, the bypass switch is reenabled by an asserted level of the bypass switch gate driver signal $GATE_{BP}$ 220, and the laser diode switch MDL is maintained in an enabled state by an asserted level of the laser diode switch gate driver signal $GATE_{DL}$ 221. As highlighted in the plot 204, the bypass switch $M_{BP}$ and the laser diode switch MDL are both advantageously maintained in the enabled state as the source voltage $V_S$ 224 stored at the source capacitor $C_S$ is discharged. As highlighted in the plot 205, while the bypass switch $M_{BP}$ and the laser diode switch MDL are maintained in the enabled state, the current $i_{DL}$ 223 through the laser diode $D_L$ (and importantly, through the parasitic inductance $L_{DL}$ of the laser diode $D_L$) diminishes to zero. Thereafter, both the bypass switch $M_{BP}$ and the laser diode switch MDL are disabled by de-asserted levels (e.g., from the controller 120) of the bypass switch gate driver signal $GATE_{BP}$ 220 and the laser diode switch gate driver signal $GATE_{DL}$ 221. Because the laser diode switch MDL is not disabled until a current through the parasitic inductance $L_{DL}$ of the laser diode $D_L$ has diminished to zero, a high voltage spike advantageously does not develop at the anode of the laser diode $D_L$ as there is no rapid change in current through the parasitic inductance $L_{DL}$. Because such high voltage spikes are advantageously mitigated, the laser diode switch MDL does not need to be selected to withstand high voltages, thereby simplifying the design and reducing the cost of the pulsed laser diode drivers disclosed herein as compared to conventional solutions. Additionally, because such high voltage spikes are mitigated, the pulsed laser diode drivers disclosed herein do not require voltage snubbing circuits that are commonly used in conventional solutions, thereby further simplifying the design and reducing the cost of the pulsed laser diode drivers disclosed herein as compared to conventional solutions.

The high-current pulse 223 is a first and largest peak of the resonant waveform developed by reactive components of the pulsed laser diode driver circuit. These reactive components include the source capacitor $C_S$, the inductor $L_S$, the parasitic inductance $L_{DL}$ of the laser diode $D_L$, and the bypass capacitor $C_{BP}$. In addition to the advantages described above, the bypass switch $M_{BP}$ also reduces subsequent resonant waveform "ringing" of the resonant waveform after the high-current pulse 223 is generated. As shown in the plot 206, if a bypass switch gate driver signal $GATE_{BP}$ 220' is not asserted after a high-current pulse $i_{DL}$ 223' is generated, ringing occurs on the current $i_{LS}$ 222' through the inductor $L_S$, on the current $i_{DL}$ 223' through the laser diode $D_L$, and on the source voltage $V_S$ 224' at the source capacitor $C_S$.

As previously described, values of the source capacitor $C_S$, the inductor $L_S$ and the bypass capacitor $C_{BP}$ may be advantageously selected or "tuned" by a designer to meet desired performance criteria of the pulsed laser diode driver disclosed herein. For example, a capacitance value of the bypass capacitor $C_{BP}$ may be selected based on a desired pulse width of the current $i_{DL}$ through the laser diode $D_L$. The plot 207 shows the pulse 223 generated when the capacitance of the bypass capacitor $C_{BP}$ is equal to 1 nF, and a pulse 223" generated when the capacitance of the bypass capacitor $C_{BP}$ is equal to 4 nF. In use cases where a wider pulse, such as the pulse 223", is desired, the source voltage $V_S$ may be raised accordingly. Additionally, in some embodiments, the width of the de-asserted portion of the bypass switch gate driver signal $GATE_{BP}$ 220 is widened to accommodate a wider pulse.

FIG. 3 illustrates a portion of an example switching sequence 300 for operation of the pulsed laser diode drivers 101-103 shown in FIG. 1A-B, in accordance with some embodiments, and as was described with reference to FIGS. 2A-C. However, the switching sequence 300 is similar to, or the same as, respective switching sequences related to the operation of the pulsed laser diode drivers 401-404, 501-504, 601-604, 701-705, 801-802, and 901-902.

At a precharge step 301, the bypass switch $M_{BP}$ and the laser diode switch $M_{DL}$ are off (i.e., not conducting). During the precharge step 301, the source capacitor $C_S$ is charged through the source resistor $R_S$. At a preflux step 302, the bypass switch $M_{BP}$ and the laser diode switch MDL are transitioned to an ON-state, thereby allowing the current $i_{LS}$ to flow through the inductor $L_S$ to store energy in the form of magnetic flux at the inductor $L_S$. Even though both of the switches ($M_{DL}$, $M_{BP}$) are in an ON-state at the preflux step 302, the bypass path through the bypass switch $M_{BP}$ will carry all of the current $i_{LS}$ because a bandgap voltage of the laser diode $D_L$ needs to be overcome to allow current to flow through the laser diode $D_L$.

In some embodiments, the laser diode switch MDL is transitioned to an ON-state after the bypass switch $M_{BP}$ is transitioned to an ON-state. At a pulse generation step 303, the bypass switch $M_{BP}$ is transitioned to an OFF-state while the laser diode switch MDL is maintained in an ON-state, thereby generating the high-current pulse through the laser diode $D_L$. When the bypass switch $M_{BP}$ is transitioned to the OFF-state, voltage at the anode of the laser diode $D_L$ rises quickly until the bandgap voltage of the laser diode $D_L$ is overcome and the laser diode $D_L$ begins to conduct current. Because of a resonant circuit formed by the bypass capacitor $C_{BP}$ and the parasitic inductance $L_{DL}$ of the laser diode $D_L$, the voltage formed at the anode of the laser diode $D_L$ will advantageously rise as high as necessary to overcome the bandgap voltage of the laser diode $D_L$ and will generally be higher than the source voltage $V_S$.

At a discharge step 304, the bypass switch $M_{BP}$ and the laser diode switch MDL are maintained in an ON-state to drain charge stored at the source capacitor $C_S$, thereby reducing the current $i_{DL}$ through the parasitic inductance $L_{DL}$ to advantageously eliminate a high voltage spike at the anode of the laser diode $D_L$ when the laser diode switch MDL is transitioned to an OFF-state. At step 305, the bypass switch $M_{BP}$ and the laser diode switch MDL are transitioned to an OFF-state, thereby returning to the precharge state at step 301. Because the source voltage $V_S$ at the source capacitor $C_S$ is completely discharged at the end of the discharge step 304, there is very little current through the laser diode $D_L$. Thus, there is advantageously very little overshoot when the switches MDL, $M_{BP}$ are transitioned to the OFF-state at step 305, thereby preventing damage to the laser diode $D_L$ and the switches MDL, $M_{BP}$. The time interval of the overall pulse and bypass signals is selected, in some embodiments, such that the source capacitor $C_S$ is fully discharged before the switches $M_{DL}$, $M_{BP}$ are transitioned to the OFF-state at step 305.

Other topologies of pulsed laser drivers, having the same or similar advantages and having similar operation as that of the pulsed laser diode drivers 101-103, are disclosed below. The example topologies disclosed herein are not an exhaustive list of possible topologies that have the same or similar advantages and similar operation as that of the pulsed laser diode drivers 101-103. For example, one of skill in the art will appreciate that some modifications can be made while still adhering to the general principle of operation disclosed herein. Such modifications include placement of the bypass capacitor $C_{BP}$, component values, and the addition of serially connected components that provide a DC current path.

FIGS. 4A-D are simplified circuit schematics of pulsed laser diode drivers 401-404 of a second general topology that is configured to drive two or more laser diodes in a common anode arrangement, in accordance with some embodiments. The pulsed laser diode drivers 401-404 each generally include the source resistor $R_S$, the source capacitor $C_S$, the damping resistor $R_{Damp}$, the inductor $L_S$, the bypass capacitor $C_{BP}$, two or more laser diodes $D_L^1$-$D_L^n$, and the bypass switch $M_{BP}$. The pulsed laser diode drivers 401-402 each include two or more laser diode switches $M_{DL}^1$-$M_{DL}^n$, whereas the pulsed laser diode drivers 403-404 includes a single laser diode switch $M_{DL}^1$.

Also shown is the controller 120, nodes 410, 412, respective parasitic inductances $L_{DL}^1$-$L_{DL}^n$ of the laser diodes $D_L^1$-$D_L^n$, the DC input voltage $V_{in}$, the source voltage $V_S$ at the source capacitor $C_S$, the current $i_{LS}$ through the inductor $L_S$, respective currents $i_{DL}^1$-$i_{DL}^n$ through the laser diodes $D_L^1$-$D_L^n$, and the bypass switch gate driver signal $GATE_{BP}$. The pulsed laser diode drivers 401-402 each utilize respective laser diode switch gate driver signals $GATE_{DL}^1$-$GATE_{DL}^n$, whereas the pulsed laser diode drivers 403-404 use a single laser diode switch gate driver signal $GATE_{DL}^1$. Electrical connections of the pulsed laser diode drivers 401-404 are similar to, or the same as, those described with respect to the pulsed laser diode drivers 101-103. Topologies of the pulsed laser diode drivers 401-404 vary with respect to placement of the bypass capacitor $C_{BP}$.

Figure 4A:
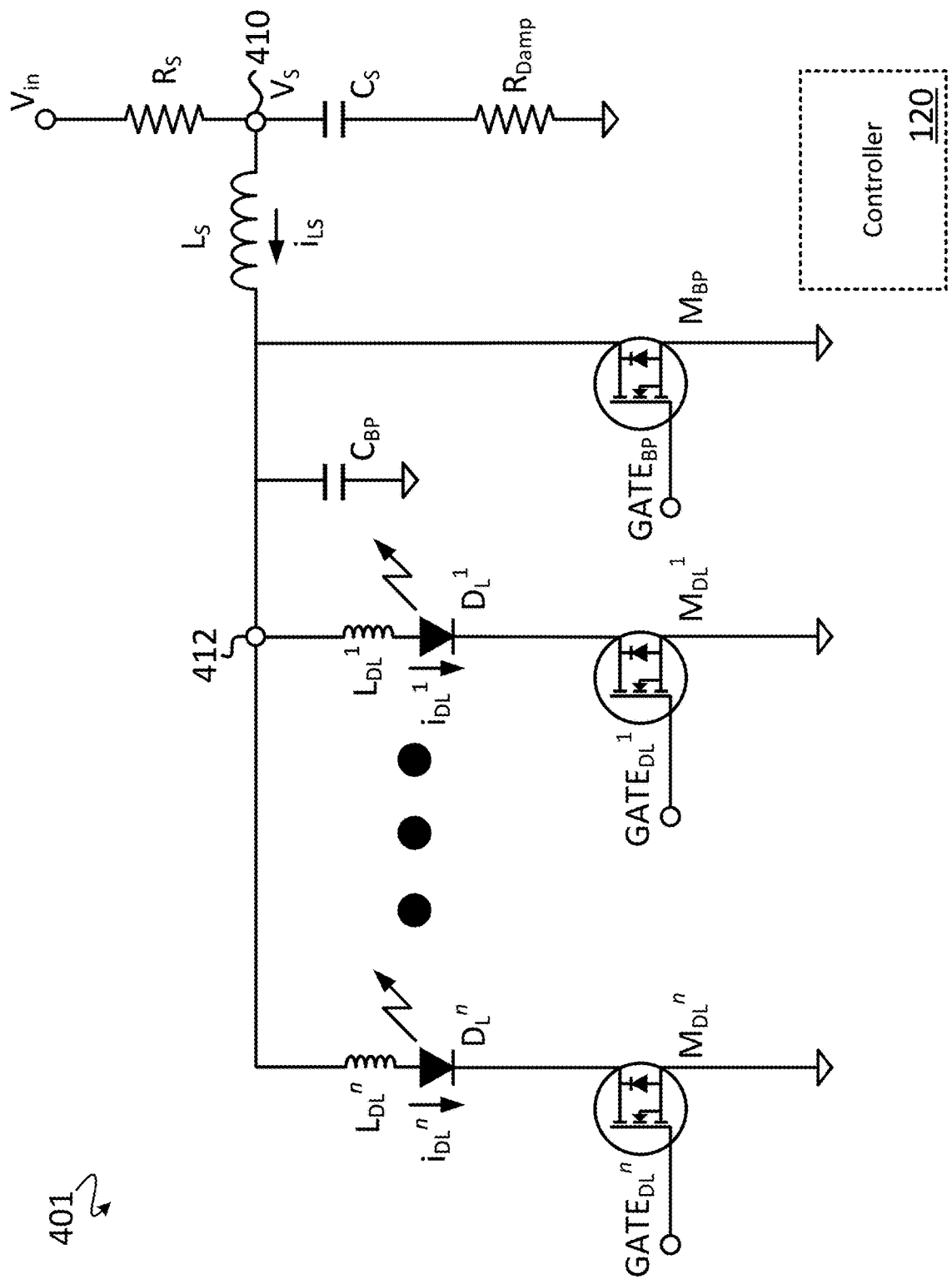
FIGS. 4A-D are simplified circuit schematics of pulsed laser diode drivers of a second general topology, in accordance with some embodiments.
Figure 4B:
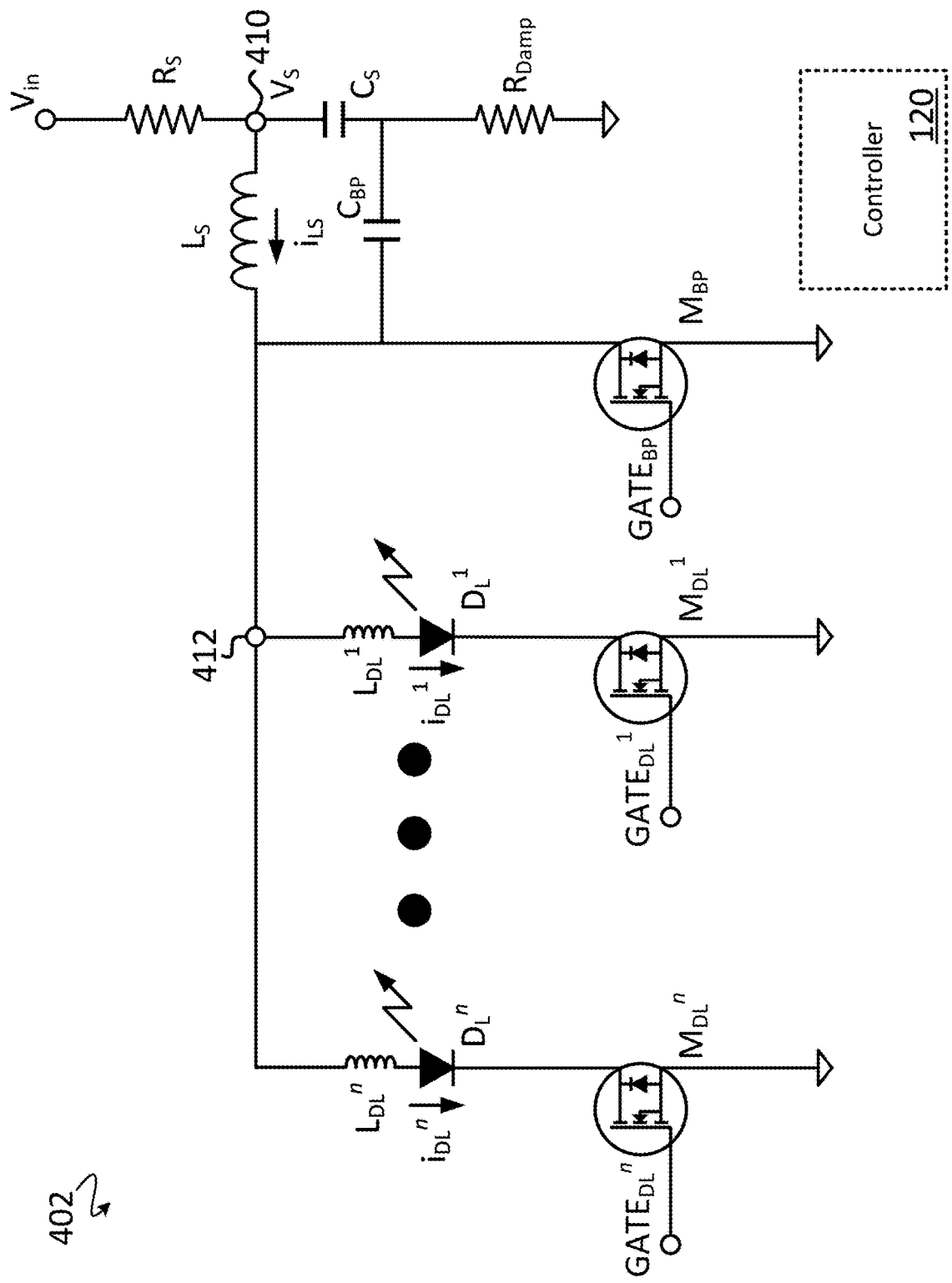
Figure 4C:
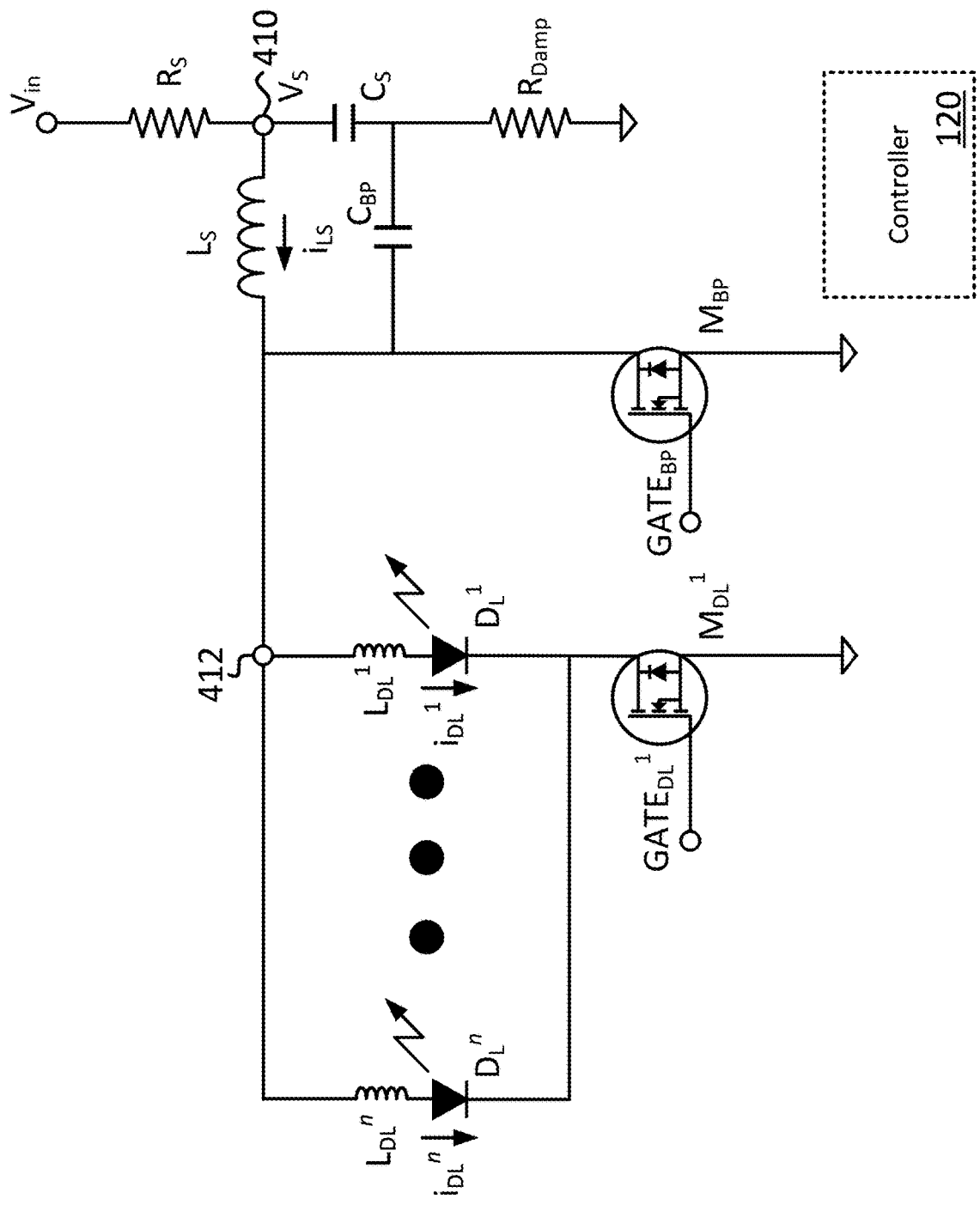
Figure 4D:
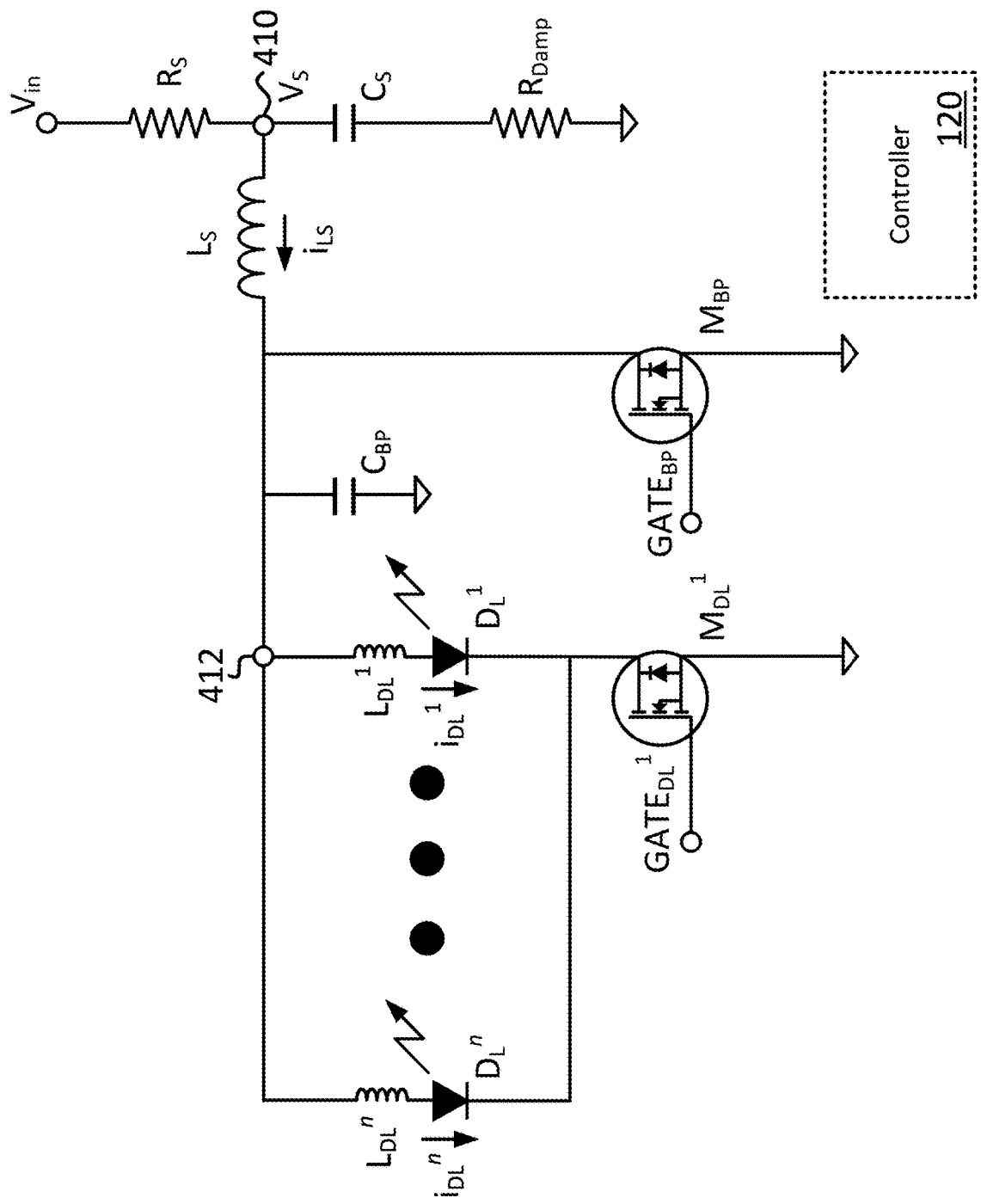

As shown in the simplified circuit schematics of the pulsed laser diode driver 401 of FIG. 4A and the pulsed laser diode driver 404 of FIG. 4D, in some embodiments the first terminal of the bypass capacitor $C_{BP}$ is directly electrically connected to the second terminal of the inductor $L_S$ and to the anodes of the laser diodes $D_L^1$-$D_L^n$. In such embodiments, the second terminal of the bypass capacitor $C_{BP}$ is directly electrically connected to the bias voltage node. As shown in the simplified circuit schematic of the pulsed laser diode drivers 402-403 of FIGS. 4B-C, in some embodiments the first terminal of the bypass capacitor $C_{BP}$ is directly electrically connected to the second terminal of the inductor $L_S$ and to the respective anodes of the laser diodes $D_L^1$-$D_L^n$. In such embodiments, the second terminal of the bypass capacitor $C_{BP}$ is directly electrically connected to the second terminal of the source capacitor $C_S$ and to the first terminal of the damping resistor $R_{Damp}$. In some embodiments, values of the DC input voltage $V_{in}$, inductance of the inductor $L_S$, capacitance of the source capacitor $C_S$, resistance of the damping resistor $R_{Damp}$, and capacitance of the bypass capacitor $C_{BP}$ are similar to, or the same as, those respective values as described with reference to the pulsed laser diode drivers 101-103. However, the values of the DC input voltage $V_{in}$, inductance of the inductor $L_S$, capacitance of the source capacitor $C_S$, resistance of the damping resistor $R_{Damp}$, and capacitance of the bypass capacitor $C_{BP}$ can advantageously be selected to achieve desired operation of the pulsed laser diode drivers 401-404 (e.g., a charge time, a pulse width, a pulse voltage, a pulse current level). Operation of the pulsed laser diode drivers 401-404 is similar to, or the same as, operation of the pulsed laser diode drivers 101-103 as explained in detail with respect to the simplified plots 201-206 of FIGS. 2A-D, as well as the example switching sequence 300 shown in FIG. 3.

In some embodiments, the controller 120 is configured to determine how many of the laser diodes $D_L^1$-$D_L^n$ are enabled simultaneously and to adjust a voltage level of the DC input voltage $V_{in}$ in accordance with that determination to supply a required amount of current (e.g., using a digitally adjustable voltage source (not shown) controlled by a digital control signal from the controller 120).

FIGS. 5A-D are simplified circuit schematics of pulsed laser diode drivers 501-504 of a third general topology that is configured to drive a laser diode using a high-side switch, in accordance with some embodiments. The pulsed laser diode drivers 501-504 each generally include the source resistor $R_S$, the source capacitor $C_S$, the damping resistor $R_{Damp}$, the inductor $L_S$, the bypass capacitor $C_{BP}$, the laser diode $D_L$, the bypass switch $M_{BP}$, and the laser diode switch $M_{DL}$. The laser diode switch $M_{DL}$ is configured as a high-side switch.

Also shown is the controller 120, nodes 510, 512, the parasitic inductance $L_{DL}$ of the laser diode $D_L$, the DC input voltage $V_{in}$, the source voltage $V_S$ at the source capacitor $C_S$, the current $i_{LS}$ through the inductor $L_S$, the current $i_{DL}$ through the laser diode $D_L$, the bypass switch gate driver signal $GATE_{BP}$, and the laser diode switch gate driver signal $GATE_{DL}$. Most of the electrical connections of the pulsed laser diode drivers 501-504 are similar to, or the same as, those described with respect to the pulsed laser diode drivers 101-103. However, in contrast to the low-side configuration of the pulsed laser diode drivers 101-103, the drain node of the laser diode switch $M_{DL}$ is directly electrically connected to the second terminal of the inductor $L_S$ and to the drain node of the bypass switch $M_{BP}$. The source node of the laser diode switch $M_{DL}$ is directly electrically connected to the anode of the laser diode $D_L$, and the cathode of the laser diode $D_L$ is directly electrically connected to the bias voltage node. Topologies of the pulsed laser diode drivers 501-504 vary with respect to placement of the bypass capacitor $C_{BP}$.

Figure 5A:
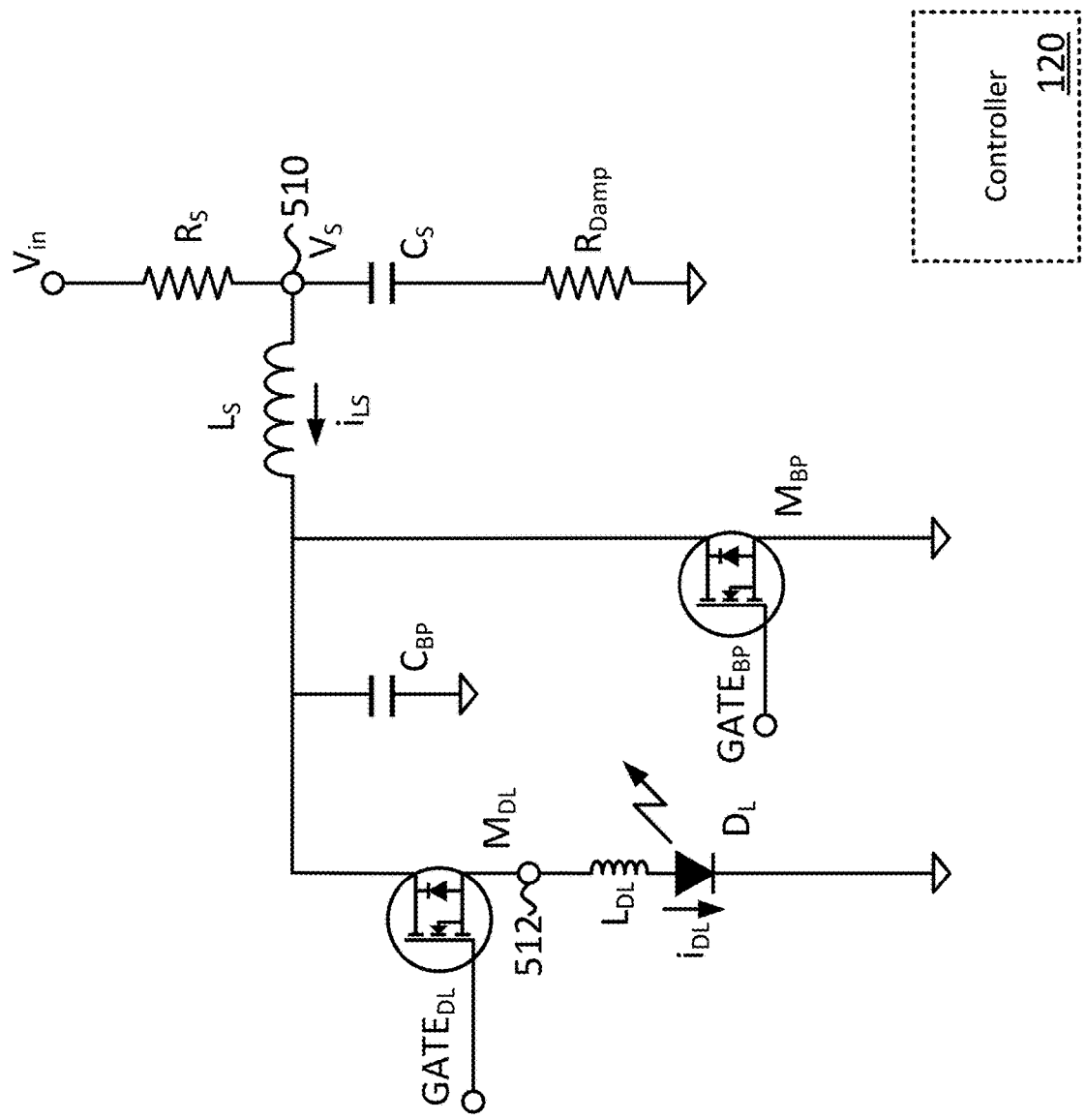
Figure 5B:
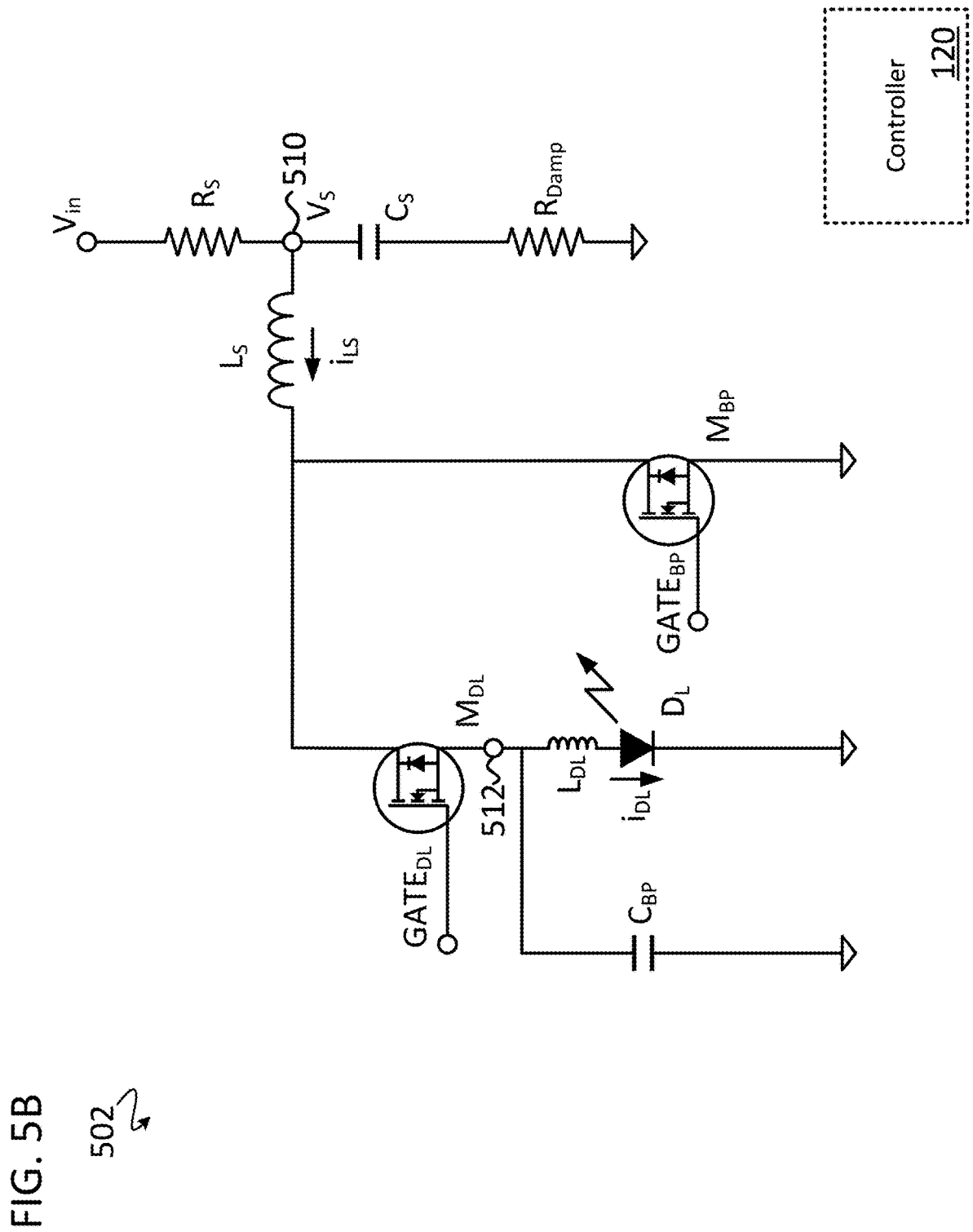
Figure 5C:
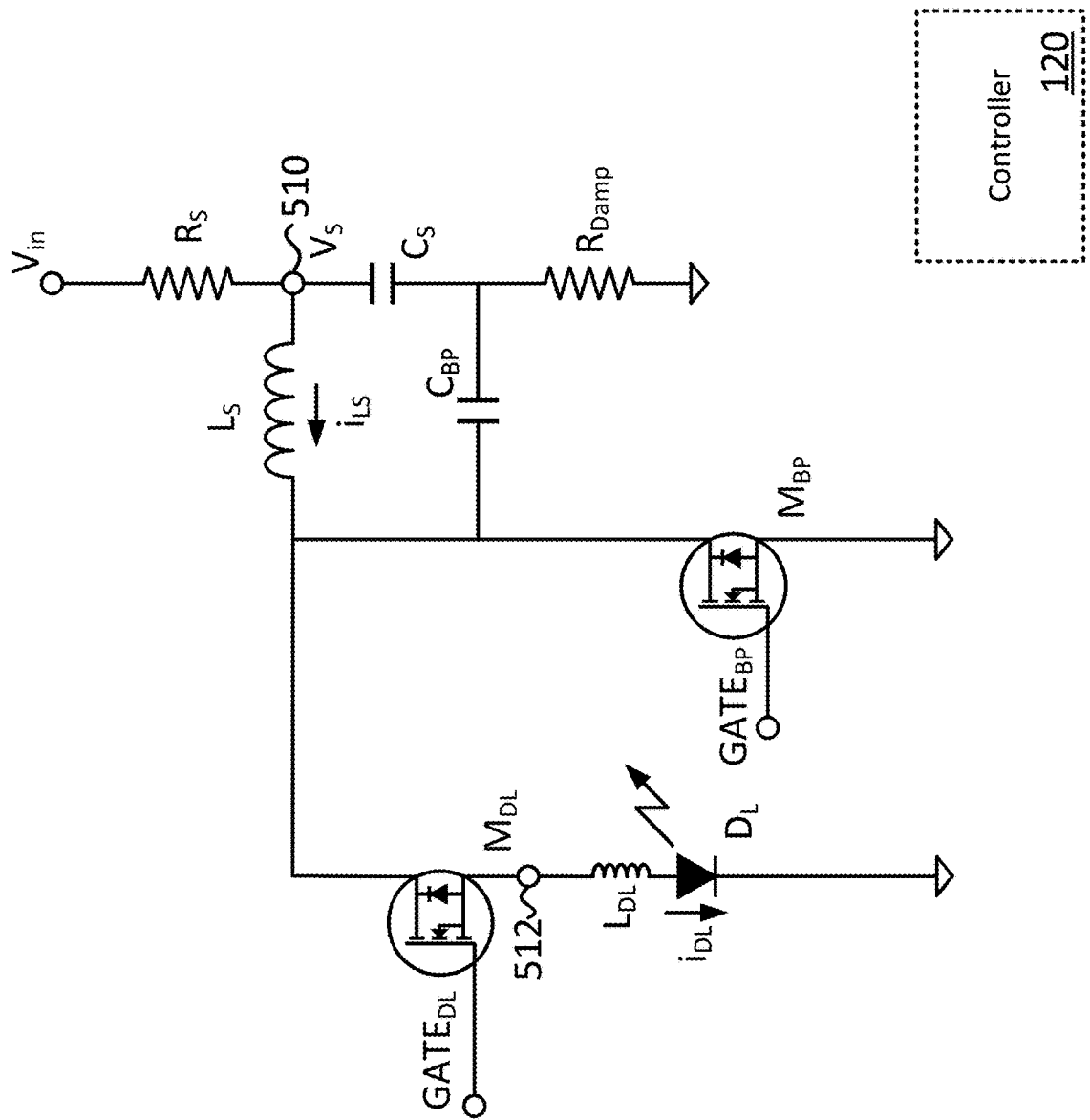

As shown in the simplified circuit schematic of the pulsed laser diode driver 501 of FIG. 5A, in some embodiments the first terminal of the bypass capacitor $C_{BP}$ is directly electrically connected to the second terminal of the inductor $L_S$ and to the drain node of the laser diode switch $M_{DL}$. In such embodiments, the second terminal of the bypass capacitor $C_{BP}$ is directly electrically connected to the bias voltage node. As shown in the simplified circuit schematic of the pulsed laser diode driver 502 of FIG. 5B, in some embodiments the first terminal of the bypass capacitor $C_{BP}$ is directly electrically connected to the source node of the laser diode switch $M_{DL}$ and to the anode of the laser diode $D_L$. In such embodiments, the second terminal of the bypass capacitor $C_{BP}$ is directly electrically connected to the bias voltage node. As shown in the simplified circuit schematic of the pulsed laser diode driver 503 of FIG. 5C, in some embodiments the first terminal of the bypass capacitor $C_{BP}$ is directly electrically connected to the second terminal of the inductor $L_S$, to the drain node of the bypass switch $M_{BP}$, and to the drain node of the laser diode switch $M_{DL}$. In such embodiments, the second terminal of the bypass capacitor $C_{BP}$ is directly electrically connected to the second terminal of the source capacitor $C_S$ and to the first terminal of the damping resistor $R_{Damp}$. As shown in the simplified circuit schematic of the pulsed laser diode driver 504 of FIG. 5D, in some embodiments the first terminal of the bypass capacitor $C_{BP}$ is directly electrically connected to the source node of the laser diode switch $M_{DL}$ and the anode of the laser diode $D_L$. In such embodiments, the second terminal of the bypass capacitor $C_{BP}$ is directly electrically connected to the second terminal of the source capacitor $C_S$ and to the first terminal of the damping resistor $R_{Damp}$.

FIGS. 6A-D are simplified circuit schematics of pulsed laser diode drivers 601-604 of a fourth general topology that is configured to drive two or more laser diodes in a common cathode configuration using a high-side switch, in accordance with some embodiments. The pulsed laser diode drivers 601-604 each generally include the source resistor $R_S$, the source capacitor $C_S$, the damping resistor $R_{Damp}$, the inductor $L_S$, the bypass capacitor $C_{BP}$, the bypass switch $M_{BP}$, two or more laser diodes $D_L^1$-$D_L^n$, and two or more respective laser diode switches $M_{DL}^1$-$M_{DL}^n$.

Also shown is the controller 120, nodes 610, 612, 614, respective parasitic inductances $L_{DL}^1$-$L_{DL}^n$ of the laser diodes $D_L^1$-$D_L^n$, the DC input voltage $V_{in}$, the source voltage $V_S$ at the source capacitor $C_S$, the current $i_{LS}$ through the inductor $L_S$, respective currents $i_{DL}^1$-$i_{DL}^n$ through the laser diodes $D_L^1$-$D_L^n$, the bypass switch gate driver signal $GATE_{BP}$, and respective laser diode switch gate driver signals $GATE_{DL}^1$-$GATE_{DL}^n$ of the laser diode switches $M_{DL}^1$-$M_{DL}^n$.

Most of the electrical connections of the pulsed laser diode drivers 601-604 are similar to, or are the same as, those described with respect to the pulsed laser diode drivers 501-504. However, topologies of the pulsed laser diode drivers 601-604 vary from one another with respect to placement of the bypass capacitor $C_{BP}$.

Figure 6A:
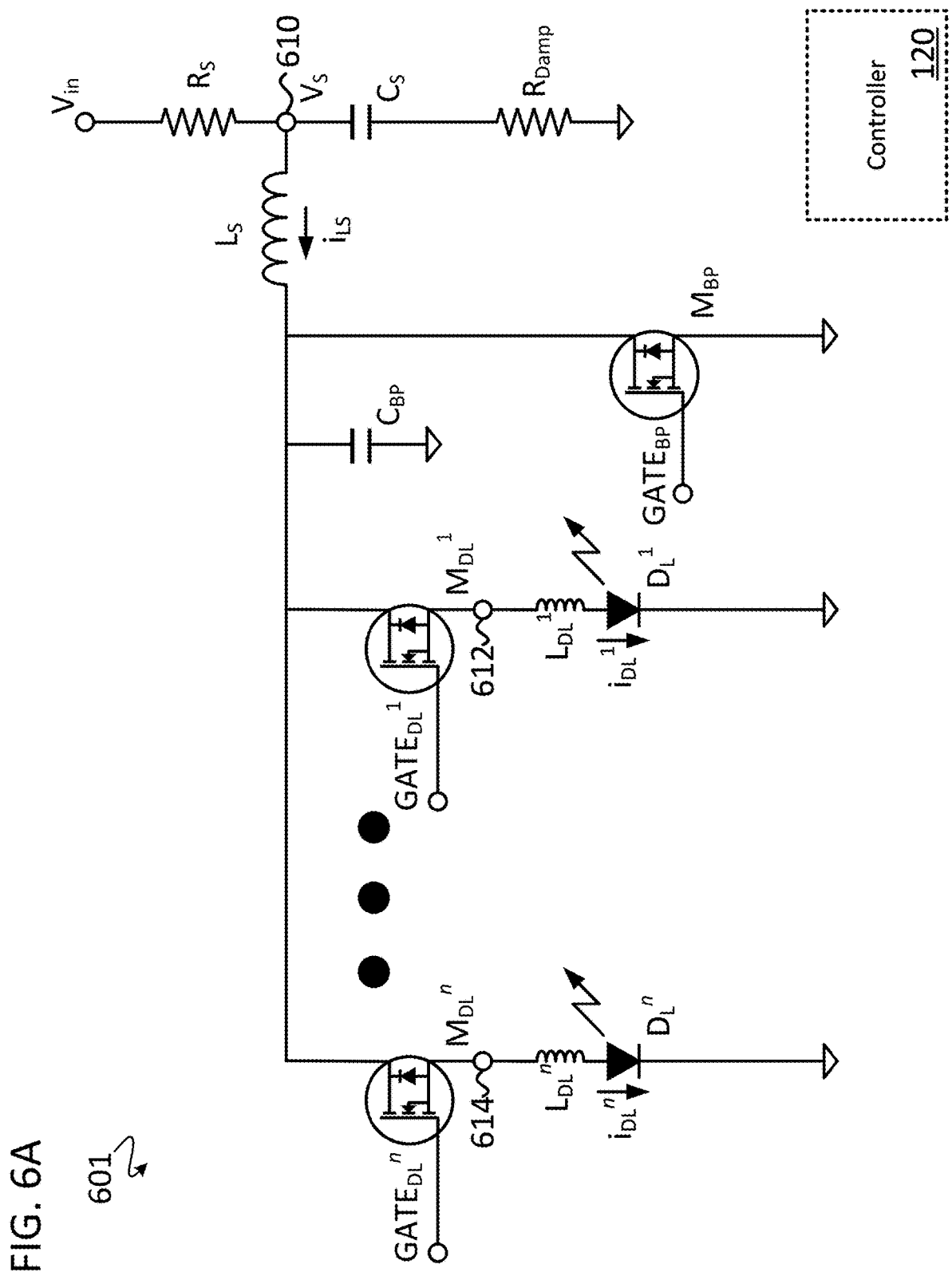
FIGS. 6A-D are simplified circuit schematics of pulsed laser diode drivers of a fourth general topology, in accordance with some embodiments.
Figure 6B:
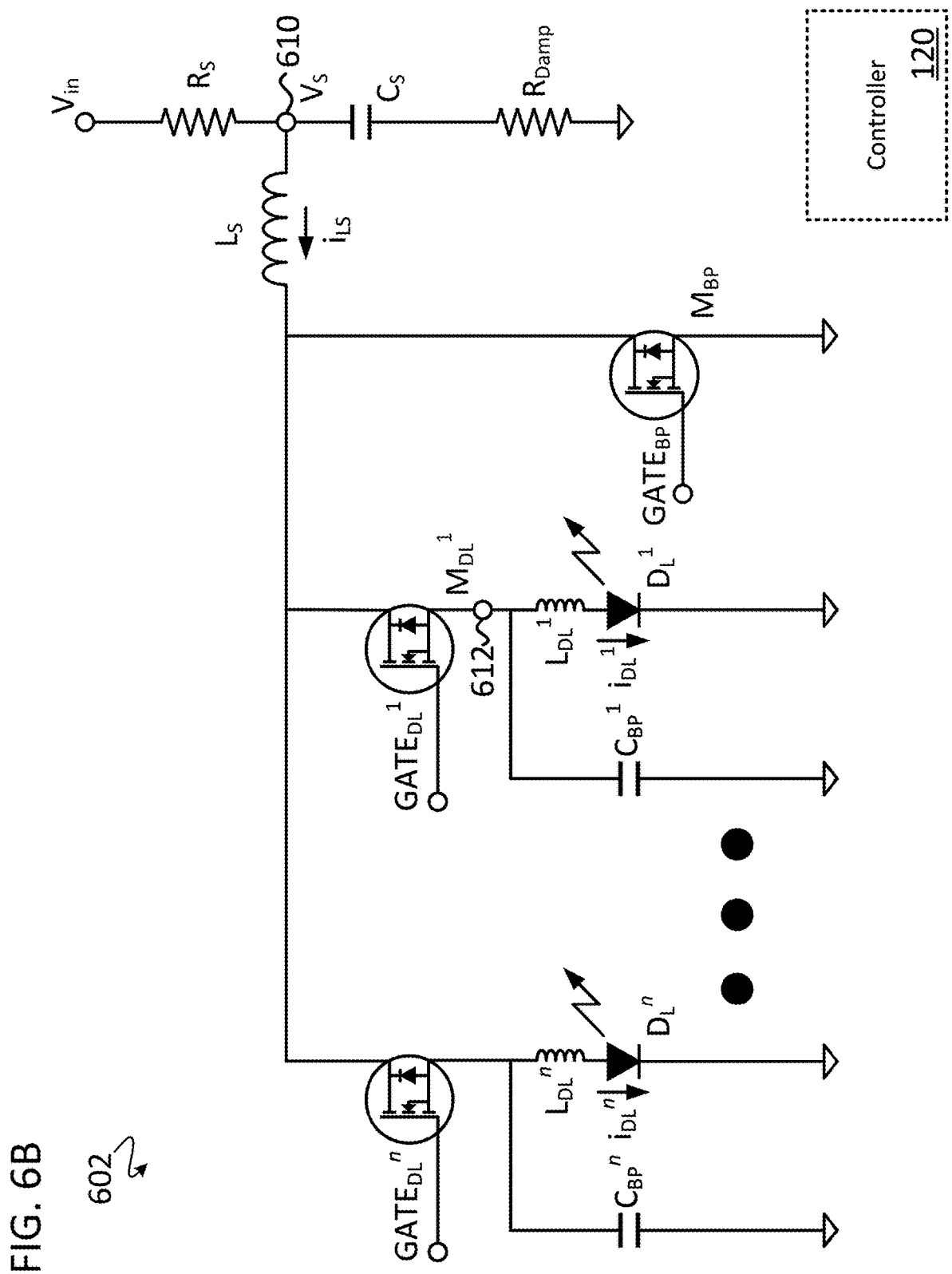
Figure 6C:
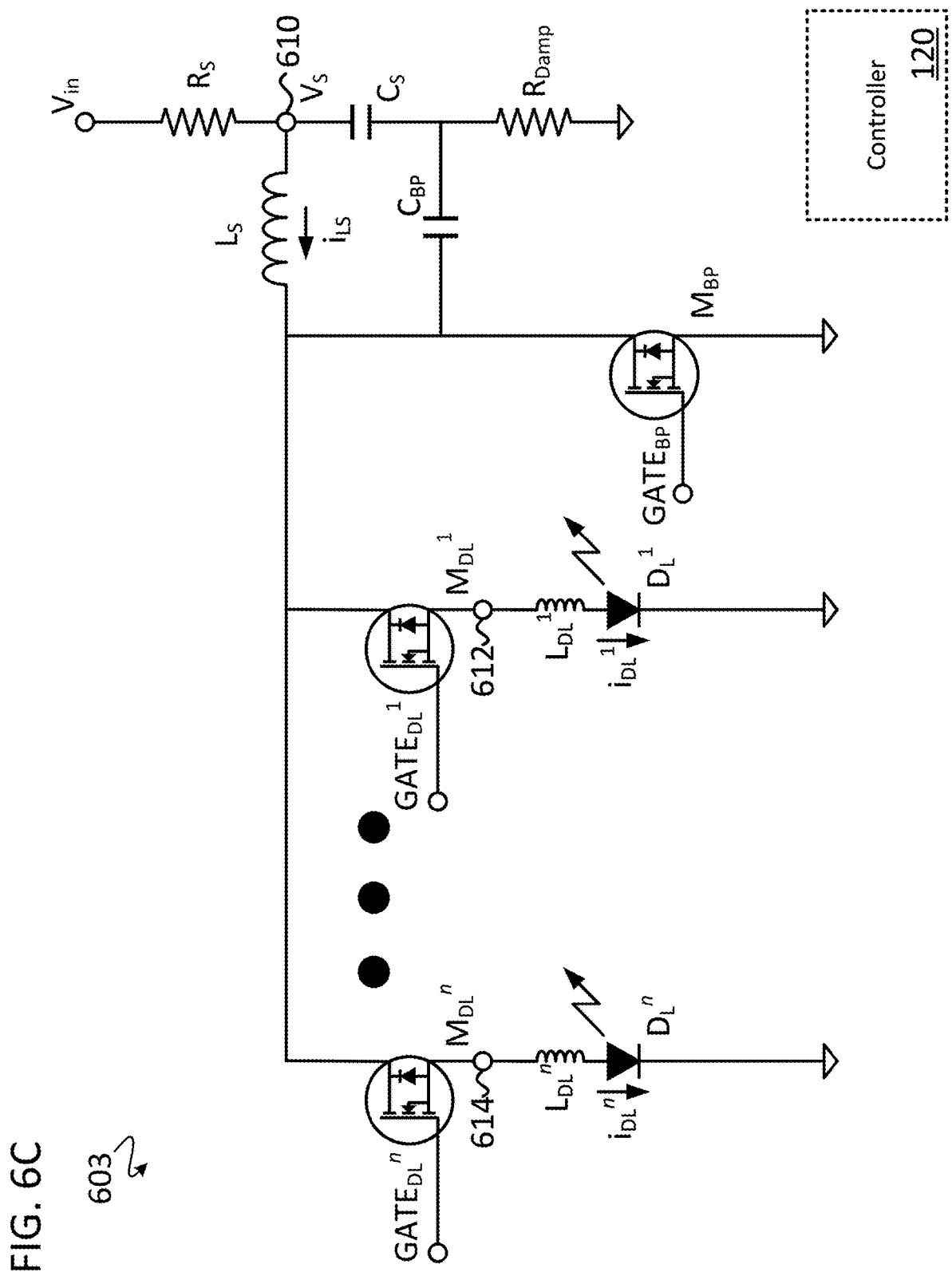
Figure 6D:
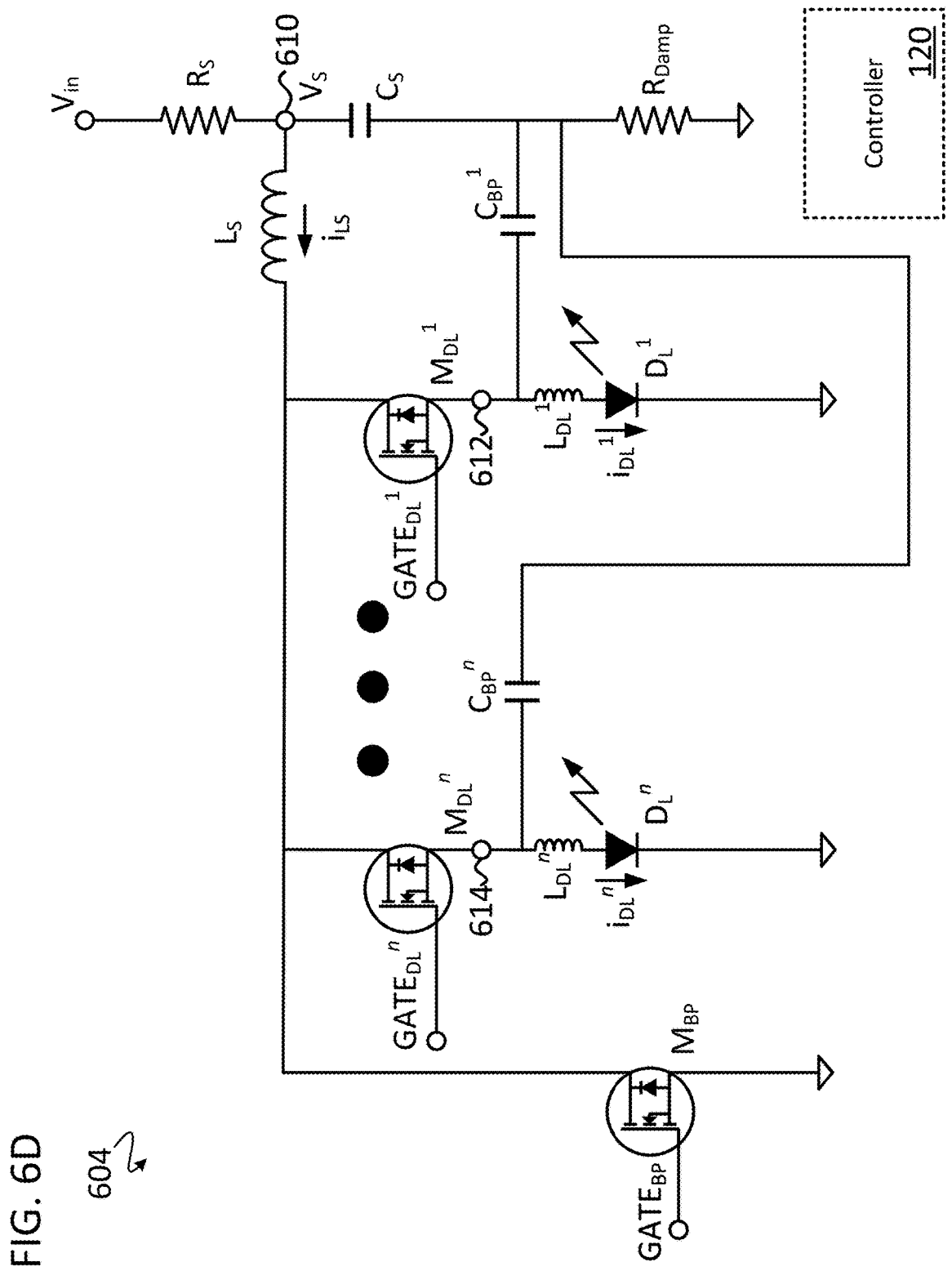

As shown in the simplified circuit schematic of the pulsed laser diode driver 601 of FIG. 6A, in some embodiments the first terminal of the bypass capacitor $C_{BP}$ is directly electrically connected to the second terminal of the inductor $L_S$ and to respective drain nodes of the laser diode switches $M_{DL}^1$-$M_{DL}^n$ and the bypass switch $M_{BP}$. In such embodiments, the second terminal of the bypass capacitor $C_{BP}$ is directly electrically connected to the bias voltage node. As shown in the simplified circuit schematic of the pulsed laser diode driver 602 of FIG. 6B, in some embodiments the respective first terminal of the bypass capacitors $C_{BP}^1$ through $C_{BP}^n$ is directly electrically connected to the respective source node of any of the laser diode switches $M_{DL}^1$ through $M_{DL}^n$ and to the respective anode of the laser diode coupled to that laser diode switch. In such embodiments, the second terminal of the bypass capacitors $C_{BP}^1$ through $C_{BP}^n$ is directly electrically connected to the bias voltage node. As shown in the simplified circuit schematic of the pulsed laser diode driver 603 of FIG. 6C, in some embodiments the first terminal of the bypass capacitor $C_{BP}$ is directly electrically connected to the second terminal of the inductor $L_S$ and to respective drain nodes of the laser diode switches $M_{DL}^1$-$M_{DL}^n$ and the bypass switch $M_{BP}$. In such embodiments, the second terminal of the bypass capacitor $C_{BP}$ is directly electrically connected to the second terminal of the source capacitor $C_S$ and to the first terminal of the damping resistor $R_{Damp}$. As shown in the simplified circuit schematic of the pulsed laser diode driver 604 of FIG. 6D, in some embodiments the respective first terminal of the bypass capacitors $C_{BP}^1$ through $C_{BP}^n$ is directly electrically connected to the respective source node of the laser diode switches $M_{DL}^1$ through $M_{DL}^n$ and to the anode of the laser diode coupled to that laser diode switch. In such embodiments, the second terminal of the bypass capacitor $C_{BP}$ is directly electrically connected to the second terminal of the source capacitor $C_S$ and to the first terminal of the damping resistor $R_{Damp}$.

In some embodiments, the controller 120 is operable to determine how many of the laser diodes $D_L^1$-$D_L^n$ are enabled simultaneously and to adjust a voltage level of the DC input voltage $V_{in}$ in accordance with that determination to supply a required amount of current (e.g., using a digitally adjustable voltage source (not shown) controlled by a digital control signal from the controller 120).

FIGS. 7A-E are simplified circuit schematics of pulsed laser diode drivers 701-705 of a fifth general topology that is configured to drive a laser diode using a half-bridge configuration, in accordance with some embodiments. The pulsed laser diode drivers 701-704 each generally include the source resistor $R_S$, the source capacitor $C_S$, the damping resistor $R_{Damp}$, the inductor $L_S$, the bypass capacitor $C_{BP}$, the bypass switch $M_{BP}$, the laser diode $D_L$, and the laser diode switch $M_{DL}$. The pulsed laser diode driver 705 additionally includes two or more laser diodes $D_L^1$-$D_L^n$, rather than the single laser diode $D_L$, each of the two or more laser diodes $D_L^1$-$D_L^n$ having a respective parasitic inductance $L_{DL}^1$-$L_{DL}^n$, and respective current representation $i_{DL}^1$-$i_{DL}^n$. However, the pulsed laser diode driver 705 lacks independent control of the two or more laser diodes $D_L^1$-$D_L^n$.

Also shown is the controller 120, nodes 710, 712, the parasitic inductance $L_{DL}$ of the laser diode $D_L$, the DC input voltage $V_{in}$, the source voltage $V_S$ at the source capacitor $C_S$, the current $i_{LS}$ through the inductor $L_S$, the current $i_{DL}$ through the laser diode $D_L$, the currents $i_{DL}^1$-$i_{DL}^n$ through the two or more laser diodes $D_L^1$-$D_L^n$, the bypass switch gate driver signal $GATE_{BP}$, and the laser diode switch gate driver signal $GATE_{DL}$ of the laser diode switch $M_{DL}$.

Most of the electrical connections of the pulsed laser diode drivers 701-704 are similar to, or the same as those described with respect to the pulsed laser diode drivers 501-503. However, in contrast to the high-side configuration of the pulsed laser diode drivers 501-503, the drain node of the bypass switch $M_{BP}$ is directly electrically connected to the source node of the laser diode switch $M_{DL}$ and to the anode of the laser diode $D_L$. The source node of the bypass switch $M_{BP}$ is directly electrically connected to the bias voltage node. Thus, as shown in the simplified circuit schematics of the pulsed laser diode drivers 701-704, the laser diode $D_L$ may be driven by the half-bridge configuration of the bypass switch $M_{BP}$ and the laser diode switch $M_{DL}$. Topologies of the pulsed laser diode drivers 701-704 vary with respect to placement of the bypass capacitor $C_{BP}$.

Figure 7A:
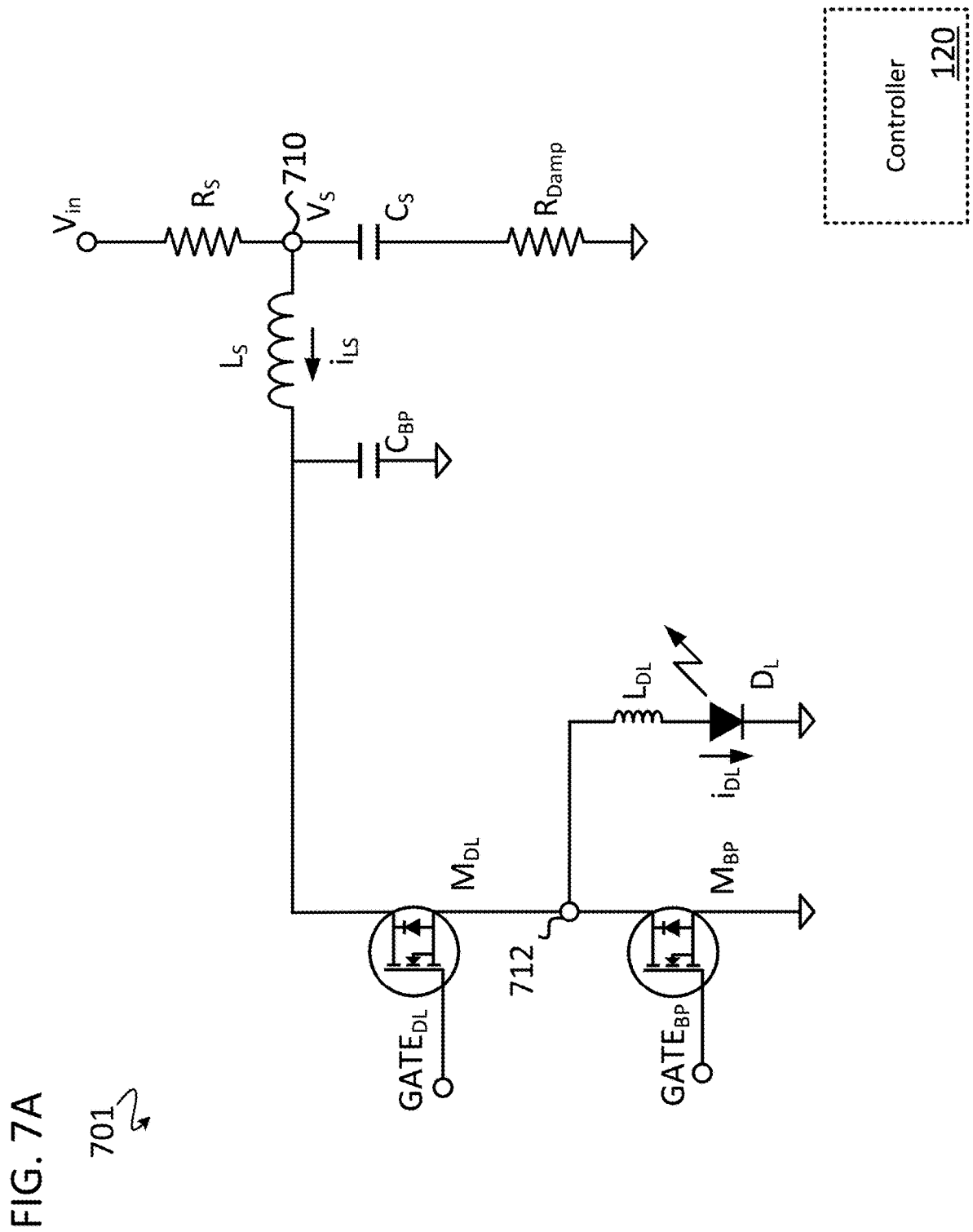
FIGS. 7A-E are simplified circuit schematics of pulsed laser diode drivers of a fifth general topology, in accordance with some embodiments.
Figure 7B:
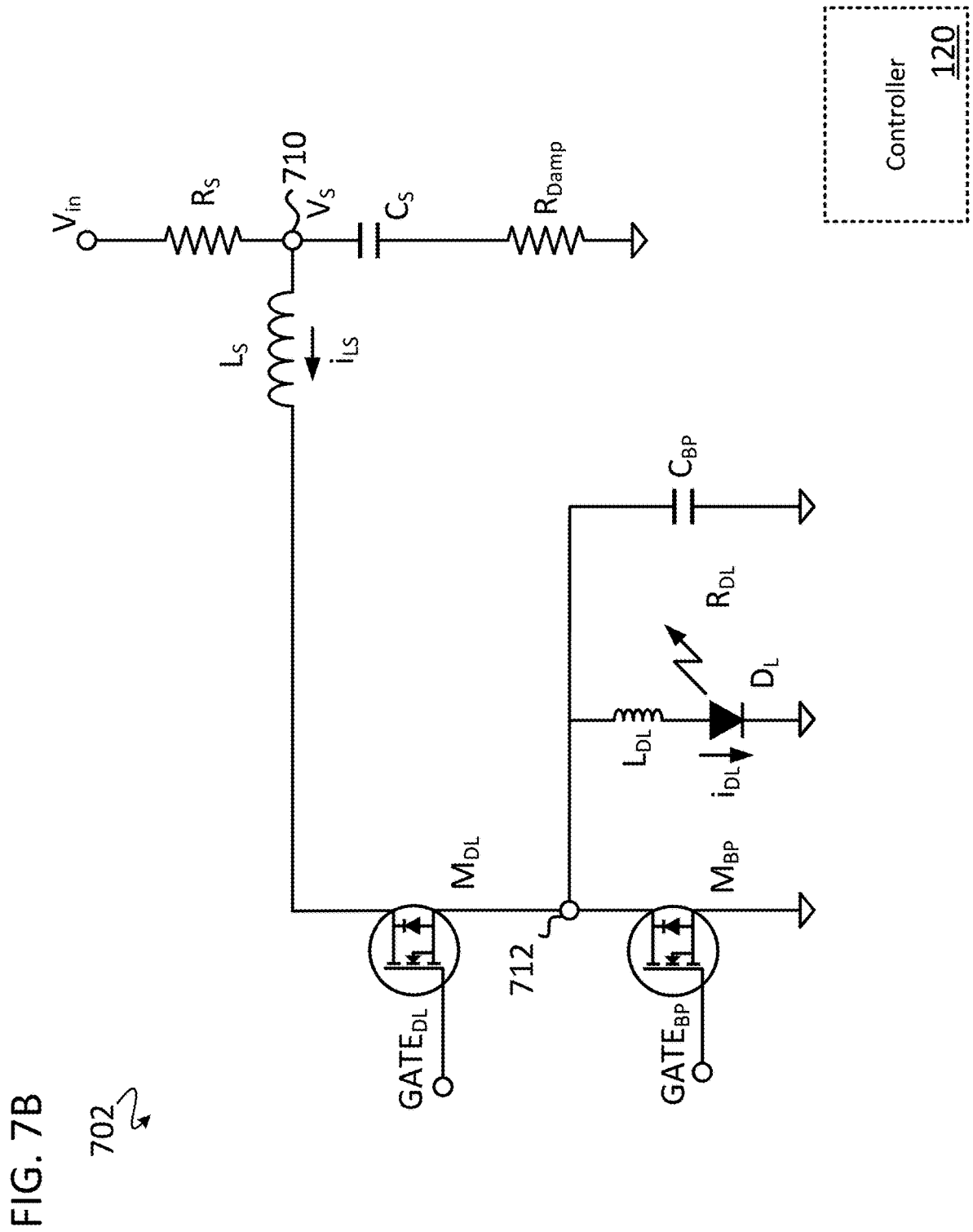
Figure 7C:
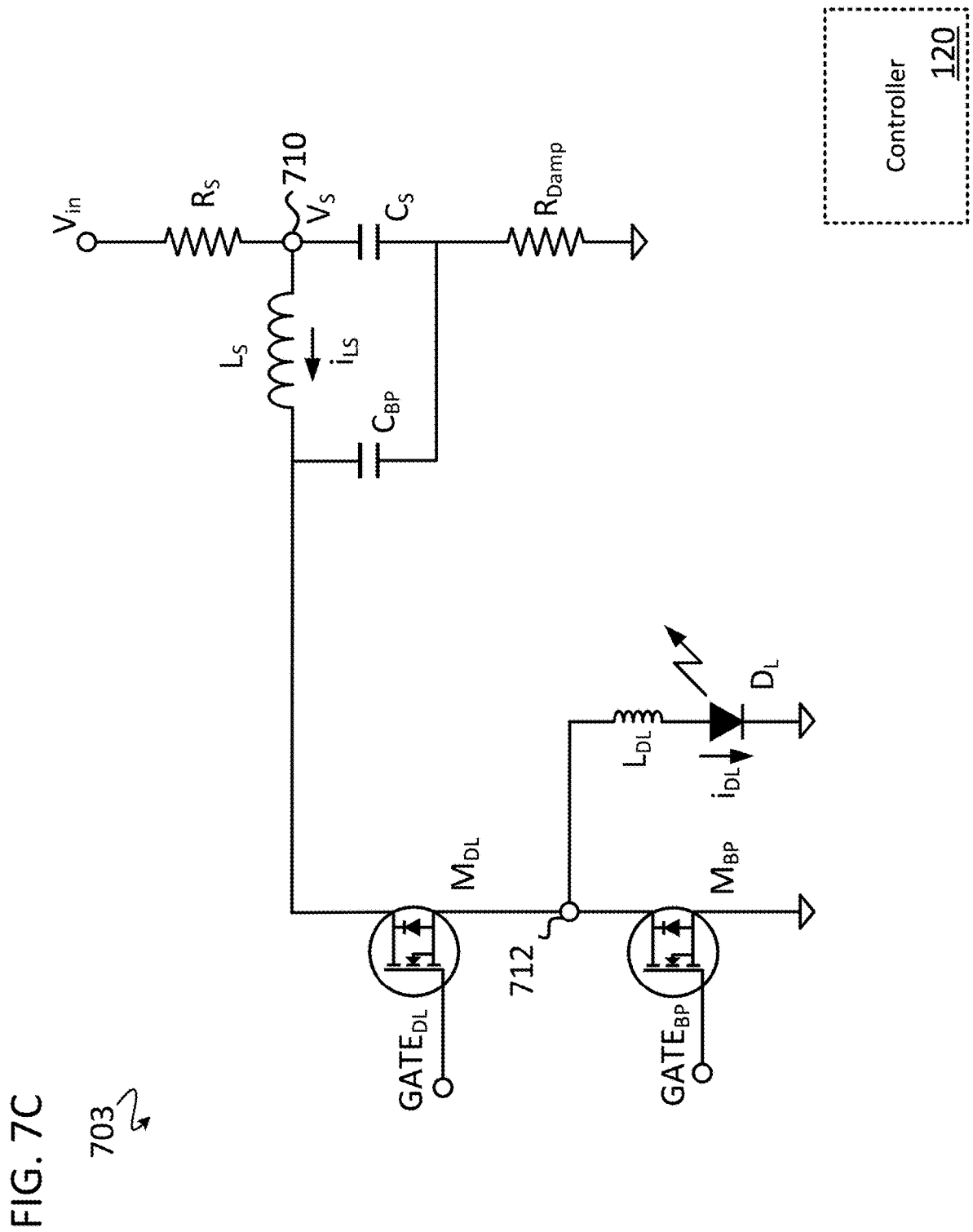
Figure 7D:
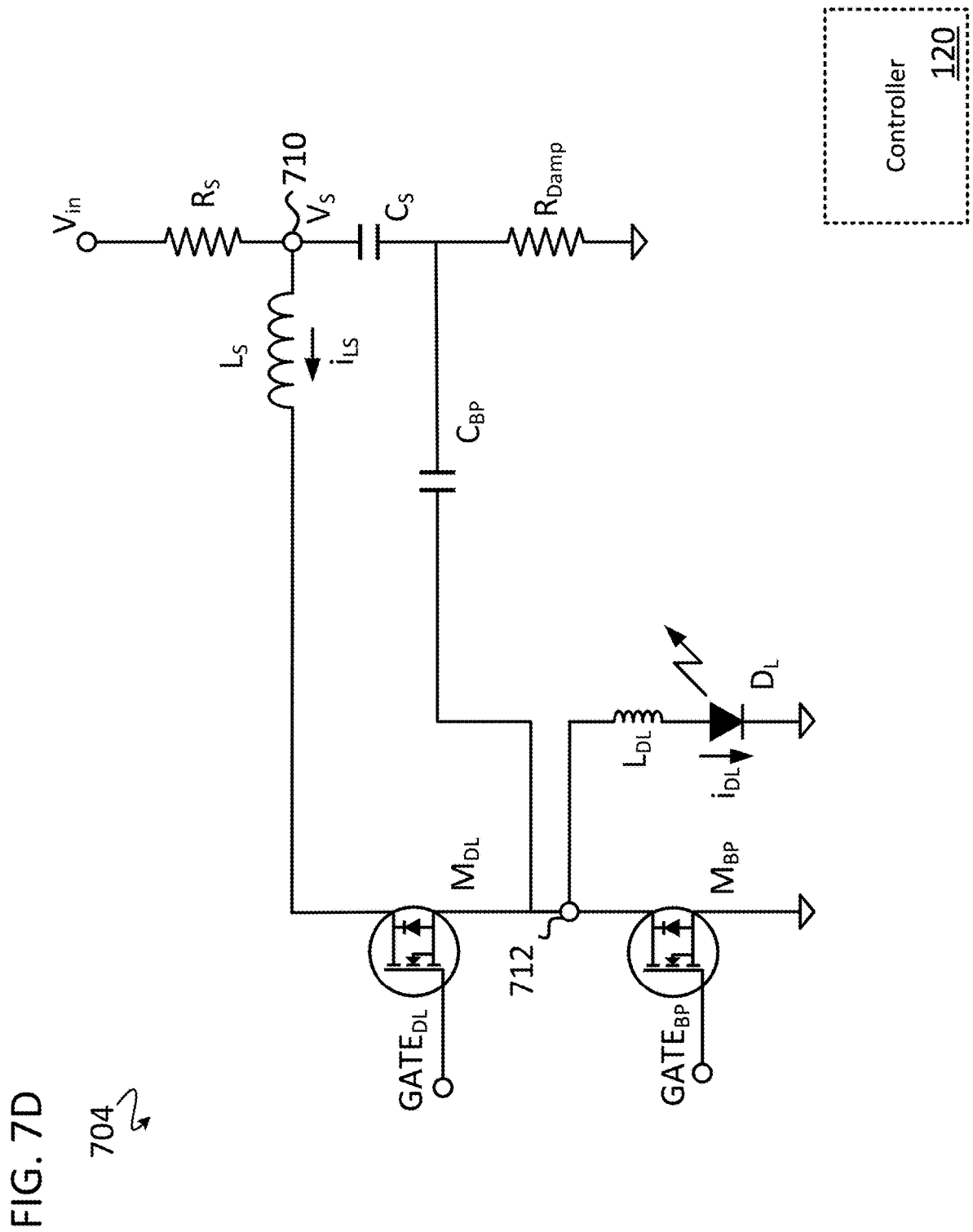

As shown in the simplified circuit schematic of the pulsed laser diode driver 701 of FIG. 7A, in some embodiments the first terminal of the bypass capacitor $C_{BP}$ is directly electrically connected to the second terminal of the inductor $L_S$ and to the drain node of the laser diode switch $M_{DL}$. In such embodiments, the second terminal of the bypass capacitor $C_{BP}$ is electrically connected to the bias voltage node. As shown in the simplified circuit schematic of the pulsed laser diode driver 702 of FIG. 7B, in some embodiments the first terminal of the bypass capacitor $C_{BP}$ is directly electrically connected to the source node of the laser diode switch $M_{DL}$, to the drain node of the bypass switch $M_{BP}$, and to the anode of the laser diode $D_L$. In such embodiments, the second terminal of the bypass capacitor $C_{BP}$ is directly electrically connected to the bias voltage node. As shown in the simplified circuit schematic of the pulsed laser diode driver 703 of FIG. 7C, in some embodiments the first terminal of the bypass capacitor $C_{BP}$ is directly electrically connected to the second terminal of the inductor $L_S$ and to the drain node of the laser diode switch $M_{DL}$. In such embodiments, the second terminal of the bypass capacitor $C_{BP}$ is directly electrically connected to the second terminal of the source capacitor $C_S$ and to the first terminal of the damping resistor $R_{Damp}$. As shown in the simplified circuit schematic of the pulsed laser diode driver 704 of FIG. 7D, in some embodiments the first terminal of the bypass capacitor $C_{BP}$ is directly electrically connected to the source node of the laser diode switch $M_{DL}$, the drain node of the bypass switch $M_{BP}$, and the anode of the laser diode $D_L$. In such embodiments, the second terminal of the bypass capacitor $C_{BP}$ is directly electrically connected to the second terminal of the source capacitor $C_S$ and to the first terminal of the damping resistor $R_{Damp}$.

Figure 7E:
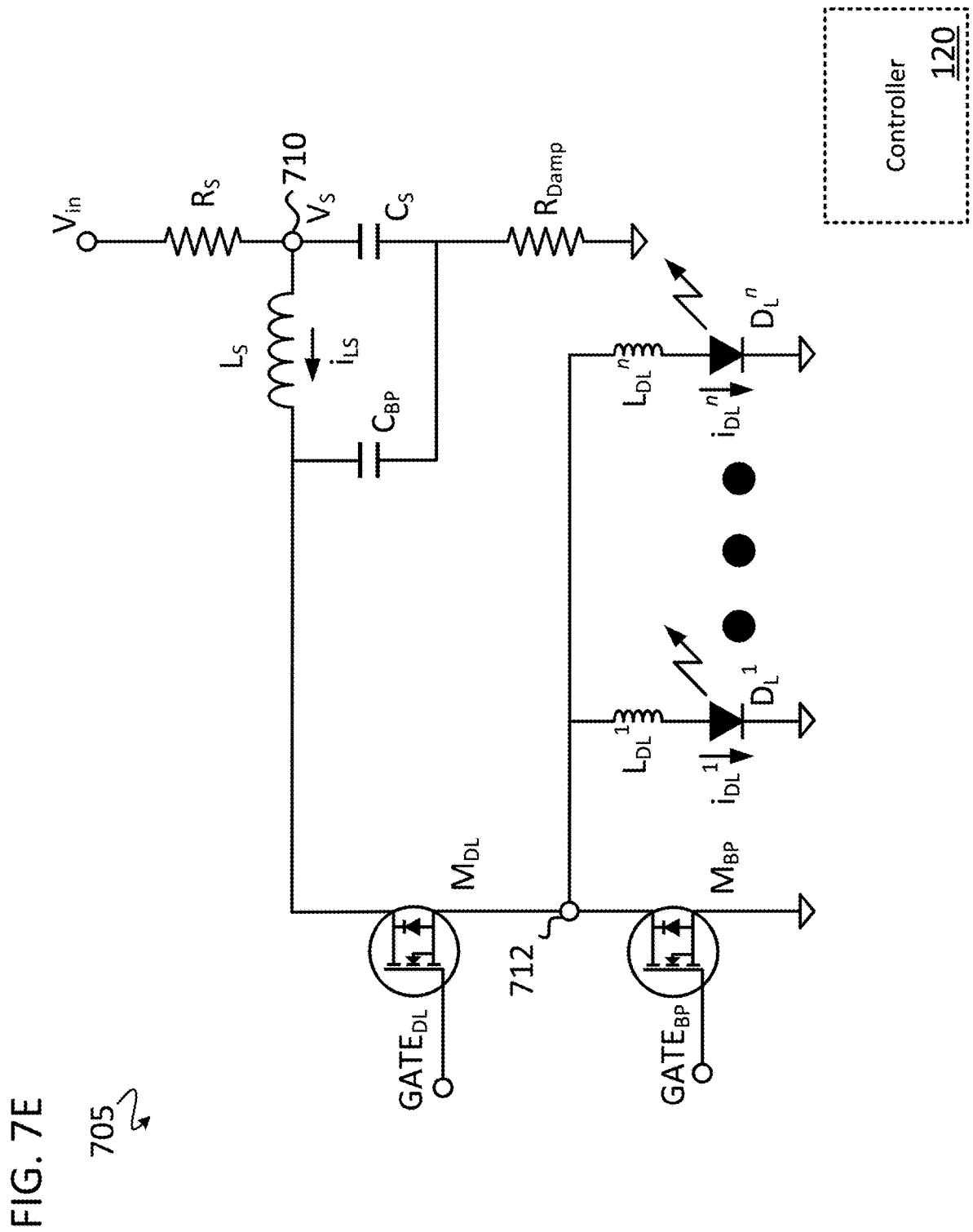

As shown in the simplified circuit schematic of the pulsed laser diode driver 705 of FIG. 7E, two or more laser diodes $D_L^1$-$D_L^n$ may be driven simultaneously by the half-bridge configuration of the bypass switch $M_{BP}$ and the laser diode switch $M_{DL}$. In the example shown, the first terminal of the bypass capacitor $C_{BP}$ is directly electrically connected to the second terminal of the inductor $L_S$ and the second terminal of the bypass capacitor $C_{BP}$ is directly electrically connected to the second terminal of the source capacitor $C_S$ and to the first terminal of the damping resistor $R_{Damp}$. However, other configurations of the bypass capacitor $C_{BP}$, such as those described with reference to FIGS. 7A-D may be used.

Figure 8A:
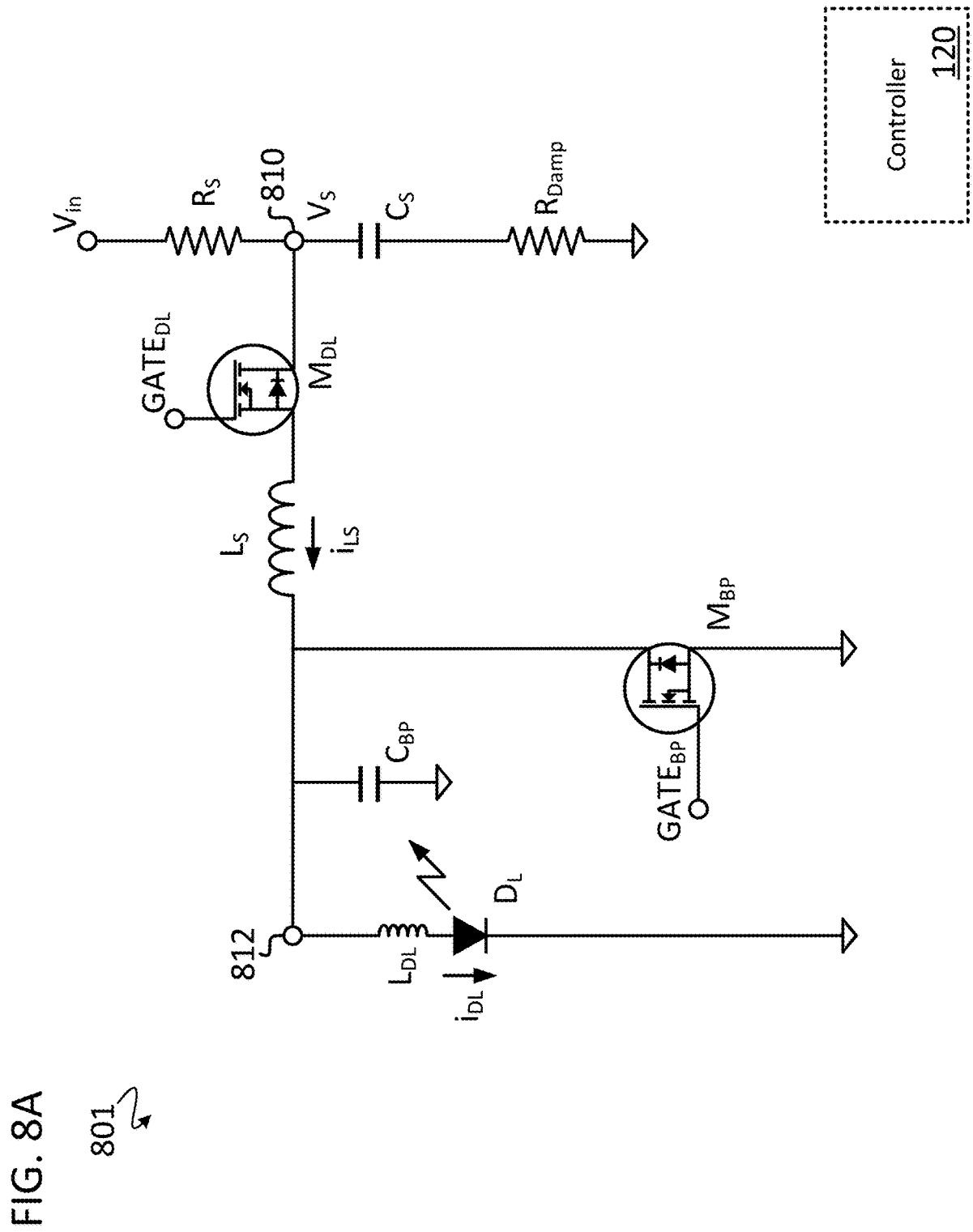
FIGS. 8A-B are simplified circuit schematics of pulsed laser diode drivers of a sixth general topology, in accordance with some embodiments.
Figure 8B:
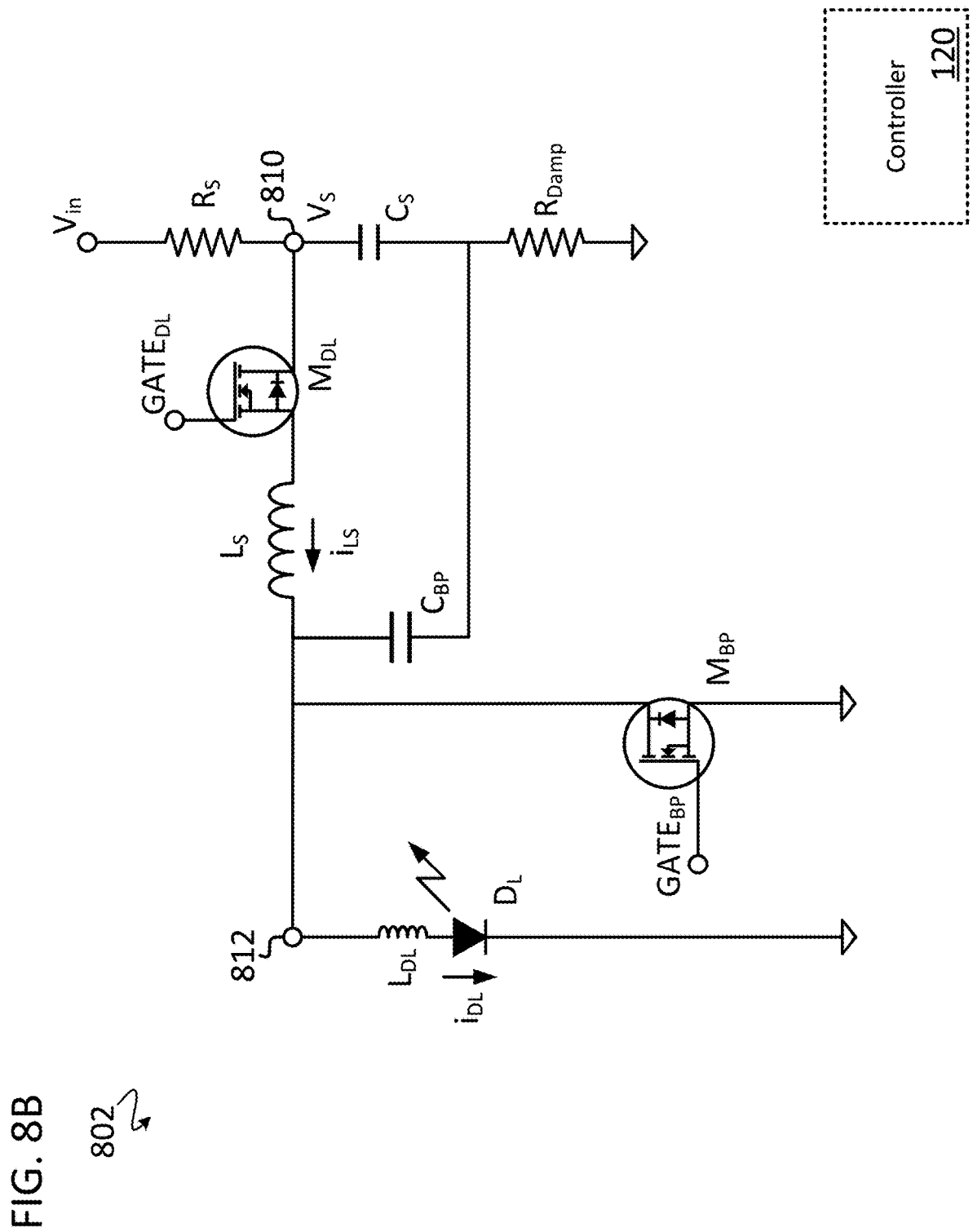

FIGS. 8A-B are simplified circuit schematics of pulsed laser diode drivers 801-802 of a sixth general topology that is configured to drive a laser diode using a high-side switch, in accordance with some embodiments. The pulsed laser diode drivers 801-802 generally include the source resistor $R_S$, the source capacitor $C_S$, the damping resistor $R_{Damp}$, the inductor $L_S$, the bypass capacitor $C_{BP}$, the laser diode $D_L$, the bypass switch $M_{BP}$, and the laser diode switch $M_{DL}$. Also shown is the controller 120, nodes 810, 812, the respective parasitic inductances $L_{DL}$ of the laser diode $D_L$, the DC input voltage $V_{in}$, the source voltage $V_S$ at the source capacitor $C_S$, the current $i_{LS}$ through the inductor $L_S$, the current $i_{DL}$ through the laser diodes $D_L$, the bypass switch gate driver signal $GATE_{BP}$, and the laser diode switch gate driver signal $GATE_{DL}$. Electrical connections of the pulsed laser diode driver 801 are similar to, or the same as those described with respect to the pulsed laser diode driver 101. The pulsed laser diode drivers 801-802 differ in that the drain node of the laser diode switch $M_{DL}$ is directly electrically connected to the second terminal of the source resistor $R_S$ and to the first terminal of the source capacitor $C_S$. The source node of the laser diode switch $M_{DL}$ is directly electrically connected to the first terminal of the inductor $L_S$. The anode of the laser diode $D_L$ is directly electrically connected to the second terminal of the inductor $L_S$, and the cathode of the laser diode $D_L$ is directly electrically connected to the bias voltage node. As shown, the pulsed laser diode drivers 801-802 are advantageously configured such that the laser diode switch $M_{DL}$ is electrically connected between the inductor $L_S$ and the source capacitor $C_S$. As a result, the drain node of the laser diode switch $M_{DL}$ does not receive a high voltage spike developed at the second terminal of the inductor $L_S$ when the bypass switch $M_{BP}$ is disabled to generate the high-current pulse through the laser diode $D_L$.

The pulsed laser diode drivers 801-802 differ in placement of the bypass capacitor $C_{BP}$. As shown in FIG. 8A, in some embodiments, the first terminal of the bypass capacitor $C_{BP}$ is directly electrically connected to the second terminal of the inductor $L_S$, to the anode of the laser diode $D_L$, and to the drain node of the bypass switch $M_{BP}$. In such embodiments, the second terminal of the bypass capacitor $C_{BP}$ is directly electrically connected to the bias voltage node. As shown in FIG. 8B, in some embodiments, the first terminal of the bypass capacitor $C_{BP}$ is directly electrically connected to the second terminal of the inductor $L_S$, to the anode of the laser diode $D_L$, and to the drain node of the bypass switch $M_{BP}$. In such embodiments, the second terminal of the bypass capacitor $C_{BP}$ is directly electrically connected to the second terminal of the source capacitor $C_S$ and to the first terminal of the damping resistor $R_{Damp}$.

In other embodiments, the respective positions of the inductor $L_S$ and the laser diode switch $M_{DL}$ in either of the pulsed laser diode drivers 801-802, can be exchanged such that the first terminal of the inductor $L_S$ is directly electrically connected to the first terminal of the source capacitor $C_S$, and the drain terminal of the laser diode switch $M_{DL}$ is directly electrically connected to the second terminal of the inductor $L_S$.

Figure 9A:
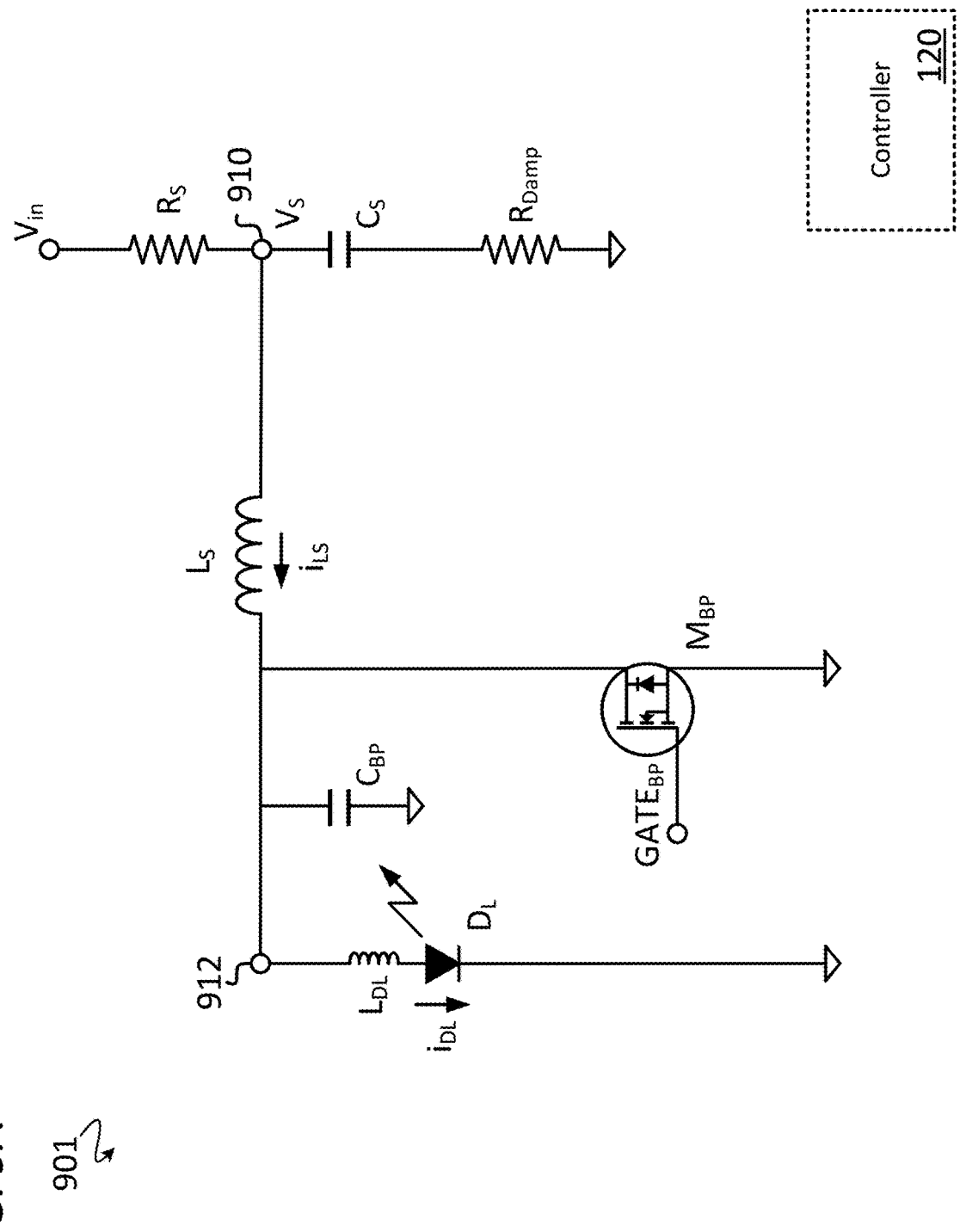
FIGS. 9A-B are simplified circuit schematics of pulsed laser diode drivers of a seventh general topology, in accordance with some embodiments.
Figure 9B:
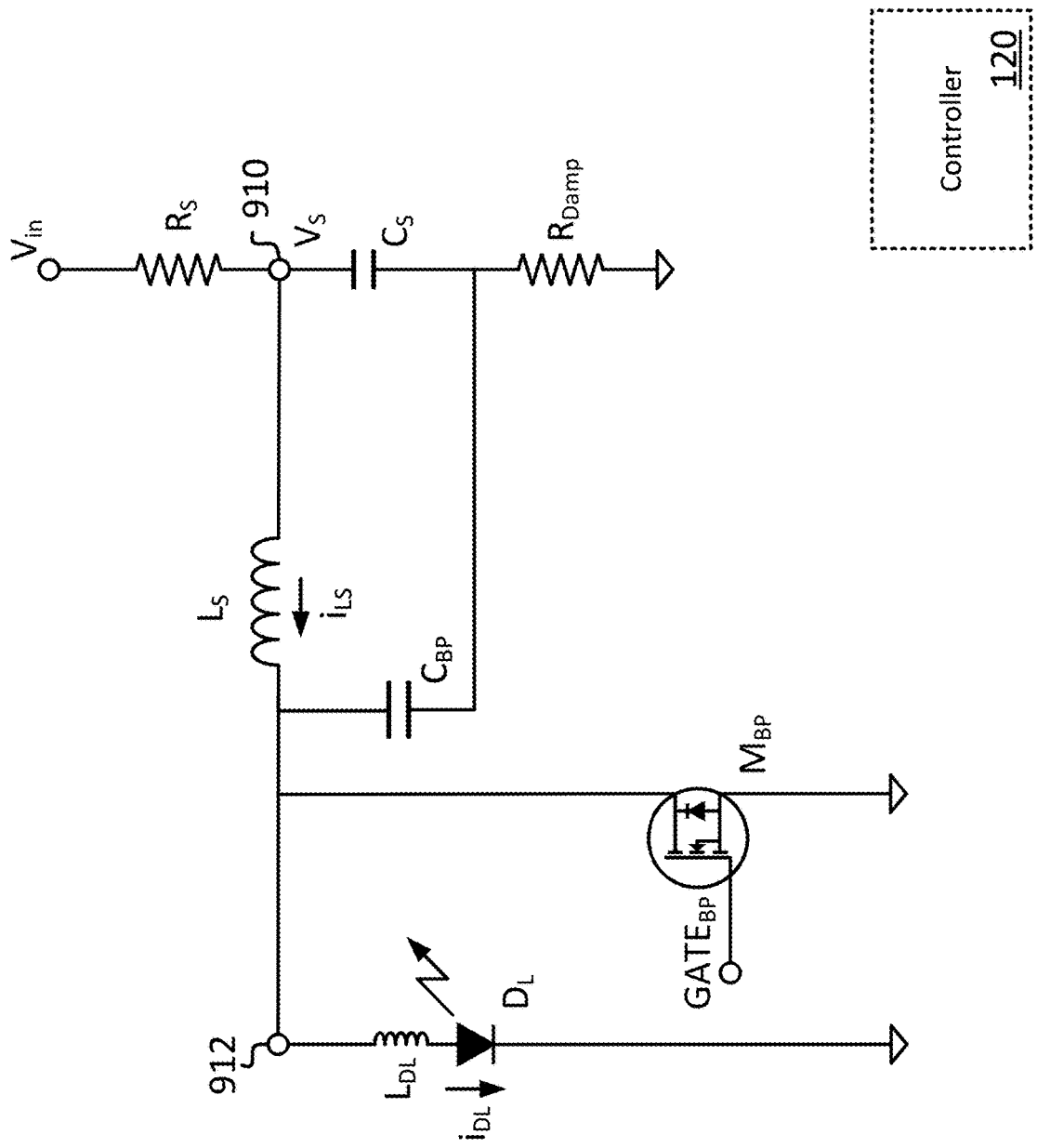

FIGS. 9A-B are simplified circuit schematics of pulsed laser diode drivers 901-902 of a seventh general topology that is configured to drive a laser diode using only a bypass switch, in accordance with some embodiments. The pulsed laser diode drivers 901-902 generally include the source resistor $R_S$, the source capacitor $C_S$, the damping resistor $R_{Damp}$, the inductor $L_S$, the bypass capacitor $C_{BP}$, the laser diode $D_L$, and the bypass switch $M_{BP}$. Also shown are nodes 910, 912, the respective parasitic inductances $L_{DL}$ of the laser diode $D_L$, the DC input voltage $V_{in}$, the source voltage $V_S$ at the source capacitor $C_S$, the current $i_{LS}$ through the inductor $L_S$, the current $i_{DL}$ through the laser diodes $D_L$, and the bypass switch gate driver signal $GATE_{BP}$. Electrical connections of the pulsed laser diode drivers 901-902 are similar to, or the same as, those described with respect to the pulsed laser diode driver 101. The pulsed laser diode drivers 901-902 differ in that the laser diode switch $M_{DL}$ is eliminated. The anode of the laser diode $D_L$ is directly electrically connected to the second terminal of the inductor $L_S$ and the cathode of the laser diode $D_L$ is directly electrically connected to the bias voltage node. In such embodiments, the voltage level of the DC input voltage $V_{in}$ is restricted to a voltage level that does not surpass the forward bias voltage of the laser diode $D_L$, thereby maintaining the laser diode $D_L$ in an OFF-state (i.e., not conducting) until a voltage higher than the forward bias voltage is developed at the second terminal of the inductor $L_S$ when current flow through the bypass switch is momentarily disabled.

The pulsed laser diode drivers 901-902 differ in placement of the bypass capacitor $C_{BP}$. As shown in FIG. 9A, in some embodiments, the first terminal of the bypass capacitor $C_{BP}$ is directly electrically connected to the second terminal of the inductor $L_S$, to the anode of the laser diode $D_L$, and to the drain node of the bypass switch $M_{BP}$. In such embodiments, the second terminal of the bypass capacitor $C_{BP}$ is directly electrically connected to the bias voltage node. As shown in FIG. 9B, in some embodiments, the first terminal of the bypass capacitor $C_{BP}$ is directly electrically connected to the second terminal of the inductor $L_S$, to the anode of the laser diode $D_L$, and to the drain node of the bypass switch $M_{BP}$. In such embodiments, the second terminal of the bypass capacitor $C_{BP}$ is directly electrically connected to the second terminal of the source capacitor $C_S$ and to the first terminal of the damping resistor $R_{Damp}$.

Embodiments of the pulsed laser diode drivers disclosed herein are additionally or alternatively operable to provide current pulses to devices other than laser diodes. For instance, embodiments of the pulsed laser diode drivers disclosed herein are operable to provide a current pulse to a light-emitting diode (i.e., a non-laser LED). Additionally, embodiments of the pulsed laser diode drivers disclosed herein are operable to provide a current pulse to another circuit or device, having no laser diode, that is configured to receive a current pulse for a purpose other than emitting light.

In some embodiments, two or more instances of the laser diode drivers disclosed herein are configured to drive respective laser diodes. For example, four instances of the pulsed laser diode driver 802 may be used to drive a laser diode package that includes four laser diodes. In such an embodiment, each of the laser diodes in the laser diode package is driven by an instance of the pulsed laser diode driver 802.

Configurable Pulsed Laser Diode Driver

There are many types of laser diode packaging configurations—spanning from a single diode, to arrays of tens-of-thousands of laser diodes, in a single laser diode package. Additionally, packaging pinouts differ between various laser diode configurations (e.g., between that of a single, or quad, edge-emitting laser diode configuration versus that of a VCSEL laser diode configuration).

Regardless of the particulars of the packaging, laser diodes have similar underlying characteristics such as a high threshold turn-on voltage and internal series resistance which determine a transfer function of the laser diode device. Additionally, many laser diode applications, regardless of the device packaging, often require a very narrow, high-current pulse with a relatively low repetition rate to limit power dissipation in the laser diode. A configurable pulsed laser diode driver disclosed herein advantageously uses the bypass resonant driver architecture described with reference to FIG. 1A-FIG. 9B to drive many different pin configurations and laser firing sequences of a variety of packaged laser diode devices.

Figure 10B:
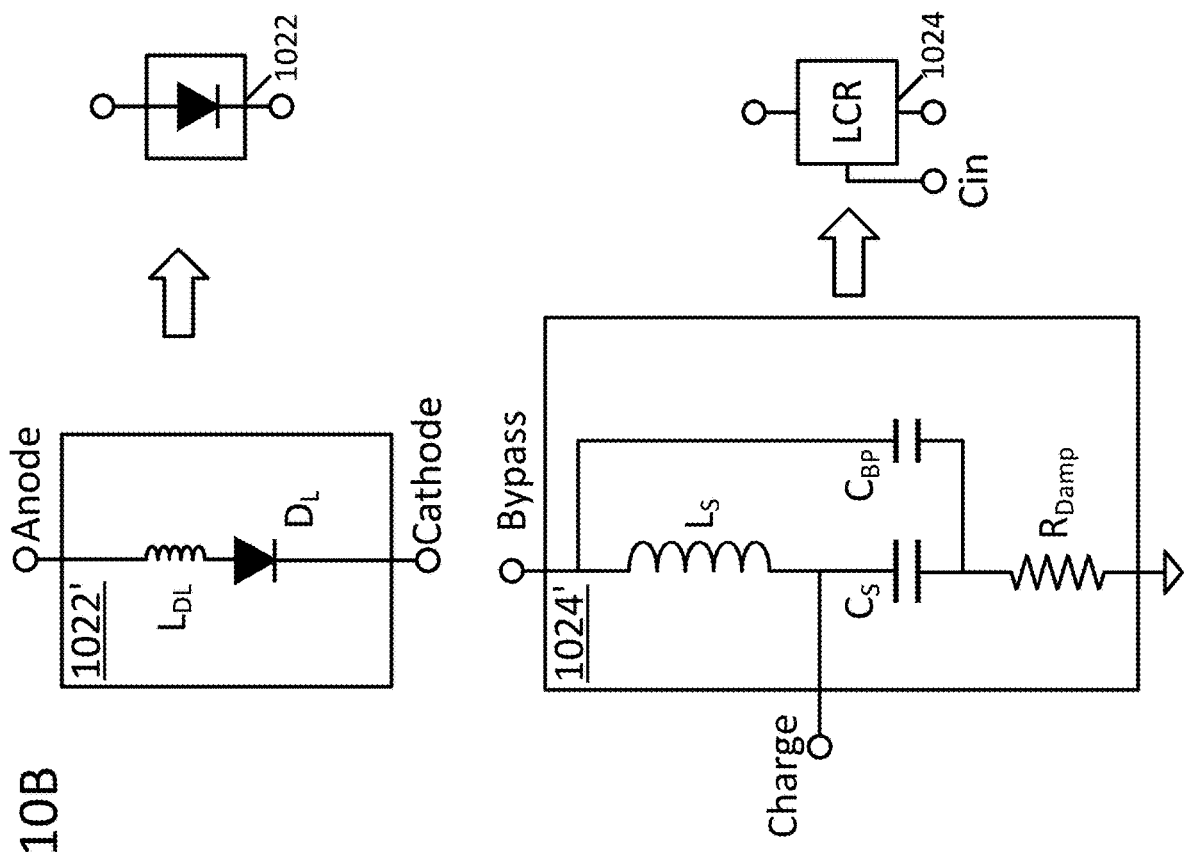
FIG. 10B shows simplified circuit schematics of circuits used with the configurable pulsed laser diode driver shown in FIG. 10A, in accordance with some embodiments.
Figure 10A:
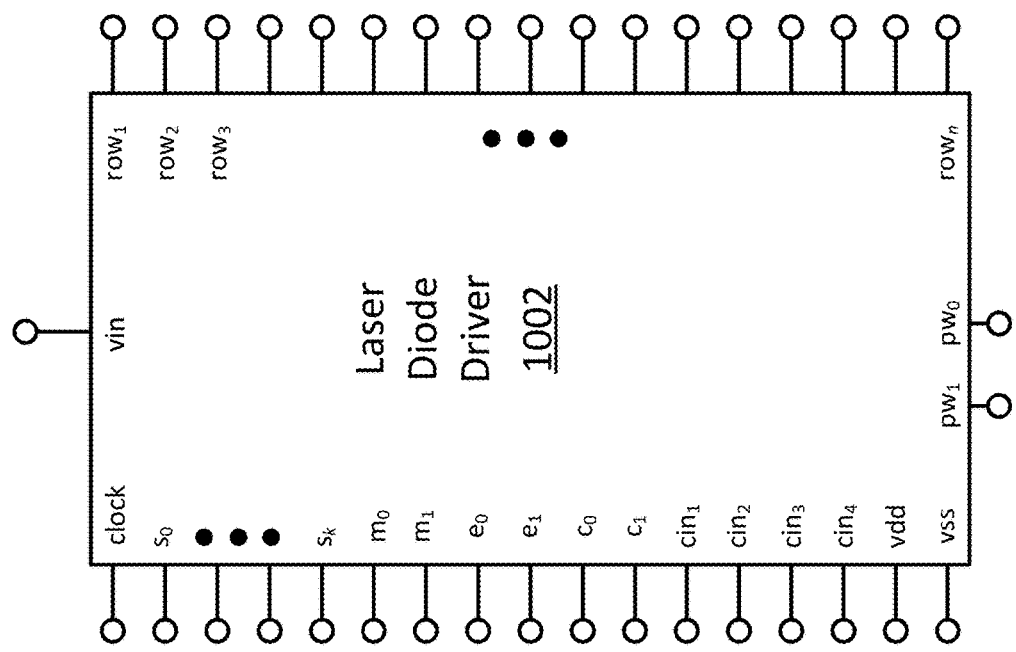
FIG. 10A is a simplified circuit schematic of a configurable pulsed laser diode driver, in accordance with some embodiments.

FIG. 10A is a simplified circuit schematic of a configurable pulsed laser diode driver ("laser diode driver") 1002, in accordance with some embodiments. In general, the configurable pulsed laser diode driver 1002 includes an input voltage terminal vin, an operating voltage terminal vdd, a bias voltage terminal vss, a clock terminal "clock", charging terminals $cin_1$-$cin_4$, drive terminals $row_1$-$row_n$, and configuration terminals that include pulse configuration terminals $pw_0$-$pw_1$, output selection configuration terminals $s_0$-$s_k$, mode configuration terminals $m_0$-$m_1$, grouping configuration terminals $e_0$-$e_1$, and charge configuration terminals $c_0$-$c_1$. The number of terminals made available for each of the charging terminals, drive terminals, pulse configuration terminals, and configuration terminals may be selected at design time as needed. Thus, in some embodiments, the number of bits available for each of the charging terminals, drive terminals, and configuration terminals may be a different value than shown in FIG. 10A. For example, the charging terminals may be implemented as $cin1$-$cin_p$, the mode configuration terminals may be implemented as $m_0$-$m_q$, the grouping configuration terminals may be implemented as $e_0$-$e_r$, and the charge configuration terminals may be implemented as $c_0$-$c_s$, where k, n, p, q, r, and s are any respective integer.

The drive terminals $row_1$-$row_n$ include a first set of programmable drive terminals (e.g., 4 terminals, 8 terminals, 16 terminals, 32 terminals, 64 terminals, 128 terminals, or another number of terminals) and a second set of non-programmable drive terminals (e.g., one terminal, four terminals, or another number of terminals). For example, in some embodiments, the configurable pulsed laser diode driver 1002 has 16 programmable drive terminals and one non-programmable drive terminal. In other embodiments, the configurable pulsed laser diode driver 1002 has 64 programmable drive terminals and four non-programmable drive terminals (e.g., a 16-1 ratio).

Configuration of the programmable drive terminals of $row_1$-$row_n$ is determined based on configuration data set using the configuration terminals of the configurable pulsed laser diode driver 1002. Values of the configuration data determine an output type, a grouping, and a clocking scheme of the configurable pulsed laser diode driver 1002. For an example of a 16-channel implementation of the configurable pulsed laser diode driver 1002, the 16 channels are controlled in accordance with configuration data set using the pulse configuration terminals $pw_0$-$pw_1$, four output selection configuration terminals $s_0$-$s_3$, the mode configuration terminals $m_0$-$m_1$, the grouping configuration terminals $e_0$-$e_1$ and the charge configuration terminals $c_0$-$c_1$. In this example, 16 of the drive terminals of $row_1$-$row_n$ are programmable, and one of the drive terminals of $row_1$-$row_n$ is non-programmable. The non-programmable terminal is configured to always produce a Bypass signal, as discussed below. For an example of a 64-channel implementation of the configurable pulsed laser diode driver 1002, the 64 channels are controlled in accordance with configuration data set using the pulse configuration terminals $pw_0$-$pw_1$, six output selection configuration terminals $s_0$-$s_5$, the mode configuration terminals $m_0$-$m_1$, the grouping configuration terminals $e_0$-$e_1$, and the charge configuration terminals $c_0$-$c_1$. In this example, 64 of the drive terminals of $row_1$-$row_n$ are programmable, and four of the drive terminals of $row_1$-$row_n$ are non-programmable, the non-programmable drive terminals being configured to always produce a Bypass signal, as discussed below.

In either example implementation of the configurable pulsed laser diode driver 1002, a resonant bypass architecture to energize one or more laser diodes as described with reference to FIG. 1A-FIG. 9B is driven by two types of signals controlled by the configurable pulsed laser diode driver 1002: a Pulse signal and a Bypass signal.

With reference to FIG. 2A-FIG. 2D, a current flow controlled by the laser diode switch $M_{DL}$ using the laser diode switch gate driver signal $GATE_{DL}$ 221 is an example of a Pulse signal. In some embodiments, the Pulse signal controls a current flow by selectively assuming one of a high bias voltage level or a low bias voltage level. That is, the Pulse signal may selectively source or sink, and stop, a current flow through a circuit.

A current flow controlled by the bypass switch $M_{BP}$ using the bypass switch gate driver signal $GATE_{BP}$ 220 is an example of a Bypass signal. In some embodiments, the Bypass signal controls a current flow by selectively assuming one of a high bias voltage level or a low bias voltage level. That is, the Bypass signal may selectively source or sink, and stop, a current flow through a circuit.

The Pulse signal generally controls a current flow through a laser diode by providing a first control signal to a first circuit (e.g., a switch such as $M_{DL}$ described above and implemented as an NFET or PFET) that is electrically connected to a cathode or an anode of the laser diode. In some embodiments the first circuit is internal to the configurable pulsed laser diode driver 1002. In other embodiments the first circuit that is external to the configurable pulsed laser diode driver 1002.

The Bypass signal generally controls the production, by a resonant circuit, of a high current pulse (e.g., 223, 223', 223" shown in FIG. 2A-FIG. 2D) that energizes the laser diode. The Bypass signal generally controls a current flow through a resonant circuit by providing a second control signal to a second circuit (e.g., a switch such as $M_{BP}$ described above and implemented as an NFET or PFET) that is electrically connected to a resonant circuit. In some embodiments, the second circuit that is internal to the configurable pulsed laser diode driver 1002. In other embodiments, the second circuit that is external to the configurable pulsed laser diode driver 1002.

The Bypass signal and Pulse signal are very similar, with the difference being the Bypass signal contains a very short interval following the negative edge of a clock signal which is responsible for creating the resonant overshoot, by controlling a current flow through a resonant circuit, which turns on the laser diode for a very short duration (1-5 ns) to produce the high current pulse.

The mode configuration terminals $m_0$-$m_1$ of the configurable pulsed laser diode driver 1002 set a "type" of signal, meaning a Pulse signal or Bypass signal, associated with each of the programmable drive terminals of $row_1$-$row_n$. The non-programmable drive terminals of $row_1$-$row_n$ are configured such that they always produce respective Bypass signals. As a simplified example when the configurable pulsed laser diode driver 1002 implements a 16-channel driver, with reference to table 1500 of FIG. 15, a combined mode configuration value of M=0 as determined by the mode configuration terminals $m_0$-$m_1$ configures programmable drive terminals $row_1$-$row_{16}$ (columns labeled '1'-'16') such that each is operable to produce a Pulse signal ('P'). A non-programmable drive terminal $row_{17}$ (the column labeled '17') is configured to always produce a Bypass signal ('B').

Within the table 1500, 'P' indicates a Pulse signal and 'B' represents a Bypass signal. Additionally, 'CX' indicates that charge is delivered to each of the charge terminals $cin_1$-$cin_4$ during a positive portion of each clock cycle, 'C1' indicates that charge is delivered to the charge terminal $cin_1$ during each clock cycle, 'C2' indicates that charge is delivered to the charge terminal $cin_2$ during each clock cycle, and so on.

With reference to FIG. 10A, the output selection configuration terminals $s_0$-$s_k$ are synchronized with a clock signal received at the clock terminal of the configurable pulsed laser diode driver 1002. The output selection configuration terminals $s_0$-$s_k$ select, for each clock cycle, at which of the programmable drive terminals of $row_1$-$row_n$ the Pulse signal and the Bypass signal will appear based on the combined mode configuration value. As a simplified example, setting the output selection configuration terminal $s_0$ to a logic high and setting all other terminals of the output selection configuration terminals $s_1$-$s_k$ to a logic low will result in a Pulse signal or Bypass signal only appearing at $row_1$ for each clock cycle. Similarly, setting the output selection configuration terminal $s_1$ to a logic high and setting all other terminals the output selection configuration terminals $s_0$, $s_2$-$s_k$ to a logic low will result in a Pulse signal or Bypass signal only appearing at $row_2$ for each clock cycle. However, values of the remainder of the configuration data of the configurable pulsed laser diode driver 1002 may further modify this behavior. A Bypass signal always appears at the non-programmable output driver terminals (e.g., $row_{17}$) for each clock cycle.

The grouping configuration terminals $e_0$-$e_1$ determine how the output selection configuration terminals $s_0$-$s_k$ are grouped. As a simplified example when the configurable pulsed laser diode driver 1002 implements a 16-channel driver, with reference to the table 1500 of FIG. 15, a combined grouping configuration value of E=0 as determined by the grouping configuration terminals $e_0$-$e_1$ configures the output selection configuration terminals $s_1$-$s_k$ such that each programmable drive terminals of $row_1$-$row_n$ is independently selectable in accordance with received output selection configuration data. Thus, each programmable drive terminals of $row_1$-$row_n$ may be selectively energized on the same clock cycle to drive a respective connected laser diode. Similarly, a combined grouping configuration value of E=1 as determined by the grouping configuration terminals $e_0$-$e_1$ configures the output selection configuration terminals $s_1$-$s_k$ such that only pairs of programmable drive terminals of $row_1$-$row_n$ are independently selectable in accordance with received output selection configuration data (i.e., the least significant bit (LSB) of the output selection configuration terminals $s_1$-$s_k$ is ignored). Thus, only pairs of programmable drive terminals of $row_1$-$row_n$ may be selectively energized on the same clock cycle to drive a connected laser diode. As yet another example, a combined grouping configuration value of E=2 as determined by the grouping configuration terminals $e_0$-$e_1$ configures the output selection configuration terminals $s_1$-$s_k$ such that only quads of programmable drive terminals of $row_1$-$row_n$ are independently selectable in accordance with received output selection configuration data (i.e., the two LSBs of the output selection configuration terminals $s_1$-$s_k$ are ignored).

With reference to FIG. 10A, the charging configuration terminals $c_0$-$c_1$ determine which of the charging terminals $cin_1$-$cin_4$ are clocked relative to the values of the output selection configuration terminals $s_1$-$s_k$. A capacitor (i.e., similar to the source capacitor $C_s$ described above) of a resonant circuit connected to one or more of the charging terminals $cin_1$-$cin_4$ is configurable to be charged to a voltage level at the input voltage terminal vin during a positive portion of the clock cycle. The voltage received at the input voltage terminal vin is similar to the source voltage Vs described above. Thus, in some embodiments, when the charging terminals $cin_1$-$cin_4$ are "clocked", a voltage similar to the source voltage Vs charges a source capacitor of a resonant circuit during the positive portion of each clock cycle.

As a simplified example, when the configurable pulsed laser diode driver 1002 implements a 16-channel driver, with reference to the table 1500 of FIG. 15, a combined charging configuration value of C=0 as determined by the charging configuration terminals $c_0$-$c_3$ configures the charging terminals $cin_1$-$cin_4$ such they are each clocked for each clock cycle regardless of the values of the output selection configuration terminals $s_1$-$s_k$. Similarly, a combined charging configuration value of C=1 as determined by the charging configuration terminals $c_0$-$c_3$ configures the charging terminals $cin_1$-$cin_4$ such that charging terminal $cin_1$ ("C1") is clocked for each clock cycle when output selection configuration terminals $s_1$, $s_5$, $s_9$, or $s_{13}$ are set to a logic high, charging terminal $cin_2$ ("C2") is clocked for each clock cycle when the output selection configuration terminals $s_2$, $s_6$, $s_{10}$, or $s_{14}$ are set to a logic high, and so on. As another example, a combined charging configuration value of C=2 as determined by the charging configuration terminals $c_0$-$c_3$ configures the charging terminals $cin_1$-$cin_4$ such that charging terminal $cin_1$ is clocked for each clock cycle when any of the output selection configuration terminals $s_1$, $s_2$, $s_9$, or $s_{10}$ are set to a logic high, and so on.

Figure 2D:
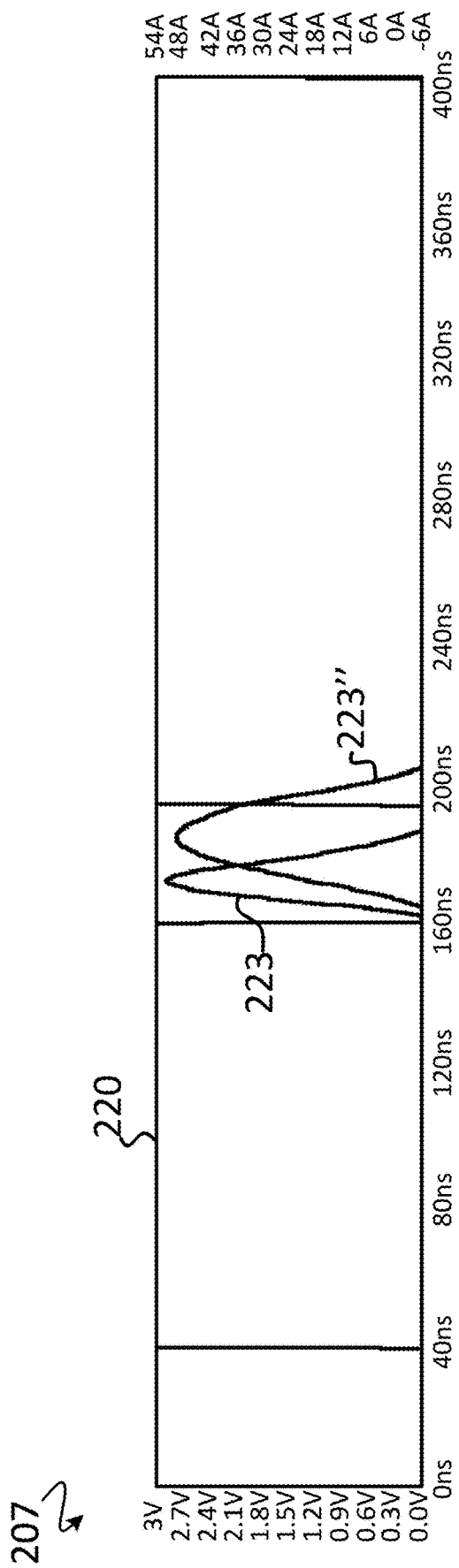

With reference to FIG. 10A, the pulse configuration terminals $pw_0$ and $pw_1$ are used to set a pulse offset and a pulse width for activation of each laser diode during each clock cycle. A first resistor value coupled between the pulse configuration terminal $pw_0$ and ground configures a pulse offset from a negative clock edge of a clock signal received at the clock terminal of the configurable pulsed laser diode driver 1002. A second resistor value coupled between the pulse configuration terminal $pw_1$ and ground determines a width of each high current pulse that activates a respective laser diode. For example, FIG. 2D illustrates two pulses 223, 223" having varying widths and offsets from a negative edge of signal 220.

Switching performed within the configurable pulsed laser diode driver 1002 may be implemented with NFET devices or PFET devices. Advantageously, such switching may be implemented using conventional Silicon or Silicon Carbide-based switches rather than high-voltage GAN devices. Signal routing, logic, and timing functions performed within the configurable pulsed laser diode driver 1002 may be performed using appropriate signal routing, logic, and timing circuits as are understood by one of skill in the art.

FIG. 10B shows simplified circuit schematics of circuits used with the configurable pulsed laser diode driver 1002 shown in FIG. 10A, in accordance with some embodiments. A laser diode circuit 1022' generally includes one or more laser diodes $D_L$ having an anode and a cathode, as described above. A parasitic inductance of the anode of the laser diodes $D_L$ is represented as an inductor $L_{DL}$. A simplified schematic representation 1022 of the laser diode circuit 1022' may be used herein to simplify the drawings. A resonant circuit 1024' generally includes an inductor $L_S$, a source capacitor $C_S$, a bypass capacitor $C_{BP}$, and an optional damping resistor $R_{Damp}$, as described with reference to FIG. 1A-FIG. 9B. A first terminal of the inductor $L_S$ is directly electrically connected to a first terminal of the source capacitor $C_S$. In some embodiments, a second terminal of the source capacitor $C_S$ is electrically coupled to a bias voltage (e.g., ground) through a damping resistor $R_{Damp}$. In other embodiments, the second terminal of the source capacitor $C_S$ is directly electrically connected to the bias voltage. A second terminal ("Bypass") of the inductor $L_S$ is directly electrically connected to a first terminal of the bypass capacitor $C_{BP}$. A second terminal of the bypass capacitor $C_{BP}$ is directly electrically connected to the second terminal of the source capacitor $C_S$. A charge terminal ("Charge") of the resonant circuit 1024' is directly electrically connected to the first terminal of the source capacitor $C_S$. As indicated, a simplified schematic representation 1024 of the resonant circuit 1024' may be used herein to simplify the drawings.

FIG. 11 shows an example of a simplified schematic of a circuit 1100 involving the configurable pulsed laser diode driver 1002 of FIG. 10A when it is configured as a 16-channel driver 1102 to drive two quad-pack laser diode packages (each in a common cathode configuration), in accordance with some embodiments. In general, the circuit 1100 includes the configurable pulsed laser diode driver ("driver") 1102 which is a 16-channel implementation of the configurable pulsed laser diode driver 1002 of FIG. 10A, a first grouping of four laser diode circuits 1122a-1122d (i.e., a first "quad-pack"), a second grouping of four laser diode circuits 1122e-1122h (i.e., a second quad-pack), configuration resistors R1, R2, an optional controller 1120, and four resonant circuits 1124a-1124d, connected as shown. The optional controller 1120 is similar to the controller 120 described above and is operable to provide configuration data to the 16-channel driver 1102 as described below. Also shown are clock and/or control signals (indicated as abstracted square-wave signals), a high bias voltage level Vdd, a low bias voltage level Vss, an input voltage signal Vin, and indications of signal routings Cin1-Cin4, Anode 1-Anode 4, and Cathode 1-Cathode 2.

The optional controller 1120 is operable to provide digital signals such as logical states (i.e., configuration data) and clock signals to the driver 1102 (e.g., as indicated by the abstracted square-wave signals at the clock and $s_0$-$s_3$ terminals, Vdd, and Vss). In some embodiments, the optional controller 1120 may be, or may include, a programmable memory device or a counter circuit. In some such embodiments, the optional controller 1120 is a programmable memory device configured to provide configuration data to the driver 1102, and a clock signal received by the driver 1102 is provided from a source other than the optional controller 1120 (e.g., from a clock generation circuit or oscillator, not shown). Some elements of the circuit 1100 have been omitted from FIG. 11 to simplify the description but are understood to be present.

Each of the laser diode circuits 1122a-1122h is the same as the laser diode circuit 1022' shown in FIG. 10B. Similarly, each of the resonant circuits 1124a-1124d is the same as the resonant circuit 1024' shown in FIG. 10B.

The principle of control of the laser diode circuits 1122a-1122h by the driver 1102 is similar to that shown and described with reference to FIG. 1B. That is, each resonant circuit 1124a-1124d has similar functionality to a resonant circuit of the pulsed laser diode driver 102 that includes the inductor $L_S$, the bypass capacitor $C_{BP}$, the source capacitor $C_S$, and the damping resistor $R_{Damp}$. Similarly, each laser diode quad pack 1122a-1122d and 1122e-1122h is similar to the laser diode $D_L$ of the pulsed laser diode driver 102.

In accordance with a clock signal received at a clock terminal of the driver 1102, current through the laser diode circuits 1122a-1122h is controlled by the 16-channel driver 1102 (e.g., according to the Pulse signal) similarly as compared to current controlled by switching of the laser diode $D_L$ by the laser diode switch $M_{DL}$ as shown and described with reference to FIG. 1B. Current through the resonant circuits 1124a-1124d is controlled similarly by the 16-channel driver 1102 (e.g., according to the Bypass signal) as compared to current through the resonant circuit shown in FIG. 1B controlled by switching the bypass switch $M_{BP}$ of FIG. 1B.

Values of the configuration resistors R1, R2 configure a desired pulse width for an emitted laser pulse and an offset of the emitted laser pulse from a falling clock edge of a clock signal received at the clock terminal of the driver 1102. Configuration bits $m_0$-$m_1$, $e_0$-$e_1$, and $c_0$-$c_1$ are pulled (e.g., either "hard-wired" or dynamically controlled by the controller 1120) to either a logic high value (e.g., using a high bias voltage Vdd) or to a logic low value (e.g., using a low bias voltage Vss) such that the driver 1102 operates, as shown in FIG. 11, with a desired configuration setting of M=2, E=3, C=0, where a mode configuration value M is the decimal value set by the mode configuration terminals $m_0$-$m_1$, a grouping configuration value E is the decimal value set by the grouping configuration terminals $e_0$-$e_1$, and a charge configuration value C is the decimal value set by the charging configuration terminals $c_0$-$c_1$.

Table 1500 shown in FIG. 15 specifies various configurations of the 16-channel driver 1102 for each combination of configuration values. As shown in FIG. 11, with reference to table 1500, a mode configuration value of M=2 configures the driver 1102 as follows: the drive terminals $row_1$ and $row_9$ electrically couple the respective anodes (Anode 1) of the laser diode circuits 1122a, 1122e to the bypass terminal of the resonant circuit 1124a to receive a Bypass signal; the drive terminals $row_2$ and $row_{10}$ electrically couple the respective anodes (Anode 2) of the laser diode circuits 1122b, 1122f to the bypass terminal of the resonant circuit 1124b to receive a Bypass signal; the drive terminals $row_7$ and $row_{15}$ electrically couple the respective anodes (Anode 3) of the laser diode circuits 1122c, 1122g to the bypass terminal of the resonant circuit 1124c to receive a Bypass signal; the drive terminals $row_8$ and $row_{16}$ electrically couple the respective anodes (Anode 4) of the laser diode circuits 1122d, 1122h to the bypass terminal of the resonant circuit 1124d to receive a Bypass signal; the drive terminals comprising $row_3$-$row_6$ selectively (i.e., in accordance to a Pulse signal) couple the respective cathodes (Cathode 1) of the laser diode circuits 1122a-1122d to ground (i.e., Vss); and the drive terminals comprising $row_{11}$-$row_{14}$ electrically selectively couple (i.e., in accordance to a Pulse signal) the respective cathodes (Cathode 2) of the laser diode circuits 1122e-1122h to ground. Thus, similar to the pulsed laser diode driver 102 of FIG. 1B, the configurable pulsed laser diode driver 1102 blocks or allows respective currents through the laser diode circuits 1122a-1122h by controlling a Pulse signal at respective cathodes of the laser diode circuits 1122a-1122h.

With reference to table 1500 of FIG. 15, a charge configuration value of C=0 configures the driver 1102 as follows: the charge terminal $cin_1$ controls a current (Cin1) delivered to the charge terminal of the resonant circuit 1124a during each clock cycle; the charge terminal $cin_2$ controls a current (Cin2) delivered to the charge terminal of the resonant circuit 1124b during each clock cycle; the charge terminal $cin_3$ controls a current (Cin3) delivered to the charge terminal of the resonant circuit 1124c during each clock cycle; and the charge terminal $cin_4$ controls a current (Cin4) delivered to the charge terminal of the resonant circuit 1124d during each clock cycle. During each clock cycle, respective capacitors of the resonant circuits 1124a-1124d are charged in accordance with the input voltage Vin at the input voltage terminal vin.

With reference to table 1500 of FIG. 15, a grouping configuration value of E=3 configures the driver 1102 such that every eight adjacent drive terminals (e.g., $row_1$-$row_8$ and $row_9$-$row_{16}$) are driven together by output selection signals received at the output selection configuration terminals $s_0$-$s_3$. That is, the output selection terminal $s_3$ becomes the LSB for output selection between the laser diode circuits 1122a-1122d and 1122e-1122h.

Figure 12:
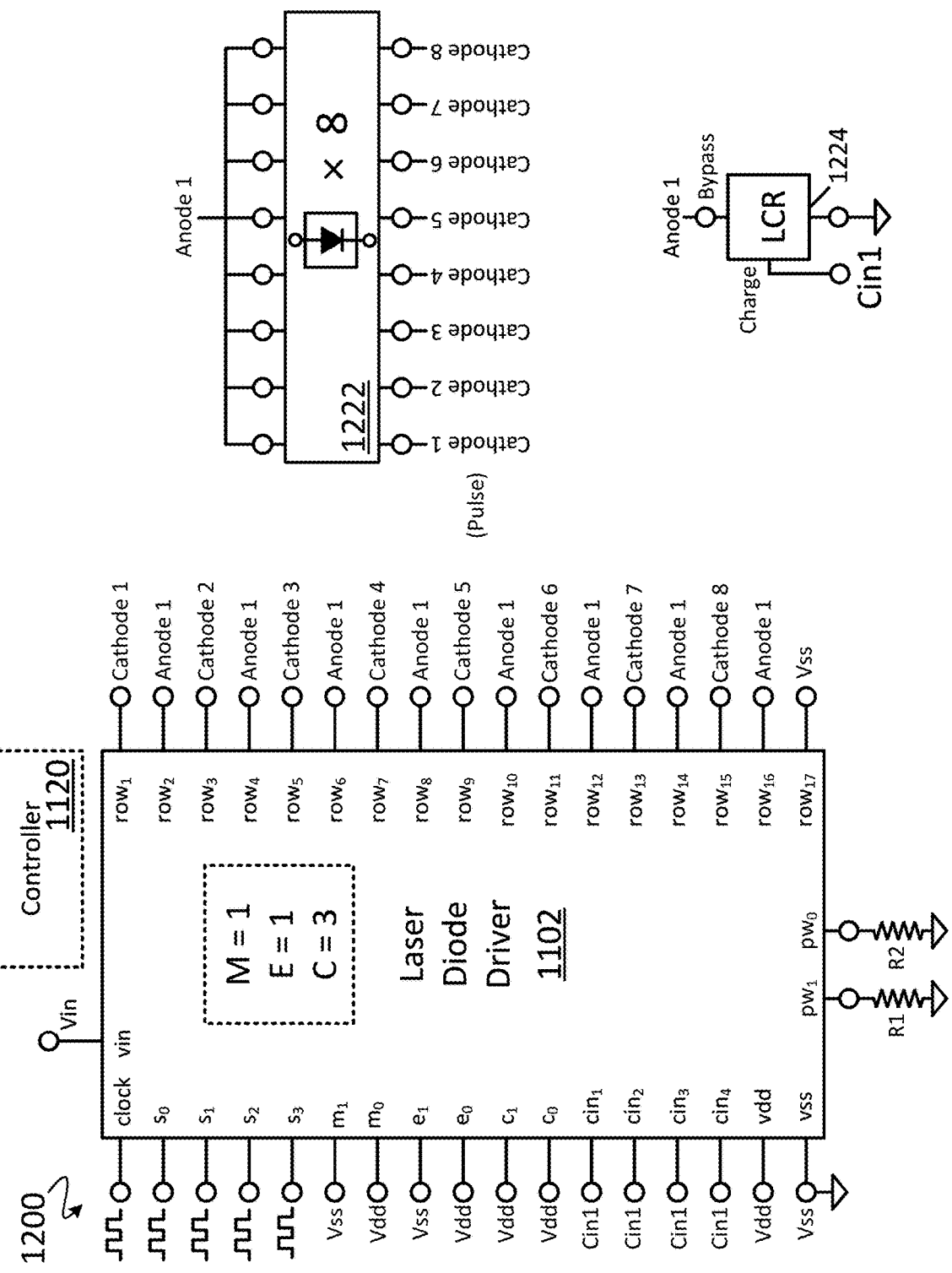
FIG. 12 shows a simplified circuit schematic of the configurable pulsed laser diode driver of FIG. 10A when it is configured to drive a single array of eight laser diodes, in accordance with some embodiments.

FIG. 12 shows another example of a simplified circuit schematic of a circuit 1200 involving the configurable 16-channel laser diode driver 1102 of FIG. 11 when it is configured to drive a single array comprising eight laser diodes (in a common anode configuration), in accordance with some embodiments. In general, the circuit 1200 includes the configurable pulsed laser diode driver 1102, a single laser diode array 1222 of eight laser diodes, the configuration resistors R1, R2, the optional controller 1120, and a single resonant circuit 1224, connected as shown. Also shown are clock and/or control signals (indicated as abstracted square-wave signals), a high bias voltage level Vdd, a low bias voltage level Vss, an input voltage signal Vin, and indications of signal routings Cin1, Anode 1, and Cathode 1-Cathode 8. Some elements of the circuit 1200 have been omitted from FIG. 12 to simplify the description but are understood to be present.

Each laser diode circuit of the laser diode array 1222 is the same as the laser diode circuit 1022' shown in FIG. 10B. Similarly, the resonant circuit 1224 is the same as the resonant circuit 1024' shown in FIG. 10B.

Control of the laser diodes of the laser diode array 1222 by the driver 1102 is similar to that shown and described with reference to FIG. 1B and/or FIG. 4B. That is, the resonant circuit 1224 has similar functionality to a resonant circuit of the pulsed laser diode driver 102 that includes the inductor $L_S$, the bypass capacitor $C_{BP}$, the source capacitor $C_S$, and the damping resistor $R_{Damp}$. Each of the laser diodes of the laser diode array 1222 is similar to the laser diode $D_L$ and parasitic inductance $L_{DL}$ of the pulsed laser diode driver 102. In accordance with a clock signal received at the clock terminal of the driver 1102, the laser diodes of the laser diode array 1222 are controlled similarly to the laser diode $D_L$ by the switch laser diode switch $M_{DL}$ as shown and described with reference to FIG. 1B. The resonant circuit 1224 is controlled similarly to the resonant circuit shown in FIG. 1B by the switch bypass switch $M_{BP}$ of FIG. 1B.

Values of the configuration resistors R1, R2 configure a desired pulse width for an emitted laser pulse and an offset of the emitted laser pulse from a falling clock edge of a clock signal received at the clock terminal of the driver 1102. In the example shown, the driver 1102 operates with a desired configuration setting of M=1, E=1, C=3 where a mode configuration value M is the decimal value set by the mode configuration terminals $m_0$-$m_1$, a grouping configuration value E is the decimal value set by the grouping configuration terminals $e_0$-$e_1$, and a charge configuration value C is the decimal value set by the charging configuration terminals $c_0$-$c_1$.

As shown in FIG. 12, with reference to table 1500 of FIG. 15, a mode configuration value of M=1 configures the driver 1102 as follows: the drive terminals $row_2$, $row_4$, $row_6$, $row_8$, $row_{10}$, $row_{12}$, $row_{14}$, and $row_{16}$ electrically couple respective anodes of the laser diodes of the laser diode array 1222 to the bypass terminal of the resonant circuit 1224 to provide a Bypass signal; and the drive terminals comprising $row_1$, $row_3$, $row_5$, $row_7$, $row_9$, $row_{11}$, $row_{13}$, and $row_{15}$ control respective cathodes Cathode 1-Cathode 8 of the laser diode array 1222. The drive terminal $row_{17}$ is tied to ground (Vss).

With reference to table 1500 of FIG. 15, a charge configuration value of C=3 configures the driver 1102 such that the charge terminals $cin_1$-$cin_4$ collectively control a current delivered to the charge terminal of the resonant circuit 1224. Thus, for any value of the output selection configuration terminals $s_0$-$s_3$, charge will be supplied to the charge terminal of the resonant circuit 1224.

With reference to table 1500 of FIG. 15, a grouping configuration value of E=1 configures the driver 1102 such that every two adjacent drive terminals (e.g., $row_1$ and $row_2$, $row_3$ and $row_4$, and so on) are selected together. Thus, individual control of each laser diode of the laser diode array 1222 is achieved. That is, if the output selection terminal $s_0$ is set to a logic high value and all other output selection configuration terminals $s_1$-$s_3$ are set to a logic low value, then the Pulse signal and the Bypass signal will only appear on the drive terminals $row_1$ and $row_2$, respectively and in accordance with the clock cycle.

Figure 13:
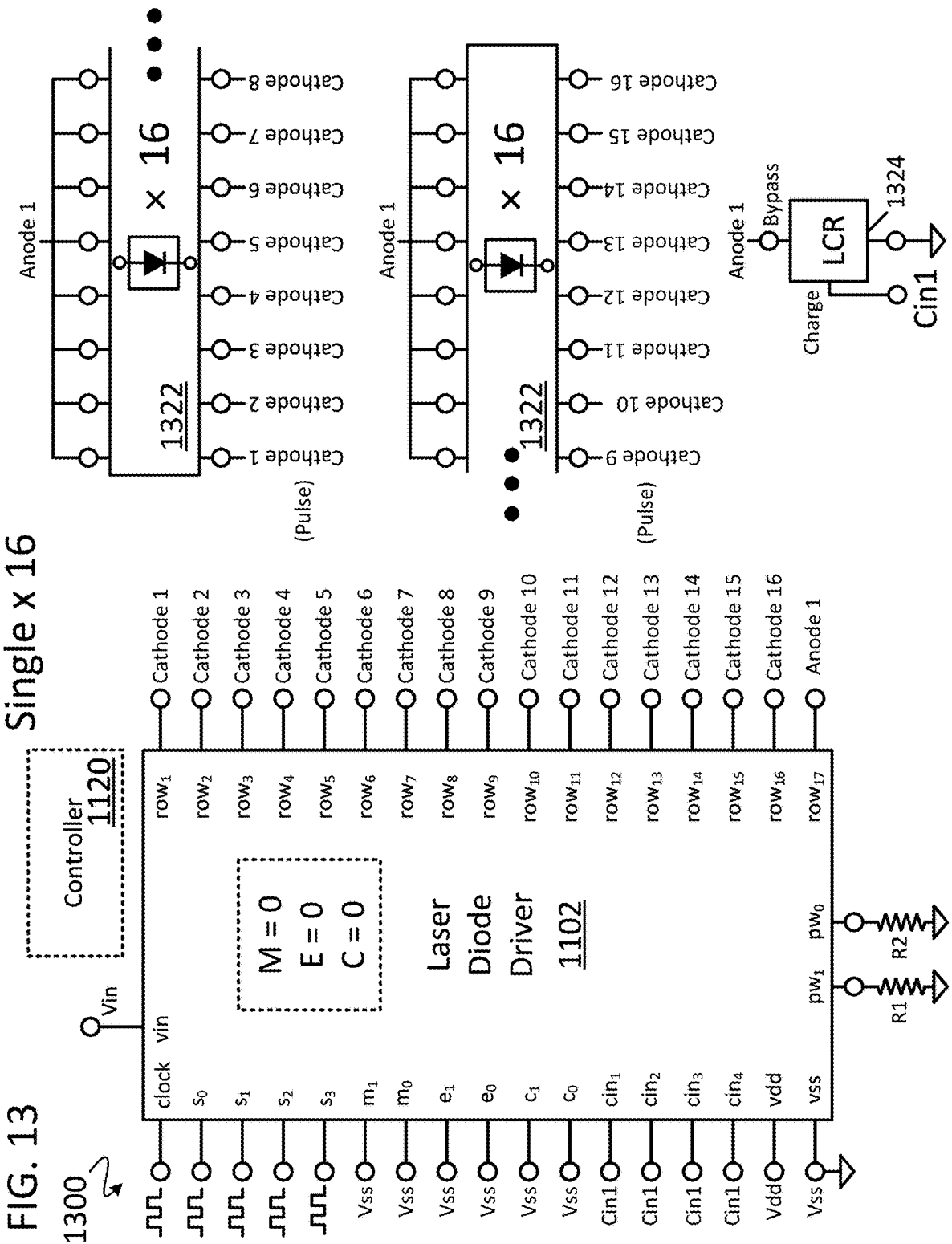
FIG. 13 shows a simplified circuit schematic of the configurable pulsed laser diode driver of FIG. 10A when it is configured to drive a single array of 16 laser diodes, in accordance with some embodiments.

FIG. 13 shows another example of a simplified circuit schematic 1300 involving the configurable pulsed laser diode driver 1102 of FIG. 11 when it is configured to drive a single array comprising sixteen laser diodes (in a common anode configuration), in accordance with some embodiments. In general, the circuit 1300 includes the configurable pulsed laser diode driver 1102, a single laser diode array 1322 of sixteen laser diodes, the configuration resistors R1, R2, the optional controller 1120, and a single resonant circuit 1324, connected as shown. Also shown are clock and/or control signals (indicated as abstracted square-wave signals), a high bias voltage level Vdd, a low bias voltage level Vss, an input voltage signal Vin, and indications of signal routings Cin1, Anode 1, and Cathode 1-Cathode 16. Some elements of the circuit 1300 have been omitted from FIG. 13 to simplify the description but are understood to be present. Each laser diode circuit of the laser diode array 1322 is the same as the laser diode circuit 1022' shown in FIG. 10B. Similarly, the resonant circuit 1324 is the same as the resonant circuit 1024' shown in FIG. 10B.

Control of the laser diodes of the laser diode array 1322 by the driver 1102 is similar to that shown and described for the laser diode array 1222 with reference to FIG. 12.

In the example shown, the driver 1102 operates with a desired configuration setting of M=0, E=0, C=0, where a mode configuration value M is the decimal value set by the mode configuration terminals $m_0$-$m_1$, a grouping configuration value E is the decimal value set by the grouping configuration terminals $e_0$-$e_1$, and a charge configuration value C is the decimal value set by the charging configuration terminals $c_0$-$c_1$.

As shown in FIG. 13, with reference to table 1500 of FIG. 15, a mode configuration value of M=0 configures the driver 1102 as follows: the drive terminal $row_{17}$ electrically couples respective anodes of the laser diodes of the laser diode array 1322 to the bypass terminal of the resonant circuit 1324; and the drive terminals $row_1$-$row_{16}$ control respective cathodes Cathode 1-Cathode 16 of the laser diode array 1322.

With reference to table 1500 of FIG. 15, a charge configuration value of C=0 configures the driver 1102 such that the charge terminals $cin_1$-$cin_4$ collectively control a current delivered to the charge terminal of the resonant circuit 1324. Thus, for any value of the output selection configuration terminals $s_0$-$s_3$, charge will be supplied to the charge terminal of the resonant circuit 1324.

With reference to table 1500 of FIG. 15, a grouping configuration value of E=0 configures the driver 1102 such that each drive terminal (e.g., $row_1$, $row_2$, $row_3$, and so on) is driven individually. However, a Bypass signal appears at drive terminal $row_{17}$ for each clock cycle of the driver 1102. Thus, individual control of each laser diode of the laser diode array 1322 is achieved based on control of the drive terminals $row_1$-$row_{16}$.

Figure 14:
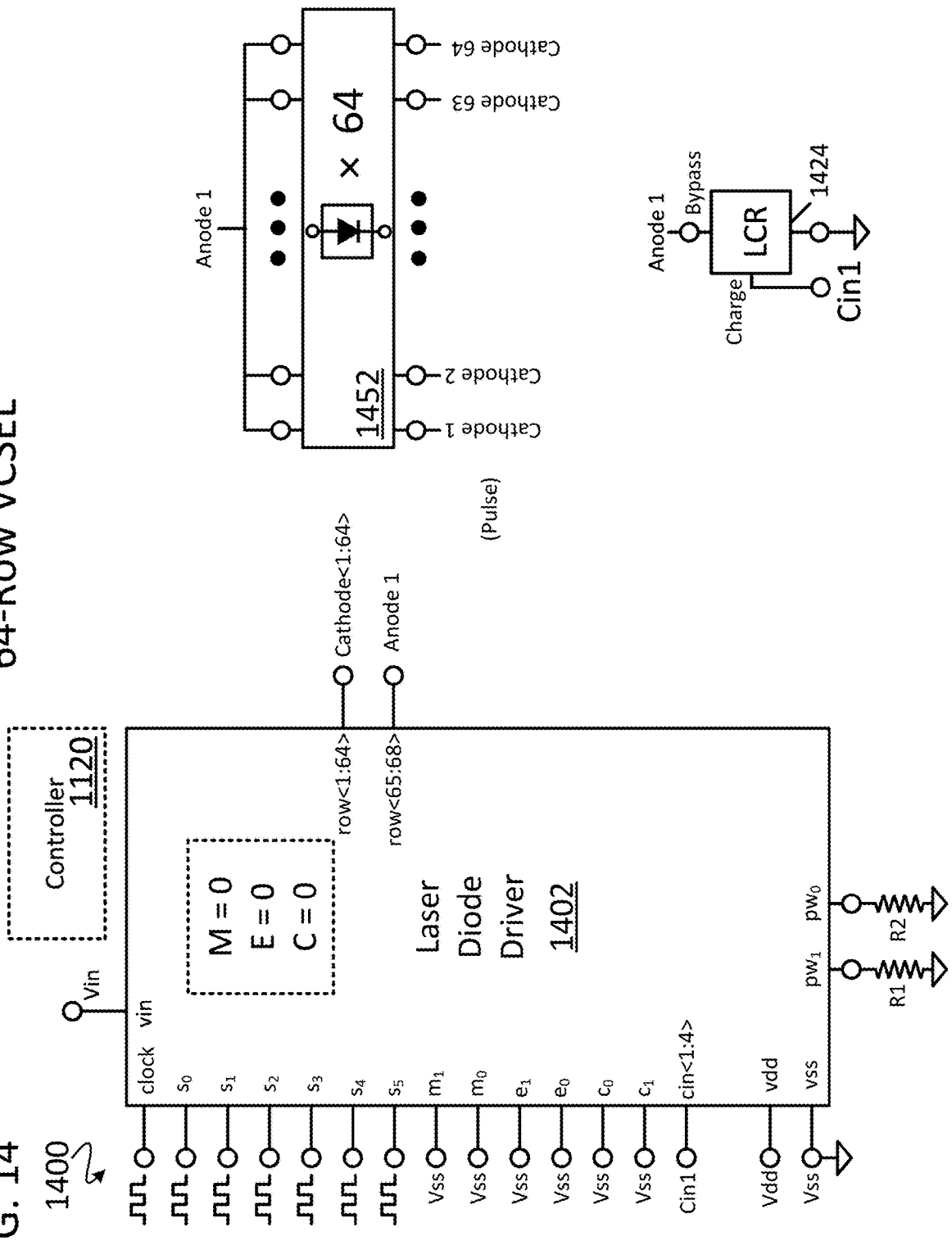
FIG. 14 is a simplified circuit schematic of another configurable pulsed laser diode driver configured to drive a 64-row VCSEL laser diode array, in accordance with some embodiments.

FIG. 14 shows an example of a simplified circuit schematic 1400 involving a configurable pulsed laser diode driver 1002 of FIG. 10A when it is configured to drive a 64-row VCSEL laser diode array (in a common anode configuration), in accordance with some embodiments. In general, the circuit 1400 includes a configurable pulsed laser diode driver 1402 which is an implementation of the configurable pulsed laser diode driver 1002 of FIG. 10A, a 64-row VCSEL laser diode circuit 1452, the configuration resistors R1, R2, the optional controller 1120, and an resonant circuit 1424, connected as shown. The optional controller 1120 is similar to the controller 120 described above. The optional controller 1120 is operable to provide digital signals such as logical states and clock signals to the driver 1402. In some embodiments, the optional controller 1120 may be, or may include, a programmable memory device. In some such embodiments, the optional controller is a programmable memory device configured to provide configuration data to the driver 1402, and a clock signal received by the driver 1402 is provided from a source other than the optional controller 1120 (e.g., from a clock generation circuit or oscillator, not shown). Also shown are clock and/or control signals (indicated as abstracted square-wave signals), a high bias voltage level Vdd, a low bias voltage level Vss, an input voltage signal Vin, and indications of signal routings Cin1, Anode 1, and Cathode 1-Cathode 64. Some elements of the circuit 1400 have been omitted from FIG. 14 to simplify the description but are understood to be present.

Each laser diode of the laser diode circuit 1452 represents a row of laser diodes of a VCSEL array, which may have hundreds of emitters, but in principle operates similarly to the laser diode circuit 1022 shown in FIG. 10B. Similarly, the resonant circuit 1424 is the same as the resonant circuit 1024' shown in FIG. 10B. Thus, control of the laser diodes of the laser diode circuit 1452 by the driver 1402 is similar to that shown and described with reference to FIG. 1B and/or FIG. 4B. That is, the resonant circuit 1324 has similar functionality to a resonant circuit of the pulsed laser diode driver 102 that includes the inductor $L_S$, the bypass capacitor $C_{BP}$, the source capacitor $C_S$, and the damping resistor $R_{Damp}$. Similarly, each row of laser diodes of the laser diode circuit 1452 is similar to the laser diode $D_L$ of the pulsed laser diode driver 102.

Control of the rows of laser diodes of the laser diode circuit 1452 by the driver 1402 is similar to that shown and described for the laser diode array 1222 with reference to FIG. 12.

Values of the configuration resistors R1, R2 configure a desired pulse width for an emitted laser pulse and an offset of the emitted laser pulse from a falling clock edge of a clock signal received at the clock terminal of the driver 1402. In the example shown, the driver 1402 operates with a desired configuration setting of M=0, E=0, C=0 where a mode configuration value M is the decimal value set by the mode configuration terminals $m_0$-$m_1$, a grouping configuration value E is the decimal value set by the grouping configuration terminals $e_0$-$e_1$, and a charge configuration value C is the decimal value set by the charging configuration terminals $c_0$-$c_1$.

Figure 16A:
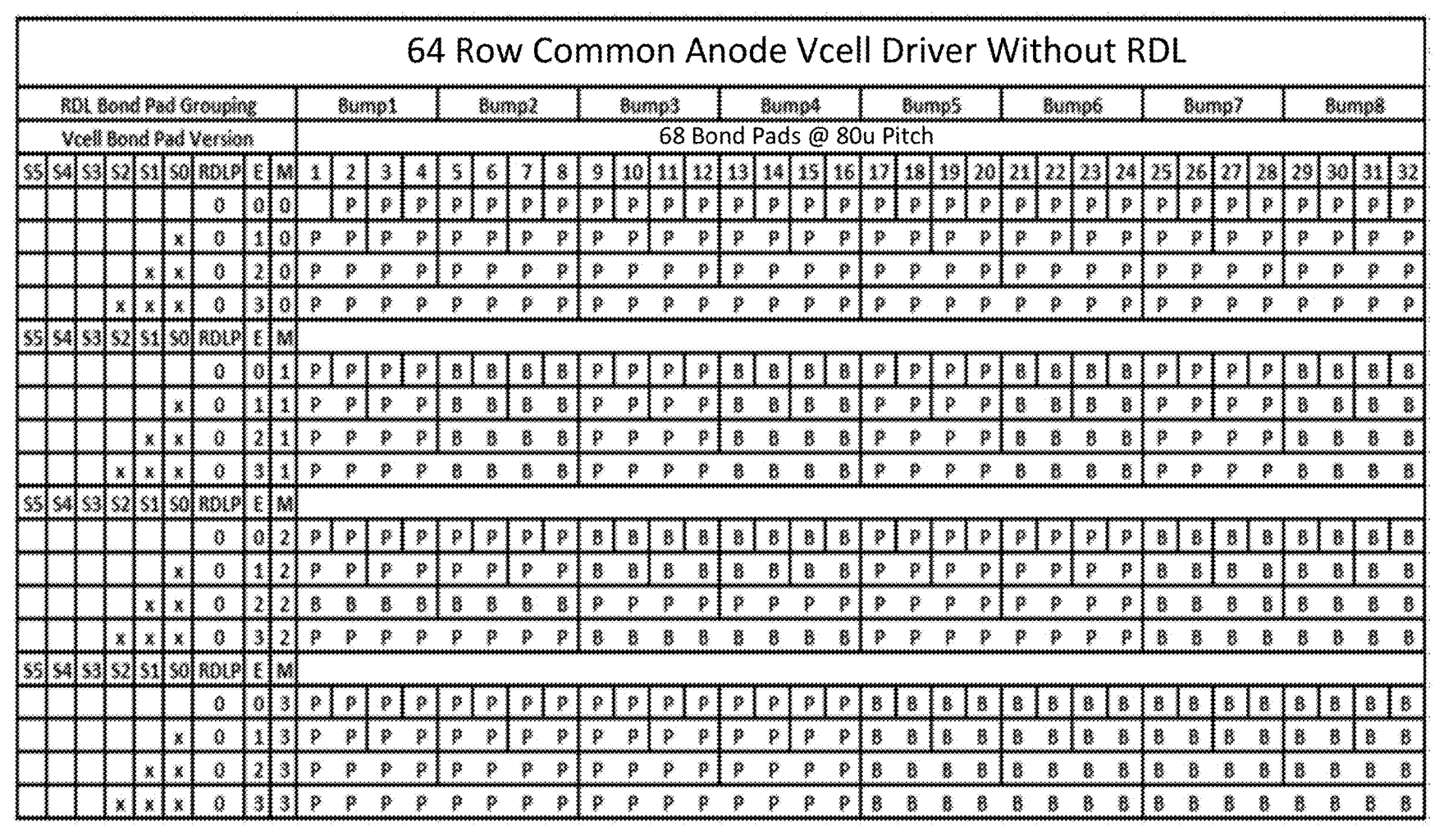
Figure 16B:
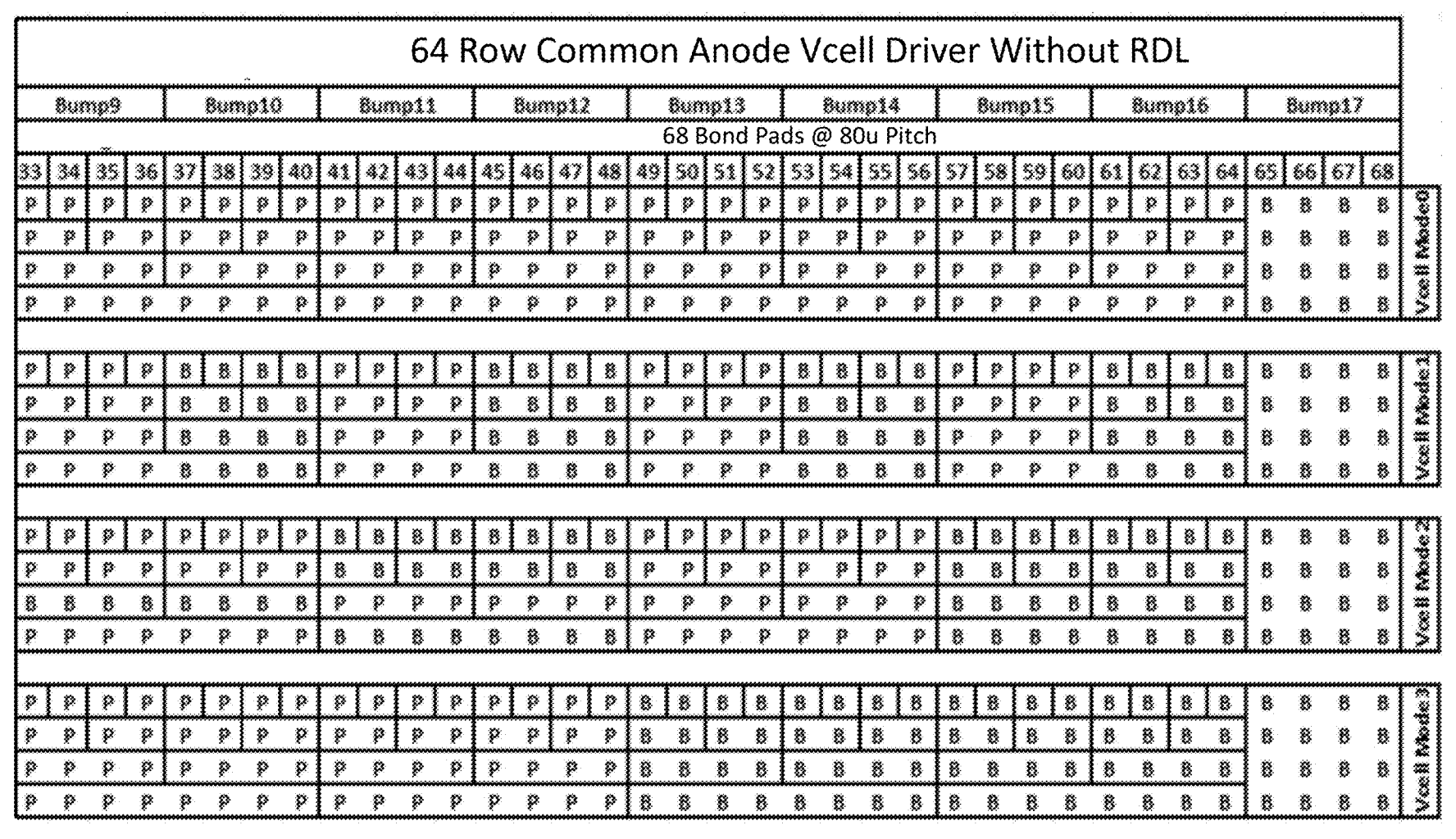

Table 1600 shown in FIGS. 16A-B specifies various configurations of the driver 1402 for each combination of configuration values. Within the table 1600, 'P' indicates a Pulse signal and 'B' represents a Bypass signal. Additionally, 'CX' indicates that charge is delivered to each of the charge terminals $cin_1$-$cin_4$ during (e.g., during a positive portion) each clock cycle, 'C1' indicates that charge is delivered to the charge terminal $cin_1$ during each clock cycle, 'C2' indicates that charge is delivered to the charge terminal $cin_2$ during each clock cycle, and so on.

As shown in FIG. 14, with reference to table 1600 of FIGS. 16A-B, a mode configuration value of M=0 configures the driver 1402 as follows: the drive terminals comprising $row_{65}$ through $row_{68}$ electrically couple respective anodes of the VCSEL laser diode circuit 1452 to the bypass terminal of the resonant circuit 1424 to receive a Bypass signal; and the drive terminals comprising $row_1$ through $row_{64}$ control respective cathodes Cathode 1-Cathode 64 of the VCSEL laser diode circuit 1452 to receive a Pulse signal.

With reference to table 1600 of FIGS. 16A-B, a charge configuration value of C=0 configures the driver 1402 such that the charge terminals $cin_1$ through $cin_4$ collectively control a current delivered to the charge terminal of the resonant circuit 1424.

With reference to table 1600 of FIGS. 16A-B, a grouping configuration value of E=0 configures the driver 1402 such that each of the drive pins (e.g., $row_1$, $row_2$, $row_3$, and so on) are driven individually. Thus, individual control of each row of laser diodes of the VCSEL laser diode circuit 1452 is driven in accordance with signals received at the select terminals $s_0$-$s_5$. However, based on a bump pattern of the driver 1402, groups of four channels may be combined such that each four-channel grouping is associated with a respective bump. For example, drive terminals $row_1$-$row_4$ may be electrically connected to Bump1, drive terminals $row_5$-$row_8$ may be electrically connected to Bump2, and so on.

Figure 17:
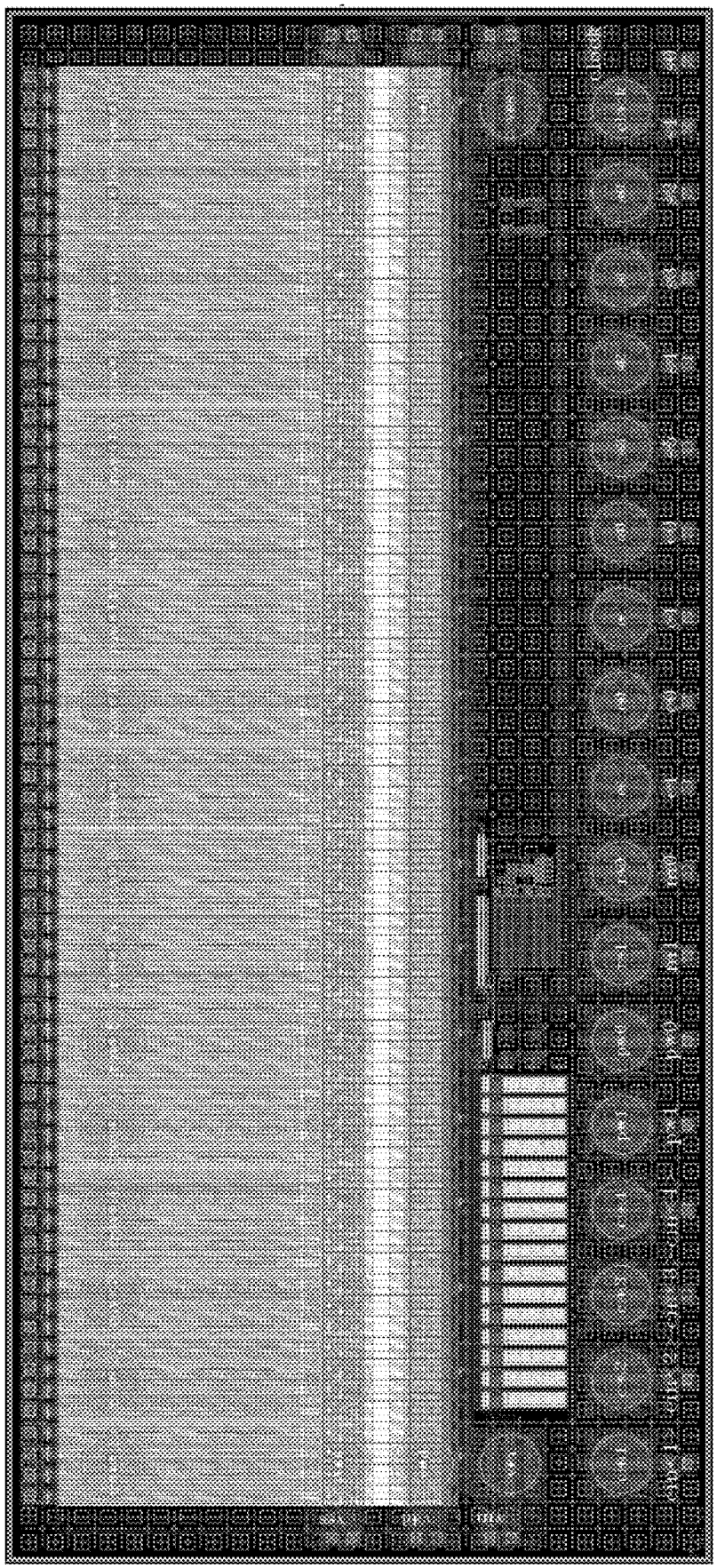
FIG. 17 is a photograph of a portion of a realization of the configurable pulsed laser diode driver shown in FIG. 14, in accordance with some embodiments.

FIG. 17 is a photograph 1700 of a portion of a realization of the configurable pulsed laser diode driver 1402 shown in FIG. 14, in accordance with some embodiments. The configurable pulsed laser diode driver 1402 of FIG. 14 is advantageously designed to be directly bond-pad to bond-pad connected to a VCSEL laser diode array having 80 μm pitch bond-pads. In some embodiments, a final back-end processing for configurable pulsed laser diode driver 1002/1102/1402 utilizes a redistribution layer (RDL) to make final connections between CMOS metal processing layers and bond pads. By changing this final back end RDL layer a completely different bumped wafer level chip scale package (WLCSP) with 320 μm bump pitch can be advantageously configured by, for example, collecting the 64 output terminals in groups of four, resulting in a 16-channel edge-emitting diode driver capable of producing 40 Amp 1-5 ns pulses. Because in such embodiments there are only 17 outputs (16 programmable, one non-programmable), the RDL mapping left shifts output selection configuration bits $s_0$-$s_5$, resulting in four output selection configuration terminals $s_0$-$s_3$ which determine which of the 16 drive terminals $row_1$-$row_{16}$ are selected. In some embodiments, one or more additional configuration terminals are set to various configuration values as part of the RDL mapping to configure the configurable pulsed laser diode driver 1002/1102/1402 into 16-channel, 64-channel, or other channel number modes.

Additionally, many quad laser diode packages have two anode connections on either side of the package and a large common cathode connection in the center of the package. Thus, for example, a mode configuration value of M=2 in combination with a bump configuration of the RDL mapping advantageously creates a signal and physical correspondence to such laser diode packages.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A laser diode driver, comprising:
 a clock terminal operable to receive a clock signal;
 a plurality of charging terminals, a first charging terminal of the plurality of charging terminals being operable to charge a first source capacitor of a first resonant circuit, the first resonant circuit comprising the first source capacitor, a first inductor, and a first bypass capacitor; and
 a plurality of drive terminals, each drive terminal being operable to be directly electrically connected to an anode or cathode of a plurality of laser diodes or to ground;
 wherein:
 the laser diode driver is operable to control a current flow through the first resonant circuit to produce high-current pulses through the plurality of laser diodes, the high-current pulses corresponding to a peak current of a resonant waveform developed at respective anodes of the plurality of laser diodes, a timing of the high-current pulses being synchronized using the clock signal.

2. The laser diode driver of claim 1, wherein:
 the first inductor has a first terminal and a second terminal, the first terminal of the first inductor being operable to receive a charging voltage from the first charging terminal of the plurality of charging terminals;
 the first source capacitor has a first terminal directly electrically connected to the first terminal of the first inductor and a second terminal electrically coupled to ground; and
 the first bypass capacitor has a first terminal directly electrically connected to the second terminal of the first inductor and a second terminal directly electrically connected to the second terminal of the first source capacitor.

3. The laser diode driver of claim 1, wherein:
the plurality of drive terminals comprises one or more non-programmable drive terminals and a plurality of programmable drive terminals.

4. The laser diode driver of claim 1, further comprising:
a plurality of pulse configuration terminals;
wherein:
the plurality of pulse configuration terminals are operable to set a pulse offset and a pulse width for activation of each laser diode of the plurality of laser diodes during each clock cycle of the clock signal.

5. The laser diode driver of claim 4, wherein:
the plurality of pulse configuration terminals are operable to be directly electrically connected to a plurality of resistors; and
the pulse offset and a pulse width for activation of each laser diode of the plurality of laser diodes during each clock cycle of the clock signal is based on respective resistor values of the plurality of resistors.

6. The laser diode driver of claim 1, further comprising:
a plurality of output selection configuration terminals;
wherein:
the plurality of output selection configuration terminals are operable to select, for each clock cycle of the clock signal, which drive terminals of the plurality of drive terminals will deliver drive signals to the plurality of laser diodes.

7. The laser diode driver of claim 6, further comprising:
a plurality of grouping configuration terminals;
wherein:
the plurality of grouping configuration terminals are operable to set how the plurality of output selection configuration terminals are grouped.

8. The laser diode driver of claim 6, wherein:
the drive signals comprise Pulse signals and Bypass signals;
the Pulse signals control a flow of respective high-current pulses through the plurality of laser diodes for activation thereof; and
the Bypass signals control a current flow through the first resonant circuit to produce the respective high-current pulses.

9. The laser diode driver of claim 8, further comprising:
a plurality of mode configuration terminals;
wherein:
the plurality of mode configuration terminals are operable to set which of a Pulse signal or a Bypass signal of the drive signals will appear at one or more of the plurality of drive terminals.

10. The laser diode driver of claim 8, wherein:
the plurality of drive terminals comprises one or more non-programmable drive terminals and a plurality of programmable drive terminals; and
the one or more non-programmable drive terminals are operable to provide the Bypass Signals.

11. The laser diode driver of claim 1, further comprising:
a plurality of charge configuration terminals;
wherein:
the plurality of charge configuration terminals are operable to control a current delivered to the first resonant circuit from the plurality of charging terminals during each clock cycle.

12. The laser diode driver of claim 1, wherein:
a second charging terminal of the plurality of charging terminals is operable to charge a second source capacitor of a second resonant circuit; and
the second resonant circuit comprises the second source capacitor, a second inductor, and a second bypass capacitor.

13. The laser diode driver of claim 1, further comprising:
a plurality of configuration terminals operable to receive configuration data;
wherein:
responsive to receiving first configuration data at the plurality of configuration terminals, the laser diode driver is configured to produce high-current pulses through the plurality of laser diodes grouped in a common-anode configuration; and
responsive to receiving second configuration data at the plurality of configuration terminals, the laser diode driver is configured to produce high-current pulses through the plurality of laser diodes grouped in a common-cathode configuration.

14. The laser diode driver of claim 1, further comprising:
a plurality of configuration terminals operable to receive configuration data;
wherein:
responsive to receiving first configuration data at the plurality of configuration terminals, the laser diode driver is configured to produce high-current pulses through the plurality of laser diodes grouped as a single laser diode array; and
responsive to receiving second configuration data at the plurality of configuration terminals, the laser diode driver is configured to produce high-current pulses through the plurality of laser diodes grouped as a plurality of laser diode arrays.

15. The laser diode driver of claim 1, wherein:
the plurality of laser diodes comprises a plurality of side-emitting laser diodes.

16. The laser diode driver of claim 1, wherein:
the plurality of laser diodes comprises a plurality of vertical-cavity surface-emitting laser diodes.

17. An apparatus comprising the laser diode driver of claim 1, wherein:
a bump pattern of the apparatus directly electrically connects two or more drive terminals of the plurality of drive terminals.

18. An apparatus comprising the laser diode driver of claim 1, wherein:
a redistribution layer of the apparatus physically configures the apparatus to be directly bond-pad to bond-pad connected to a vertical-cavity surface-emitting laser diode array.

19. An apparatus, comprising:
a clock terminal operable to receive a clock signal;
a plurality of charging terminals, a first charging terminal of the plurality of charging terminals being directly electrically connected to a first source capacitor of a first resonant circuit, the first resonant circuit comprising the first source capacitor, a first inductor, and a first bypass capacitor; and
a plurality of drive terminals, each drive terminal being directly electrically connected to an anode or cathode of a plurality of laser diodes or to ground;
wherein:
the first inductor has a first terminal and a second terminal, the first terminal of the first inductor being operable to receive a charging voltage from the first charging terminal of the plurality of charging terminals;

the first source capacitor has a first terminal directly electrically connected to the first terminal of the first inductor and a second terminal electrically coupled to ground;

the first bypass capacitor has a first terminal directly electrically connected to the second terminal of the first inductor and a second terminal directly electrically connected to the second terminal of the first source capacitor; and the apparatus is operable to control a current flow through the first resonant circuit to produce high-current pulses through the plurality of laser diodes, the high-current pulses corresponding to a peak current of a resonant waveform developed at respective anodes of the plurality of laser diodes, a timing of the high-current pulses being synchronized using the clock signal.

20. The apparatus of claim 19, further comprising:

a second resonant circuit comprising a second source capacitor that is directly electrically connected to a second charging terminal of the plurality of charging terminals, the second resonant circuit further comprising a second inductor and a second bypass capacitor; wherein:

the second inductor has a first terminal and a second terminal, the first terminal of the second inductor being operable to receive the charging voltage from the second charging terminal of the plurality of charging terminals;

the second source capacitor has a first terminal directly electrically connected to the first terminal of the second inductor and a second terminal electrically coupled to ground; and the second bypass capacitor has a first terminal directly electrically connected to the second terminal of the second inductor and a second terminal directly electrically connected to the second terminal of the second source capacitor.

* * * * *